(12) United States Patent
Liao et al.

(10) Patent No.: US 11,830,861 B2
(45) Date of Patent: *Nov. 28, 2023

(54) SEMICONDUCTOR PACKAGE

(71) Applicant: Taiwan Semiconductor Manufacturing Company, Ltd., Hsinchu (TW)

(72) Inventors: Yu-Kuang Liao, Hsinchu (TW); Cheng-Chun Tsai, Hsinchu (TW); Chen-Hua Yu, Hsinchu (TW); Fang-Cheng Chen, Hsinchu (TW); Wen-Chih Chiou, Miaoli County (TW); Ping-Jung Wu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 440 days.

This patent is subject to a terminal disclaimer.

(21) Appl. No.: 17/029,065

(22) Filed: Sep. 23, 2020

(65) Prior Publication Data

US 2021/0005591 A1 Jan. 7, 2021

Related U.S. Application Data

(63) Continuation of application No. 16/136,262, filed on Sep. 20, 2018, now Pat. No. 10,797,031.

(51) Int. Cl.
*G02B 6/122* (2006.01)
*H01L 25/16* (2023.01)
(Continued)

(52) U.S. Cl.
CPC .......... *H01L 25/167* (2013.01); *G02B 6/1225* (2013.01); *G02B 6/1226* (2013.01);
(Continued)

(58) Field of Classification Search
None
See application file for complete search history.

(56) References Cited

U.S. PATENT DOCUMENTS 8,993,380 B2 3/2015 Hou et al.
9,281,254 B2 3/2016 Yu et al.
(Continued)

*Primary Examiner* — Chad H Smith
(74) *Attorney, Agent, or Firm* — JCIPRNET

(57) ABSTRACT

A semiconductor package includes a first optical transceiver, a second optical transceiver, a third optical transceiver, and a plasmonic waveguide. The first optical transceiver, the second optical transceiver, and the third optical transceiver are stacked in sequential order. The first optical transceiver and the third optical transceiver respectively at least one optical input/output portion for transmitting and receiving an optical signal. The plasmonic waveguide includes a first segment, a second segment, and a third segment optically coupled to one another. The first segment is embedded in the first optical transceiver. The second segment extends through the second optical transceiver. The third segment is embedded in the third optical transceiver. The first segment is optically coupled to the at least one optical input/output portion of the first optical transceiver and the third segment is optically coupled to the at least one optical input/output portion of the third optical transceiver.

20 Claims, 40 Drawing Sheets

(51) Int. Cl.
  *H04B 10/40*   (2013.01)
  *H01L 23/00*   (2006.01)
  *H01L 23/29*   (2006.01)
  *H01L 23/522*  (2006.01)
  *G02B 6/42*    (2006.01)

(52) U.S. Cl.
  CPC ............ *G02B 6/4201* (2013.01); *H01L 23/29* (2013.01); *H01L 23/5226* (2013.01); *H01L 24/17* (2013.01); *H04B 10/40* (2013.01)

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,599,781 B1 * | 3/2017 | Skogen ................ G02B 6/1226 |
| 9,666,502 B2 | 5/2017 | Chen et al. |
| 9,735,131 B2 | 8/2017 | Su et al. |
| 10,797,031 B2 * | 10/2020 | Liao .................... G02B 6/1225 |
| 2008/0112713 A1 * | 5/2008 | Guo ...................... B82Y 20/00 |
| | | 385/39 |
| 2015/0180210 A1 * | 6/2015 | Yu ...................... G02B 6/12004 |
| | | 438/24 |

\* cited by examiner

SEMICONDUCTOR PACKAGE

CROSS-REFERENCE TO RELATED APPLICATION

This application is a continuation application of and claims the priority benefit of a prior application Ser. No. 16/136,262, filed on Sep. 20, 2018. The entirety of the above-mentioned patent application is hereby incorporated by reference herein and made a part of this specification.

BACKGROUND

Optical transceiver modules are used in high-speed optical communication systems that require high performance, compact package, and low power consumption. Optical transmission/reception functions are implemented in pluggable optical transceiver modules. The optical transceiver modules comply with various international standard specifications at communication speeds ranging up to more than 100 Gbps. Currently, fabrication process of the optical transceiver modules is quite complex and the fabricated optical transceiver modules suffers severe optical loss.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
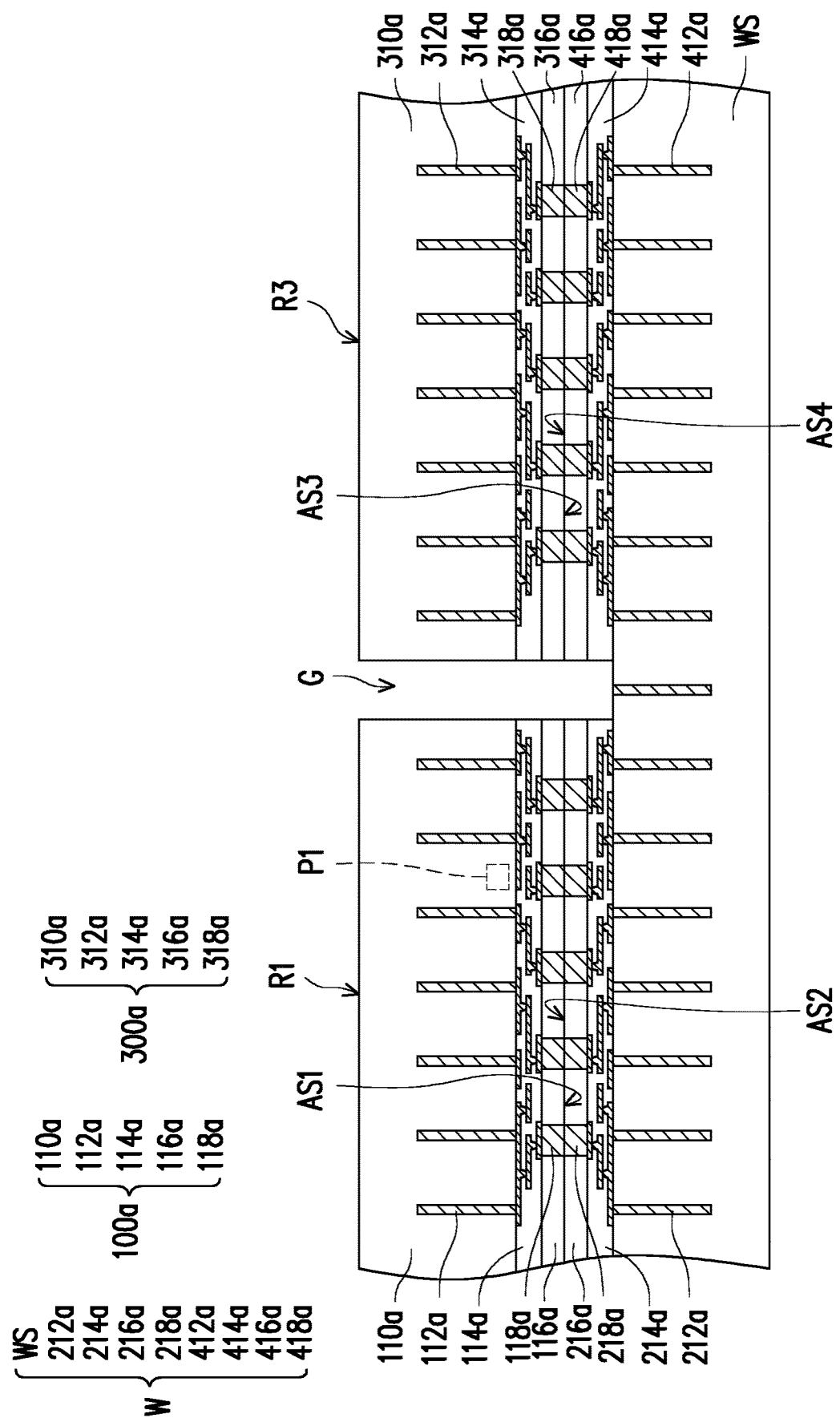
FIG. 1A to FIG. 1C are schematic cross-sectional views illustrating a manufacturing process of a plurality of die stacks.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
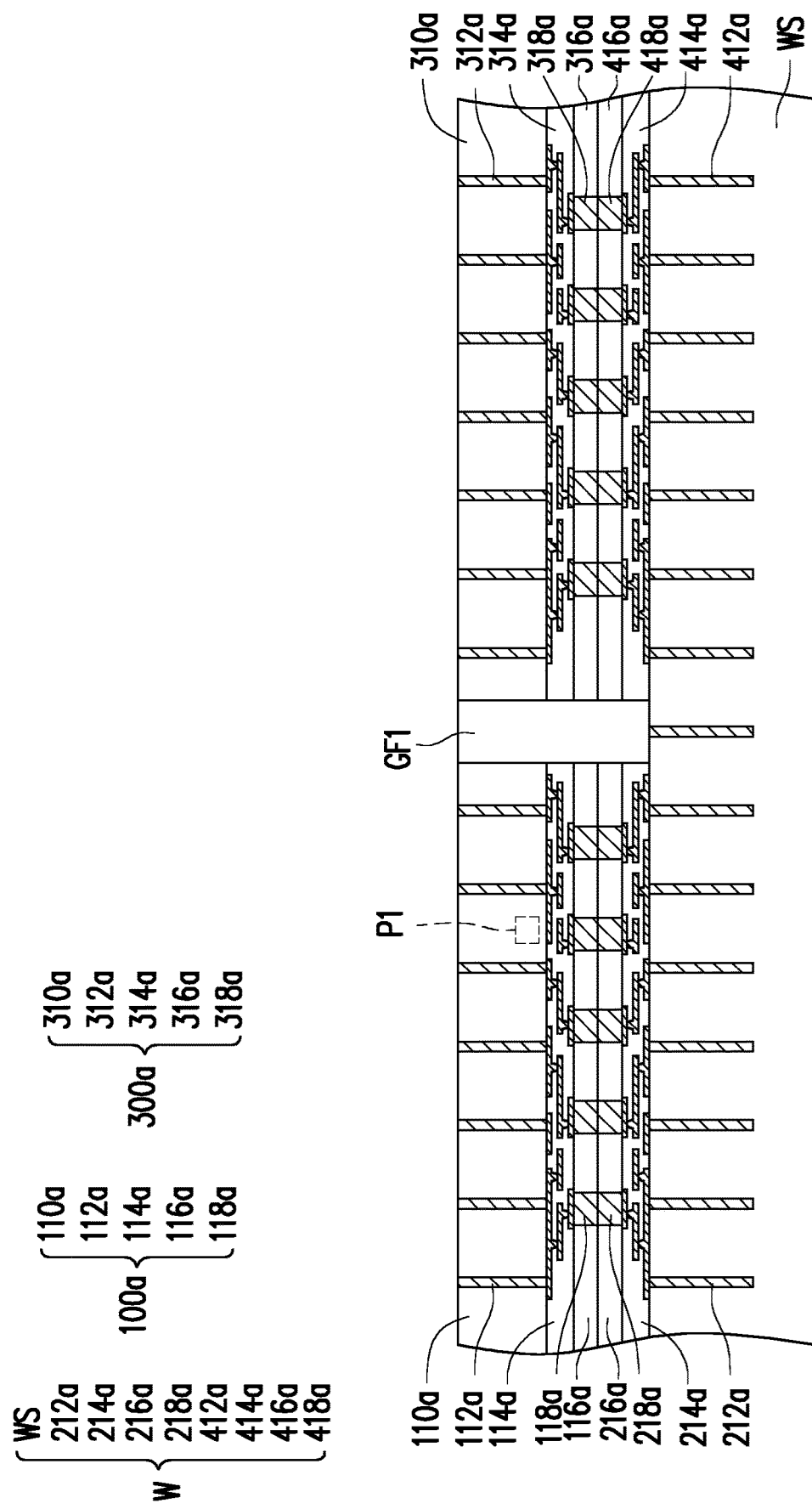
Figure 1C:
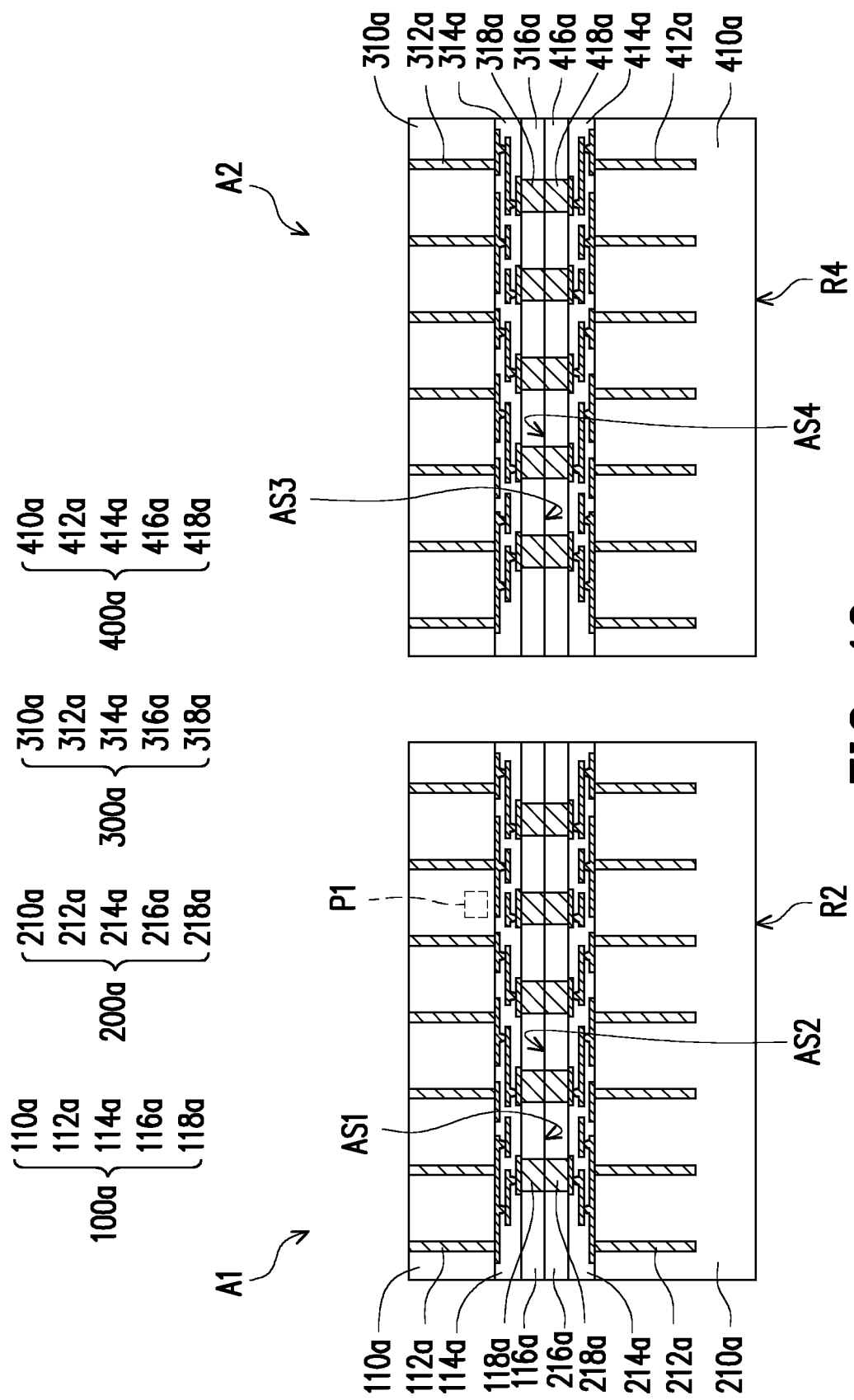

FIG. 1A to FIG. 1C are schematic cross-sectional views illustrating a manufacturing process of a plurality of die stacks A1, A2. Referring to FIG. 1A, a first photonic integrated circuit component 100a and a first storage integrated circuit component 300a are stacked on a wafer W. In some embodiments, the first photonic integrated circuit component 100a and the first storage integrated circuit component 300a are arranged side by side to form a gap G therebetween. The first photonic integrated circuit component 100a includes a semiconductor substrate 110a, an interconnection structure 114a, a dielectric layer 116a, and a plurality of conductors 118a. In some embodiments, the semiconductor substrate 110a has a plurality of semiconductor devices (e.g., transistors, capacitors, photodiodes, combinations thereof, or the like) and a plurality of optical devices (e.g. waveguides, filters, combinations thereof, or the like) formed therein. In some embodiments, the optical devices constitute an optical input/output portion P1 for transmitting and receiving optical signal. In some embodiments, the optical input/output portion P1 includes, for example, photodiodes, light-emitting diodes, or the like. As such, in some embodiments, the first photonic integrated circuit component 100a may be adapted to transmit/receive optical signals. It should be noted that the location of the optical input/output portion P1 shown in FIG. 1A merely severs as an exemplary illustration and the disclosure is not limited thereto. Depending on circuit design and the location of the optical devices, the optical input/output portion P1 may be located at some other positions within the first photonic integrated circuit component 100a. It should be noted that although the first photonic integrated circuit component 100a is shown to have one optical input/output portion P1 in FIG. 1A, the number of the optical input/output portion P1 depicted merely serves as an exemplary illustration. In some alternative embodiments, more optical input/output portions P1 may be found in the first photonic integrated circuit component 100a.

As illustrated in FIG. 1A, the interconnection structure 114a is disposed on the semiconductor substrate 110a and the dielectric layer 116a covers the interconnection structure 114a. In some embodiments, the interconnection structure 114a may include a plurality of conductive patterns embedded in a dielectric material. In some embodiments, the conductors 118a are embedded in the dielectric layer 116a. The conductors 118a are electrically connected to the semiconductor substrate 110a through the interconnection structure 114a. In some embodiments, the material of the conductors 118a may be copper or other suitable metallic material while the material of the dielectric layer 116a may be silicon oxide, silicon nitride, silicon oxynitride, or other suitable dielectric materials.

In some embodiments, the dielectric layer 116a may be formed by depositing a dielectric material layer on the interconnection structure 114a and patterning the dielectric material layer to form a plurality of openings in the dielectric material layer. The openings formed in the dielectric layer 116a expose portions of the conductive patterns of the interconnection structure 114a. After the dielectric layer 116a is patterned, a conductive material layer may be deposited on the dielectric layer 116a and the portions of the conductive patterns of the interconnection structure 114a exposed by the openings of the dielectric layer 116a. Then, a polishing process (e.g., a chemical mechanical polishing process) is performed to partially remove the conductive material layer until the top surface of the dielectric layer 116a is exposed. After performing the polishing process, the conductors 118a are formed in the openings of the dielectric layer 116a. In some embodiments, top surfaces of the conductors 118a and a top surface of the dielectric layer 116a may be collectively referred to as an active surface AS1 of the first photonic integrated circuit component 100a. On the other hand, the surface of the first photonic integrated circuit component 100a opposite to the active surface AS1 may be referred to as a rear surface R1 of the first photonic integrated circuit component 100a. As shown in FIG. 1A, the top surfaces of the conductors 118a and the top surface of the dielectric layer 116a are substantially located at the same level height to provide an appropriate active surface AS1 for hybrid bonding. In some embodiments, the first photonic integrated circuit component 100a further includes a plurality of through semiconductor vias 112a embedded in the semiconductor substrate 110a. The through semiconductor vias 112a are electrically connected to the interconnection structure 114a.

In some embodiments, the first storage integrated circuit component 300a includes a semiconductor substrate 310a, a plurality of through semiconductor vias 312a, an interconnection structure 314a, a dielectric layer 316a, and a plurality of conductors 318a. In some embodiments, the semiconductor substrate 310a has a plurality of semiconductor devices formed therein. For example, the semiconductor substrate 310 may include memory devices or the like. In some embodiments, the first storage integrated circuit component 300a is free of optical devices. In some embodiments, the first storage integrated circuit component 300a is being adapted to perform storage function. For example, the first storage integrated circuit component 300a may be a Dynamic Random Access Memory (DRAM), Resistive Random Access Memory (RRAM), Static Random Access Memory (SRAM), or the like. The through semiconductor vias 312a, the interconnection structure 314a, the dielectric layer 316a, and the conductors 318a of the first storage integrated circuit component 300a may be respectively similar to the through semiconductor vias 112a, the interconnection structure 114a, the dielectric layer 116a, and the conductors 118a of the first photonic integrated circuit component 100a, so the detailed descriptions thereof are omitted herein. In some embodiments, top surfaces of the conductors 318a and a top surface of the dielectric layer 316a may be collectively referred to as an active surface AS3 of the first storage integrated circuit component 300a. On the other hand, the surface of the first storage integrated circuit component 300a opposite to the active surface AS3 may be referred to as a rear surface R3 of the first storage integrated circuit component 300a.

As illustrated in FIG. 1A, the wafer W includes a semiconductor wafer substrate WS, a plurality of through semiconductor vias 212a, 412a, a plurality of interconnection structures 214a, 414a, a plurality of dielectric layers 216a, 416a, and a plurality of conductors 218a, 418a. The semiconductor wafer substrate WS may include a plurality of semiconductor devices (e.g., transistors, capacitors, photodiodes, a combination thereof, or the like) formed therein. In some embodiments, the through semiconductor vias 212a, the interconnection structure 214a, the dielectric layer 216a, and the conductors 218a are formed corresponding to the first photonic integrated circuit component 100a while the through semiconductor vias 412a, the interconnection structure 414a, the dielectric layer 416a, and the conductors 418a are formed corresponding to the first storage integrated circuit component 300a. For example, the through semiconductor vias 212a, the interconnection structure 214a, the dielectric layer 216a, and the conductors 218a are located underneath the first photonic integrated circuit component 100a while the through semiconductor vias 412a, the interconnection structure 414a, the dielectric layer 416a, and the conductors 418a are located underneath the first storage integrated circuit component 300a. The through semiconductor vias 212a, 412a, the interconnection structures 214a, 414a, the dielectric layers 216a, 416a, and the conductors 218a, 418a may be respectively similar to the through semiconductor vias 112a, the interconnection structure 114a, the dielectric layer 116a, and the conductors 118a of the first photonic integrated circuit component 100a, so the detailed descriptions thereof are omitted herein. In some embodiments, top surfaces of the conductors 218a and a top surface of the dielectric layer 216a may be collectively referred to as an active surface AS2 of the wafer W while the top surfaces of the conductors 418a and a top surface of the dielectric layer 416a may be collectively referred to as another active surface AS4 of the wafer W. As shown in FIG. 1A, the top surfaces of the conductors 218a and the top surface of the dielectric layer 216 are substantially located at the same level height to provide an appropriate active surface AS2 for hybrid bonding. Similarly, the top surfaces of the conductors 418a and the top surface of the dielectric layer 416 are also substantially located at the same level height to provide an appropriate active surface AS4 for hybrid bonding.

In some embodiments, the first photonic integrated circuit component 100a may be picked-and-placed onto the active surface AS2 of the wafer W such that the first photonic integrated circuit component 100a is electrically connected to the wafer W. In some embodiments, the first photonic integrated circuit component 100a and the wafer W are hybrid bonded. For example, the first photonic integrated circuit component 100a is placed such that the active surface AS1 of the first photonic integrated circuit component 100a is in contact with the active surfaces AS2 of the wafer W, and the conductors 218a of the wafer W are substantially aligned and in contact with the conductors 118a of the first photonic integrated circuit components 100a.

In some embodiments, to facilitate the hybrid bonding between the first photonic integrated circuit component 100a and the wafer W, surface preparation for bonding surfaces (i.e. the active surface AS1 and the active surface AS2) of the first photonic integrated circuit component 100 and the wafer W may be performed. The surface preparation may include surface cleaning and activation, for example. Surface cleaning may be performed on the active surfaces AS1, AS2 to remove particles on top surfaces of the conductors 118a, 218a and the dielectric layers 116a, 216a. In some embodiments, the active surfaces AS1, AS2 may be cleaned by wet cleaning, for example. Not only particles are removed, but also native oxide formed on the top surfaces of the conductors 118a, 218a may be removed. The native oxide formed on the top surfaces of the conductors 118a, 218a may be removed by chemicals used in wet cleaning processes, for example.

After cleaning the active surface AS1 of the first photonic integrated circuit component 100a and the active surface AS2 of the wafer W, activation of the top surfaces of the dielectric layers 116a, 216a may be performed for development of high bonding strength. In some embodiments, plasma activation may be performed to treat the top surfaces of the dielectric layers 116a, 216a. When the activated top surface of the dielectric layer 116a is in contact with the activated top surface of the dielectric layer 216a, the dielectric layer 116a of the first photonic integrated circuit component 100a and the dielectric layer 216a of the wafer W are pre-bonded.

After pre-bonding the first photonic integrated circuit component 100a onto the wafer W, hybrid bonding of the first photonic integrated circuit component 100a and the wafer W is performed. The hybrid bonding of the first photonic integrated circuit component 100a and the wafer W may include a thermal treatment for dielectric bonding and a thermal annealing for conductor bonding. In some embodiments, the thermal treatment for dielectric bonding is performed to strengthen the bonding between the dielectric layers 116a, 216a. For example, the thermal treatment for dielectric bonding may be performed at temperature ranging from about 100 Celsius degree to about 150 Celsius degree. After performing the thermal treatment for dielectric bonding, the thermal annealing for conductor bonding is performed to facilitate the bonding between the conductors 118a, 218a. For example, the thermal annealing for conductor bonding may be performed at temperature ranging from about 300 Celsius degree to about 400 Celsius degree. The process temperature of the thermal annealing for conductor bonding is higher than that of the thermal treatment for dielectric bonding. After performing the thermal annealing for conductor bonding, the dielectric layer 116a is bonded to the dielectric layer 216a and the conductors 118a are bonded to the conductors 218a. In some embodiments, the conductors 118a of the first photonic integrated circuit component 100 and the conductors 218a of the wafer W may respectively be conductive vias (e.g., copper vias), conductive pads (e.g., copper pads), or combinations thereof. For example, the conductor bonding between the conductors 118a, 218a may be via-to-via bonding, pad-to-pad bonding, or via-to-pad bonding.

Although FIG. 1A illustrated that the electrical connection between the first photonic integrated circuit component 100a and the wafer W is realized by hybrid bonding, the disclosure is not limited thereto. In some alternative embodiments, a redistribution structure (not shown) may be disposed between the first photonic integrated circuit component 100a and the wafer W. That is, the first photonic integrated circuit component 100a may be electrically connected to the wafer W through the redistribution structure.

In some embodiments, the first storage integrated circuit component 300a may be picked-and-placed onto the active surface AS4 of the wafer W such that the first storage integrated circuit component 300a is electrically connected to the wafer W. The first storage integrated circuit component 300a may be bonded to the wafer W through similar manner as that of the first photonic integrated circuit component 100a and the wafer W, so the detailed description thereof is omitted herein. As illustrated in FIG. 1A, the dielectric layer 316a is bonded to the dielectric layer 416a and the conductors 318a are bonded to the conductors 418a.

Referring to FIG. 1A and FIG. 1B, an insulating encapsulant GF1 is formed to fill the gap G between the first photonic integrated circuit component 100a and the first storage integrated circuit component 300a. In some embodiments, the insulating encapsulant GF1 includes a molding compound, a molding underfill, a resin (such as epoxy), or the like. In some alternative embodiments, the insulating encapsulant GF1 may include silicon oxide, silicon nitride, and/or tetraethoxysilane (TEOS). In some embodiments, the insulating encapsulant GF1 may be formed through chemical vapor deposition (CVD), plasma-enhanced chemical vapor deposition (PECVD), atomic layer deposition (ALD), or the like. In some embodiments, the insulating encapsulant GF1 may be referred to as "gap fill oxide."

After the insulating encapsulant GF1 fills the gap G between the first photonic integrated circuit component 100a and the first storage integrated circuit component 300a, a planarization process is performed on the rear surface R1 of the first photonic integrated circuit component 100a, the rear surface R3 of the first storage integrated circuit component 300a, and the insulating encapsulant GF1. In some embodiments, the planarization process includes a mechanical grinding process and/or a chemical mechanical polishing (CMP) process. In some embodiments, the first photonic integrated circuit component 100a and the first storage integrated circuit component 300a are grinded until the through semiconductor vias 112a, 312a are revealed. For example, after the planarization process, the through semiconductor vias 112a and the through semiconductor vias 312a respectively penetrate through the semiconductor substrate 110a and the semiconductor substrate 310a. The through semiconductor vias 112a allow electrical or optical communication between the front side and the back side of the first photonic integrated circuit component 100a. On the other hand, the through semiconductor vias 312a allow electrical or optical communication between the front side and the back side of the first storage integrated circuit component 300a. That is, electrical or optical signals may be transmitted through the path created by the through semiconductor vias 112a, 312a. In some embodiments, after the through semiconductor vias 112a, 312a are revealed, the first photonic integrated circuit component 100a and the first storage integrated circuit component 300a may be further grinded to reduce the overall thickness of the first photonic integrated circuit component 100a and the first storage integrated circuit component 300a.

Referring to FIG. 1C, a singulation process is performed on the structure illustrated in FIG. 1B to obtain die stacks A1, A2. In some embodiments, the singulation process may involve dicing with a rotating blade or a laser beam. In other words, the dicing or singulation process is, for example, a laser cutting process, a mechanical cutting process, or other suitable processes. In some embodiments, during the singulation process, the insulating encapsulant GF1 is being cut off and the semiconductor wafer substrate WS is being divided into a semiconductor substrate 210a and a semiconductor substrate 410a. In some embodiments, the die stack A1 includes a first electric integrated circuit component 200a and the first photonic integrated circuit component 100a stacked on the first electric integrated circuit component 200a. The first electric integrated circuit component 200a is electrically connected to the first photonic integrated circuit component 100a. On the other hand, the die stack A2 includes a first functional integrated circuit component 400a and the first storage integrated circuit component 300a stacked on the first functional integrated circuit component 400a. The first functional integrated circuit component 400a is electrically connected to the first storage integrated circuit component 300a. In some embodiments, the first electric integrated circuit component 200a has the active surface AS2 and a rear surface R2 opposite to the active surface AS2. Similarly, the first functional integrated circuit component 400a has the active surface AS4 and a rear surface R4 opposite to the active surface AS4. In some embodiments, the first electric integrated circuit component 200a is constituted by the semiconductor substrate 210a, the through semiconductor vias 212a, the interconnection structure 214a, the dielectric layer 216a, and the conductors 218a. On the other hand, the first functional integrated circuit component 400a may be constituted by the semiconductor substrate 410a, the through semiconductor vias 412a, the interconnection structure 414a, the dielectric layer 416a, and the conductors 418a. In some embodiments, the first functional integrated circuit component 400a is, for example, a Central Process Unit (CPU) die, a Graphic Process Unit (GPU) die, a Field-Programmable Gate Array (FPGA), or the like.

Although two die stacks A1, A2 are illustrated in FIG. 1C, the disclosure is not limited thereto. In some alternative embodiments, the process shown in FIG. 1A to FIG. 1C may be adapted to manufacture more die stacks including integrated circuit components with different applications.

FIG. 2A to FIG. 2K are schematic cross-sectional views illustrating a manufacturing process of a semiconductor package 10 in accordance with some embodiments of the disclosure. Referring to FIG. 1A, the die stack A1 and the die stack A2 are disposed on a first carrier C1. In some embodiments, the die stack A1 and the die stack A2 may be pick-and-placed onto the first carrier C1. In some embodiments, the die stacks A1, A2 are placed on the first carrier C1 side by side. In other words, the first storage integrated circuit component 300a and the first functional integrated circuit component 400a are disposed adjacent to the first photonic integrated circuit component 100a and the first electric integrated circuit component 200a. In some embodiments, the die stacks A1, A2 are placed such that the rear surface R2 of the first electric integrated circuit component 200a and the rear surface R4 of the first functional integrated circuit component 400a face upward.

Figure 2A:
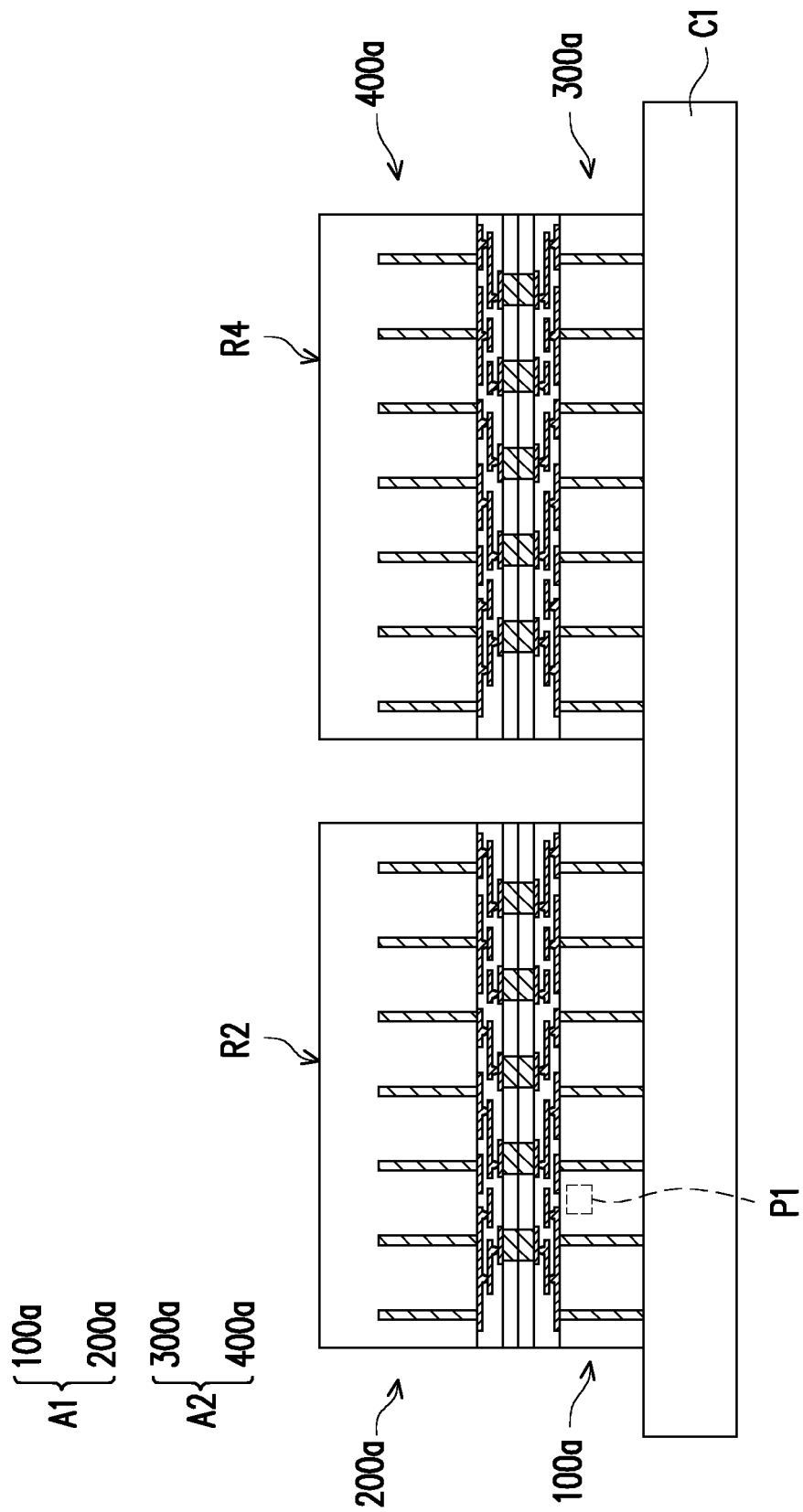
FIG. 2A to FIG. 2K are schematic cross-sectional views illustrating a manufacturing process of a semiconductor package in accordance with some embodiments of the disclosure.
Figure 2B:
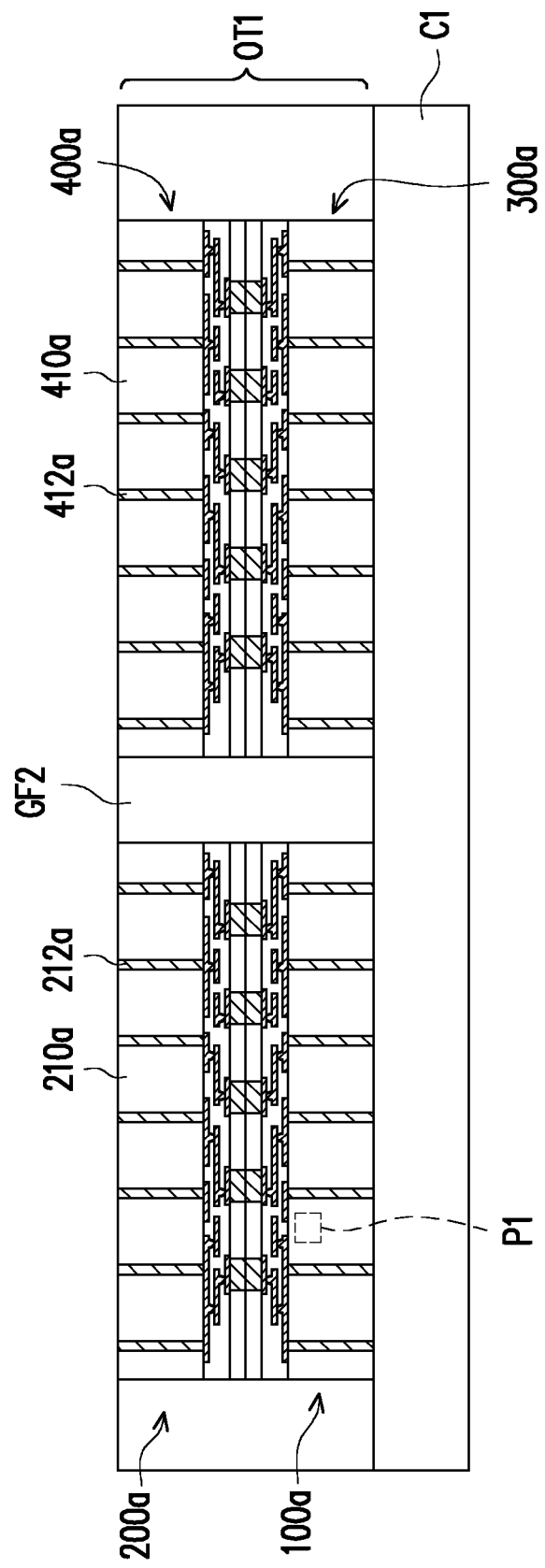

Referring to FIG. 2B, an insulating encapsulant GF2 is formed over the first carrier C1 to encapsulate the first photonic integrated circuit component 100a, the first electric integrated circuit component 200a, the first storage integrated circuit component 300a, and the first functional integrated circuit component 400a. In some embodiments, the insulating encapsulant GF2 includes a molding compound, a molding underfill, a resin (such as epoxy), or the like. In some alternative embodiments, the insulating encapsulant GF2 may include silicon oxide, silicon nitride, or the like. In some embodiments, the insulating encapsulant GF2 may be formed by chemical vapor deposition (CVD), plasma-enhanced chemical vapor deposition (PECVD), atomic layer deposition (ALD), or the like. In some alternative embodiments, the insulating encapsulant GF2 may be formed by a molding process. For example, the insulating encapsulant GF2 may be formed by a compression molding process. Similar to the insulating encapsulant GF1, the insulating encapsulant GF2 may also be referred to as "gap fill oxide."

After the insulating encapsulant GF2 encapsulates the first photonic integrated circuit component 100a, the first electric integrated circuit component 200a, the first storage integrated circuit component 300a, and the first functional integrated circuit component 400a, a planarization process is performed on the rear surface R2 of the first electric integrated circuit component 200a, the rear surface R4 of the first functional integrated circuit component 400a, and the insulating encapsulant GF2 to form a first optical transceiver OT1. In other words, the first optical transceiver OT1 includes the first photonic integrated circuit component 100a, the first electric integrated circuit component 200a, the first storage integrated circuit component 300a, the first functional integrated circuit component 400a, and the insulating encapsulant GF2. In some embodiments, since the first optical transceiver OT1 includes multiple integrated circuit components, the first optical transceiver OT1 may be referred to as a system on integrated circuit (SOIC). In some embodiments, the first optical transceiver OT1 has a thickness of less than 20 μm. It should be noted that the configuration of the first optical transceiver OT1 in FIG. 2B is merely an exemplary illustration, and the disclosure is not limited thereto. In some alternative embodiments, the first photonic integrated circuit component 100a, the first electric integrated circuit component 200a, the first storage integrated circuit component 300a, and the first functional integrated circuit component 400a may be arranged in other configurations. In some embodiments, the first optical transceiver OT1 may further include other integrated circuits. For example, a laser die or the like may be further incorporated in the first optical transceiver OT1.

In some embodiments, the planarization process includes a mechanical grinding process and/or a chemical mechanical polishing (CMP) process. In some embodiments, the first electric integrated circuit component 300a and the first functional integrated circuit component 400a are grinded until the through semiconductor vias 212a, 412a are revealed. For example, after the planarization process, the through semiconductor vias 212a and the through semiconductor vias 412a respectively penetrate through the semiconductor substrate 210a and the semiconductor substrate 410a. The through semiconductor vias 212a allow electrical or optical communication between the front side and the back side of the first electric integrated circuit component 200a. On the other hand, the through semiconductor vias 412a allow electrical or optical communication between the front side and the back side of the first functional integrated circuit component 400a. That is, electrical or optical signals may be transmitted through the path created by the through semiconductor vias 312a, 412a. In some embodiments, after the through semiconductor vias 212a, 412a are revealed, the first electric integrated circuit component 200a and the first functional integrated circuit component 400a may be further grinded to reduce the overall thickness of the first optical transceiver OT1. As illustrated in FIG. 2B, after the planarization process, the insulating encapsulant GF2 laterally encapsulates the first photonic integrated circuit component 100a, the first electric integrated circuit component 200a, the first storage integrated circuit component 300a, and the first functional integrated circuit component 400a.

Figure 2C:
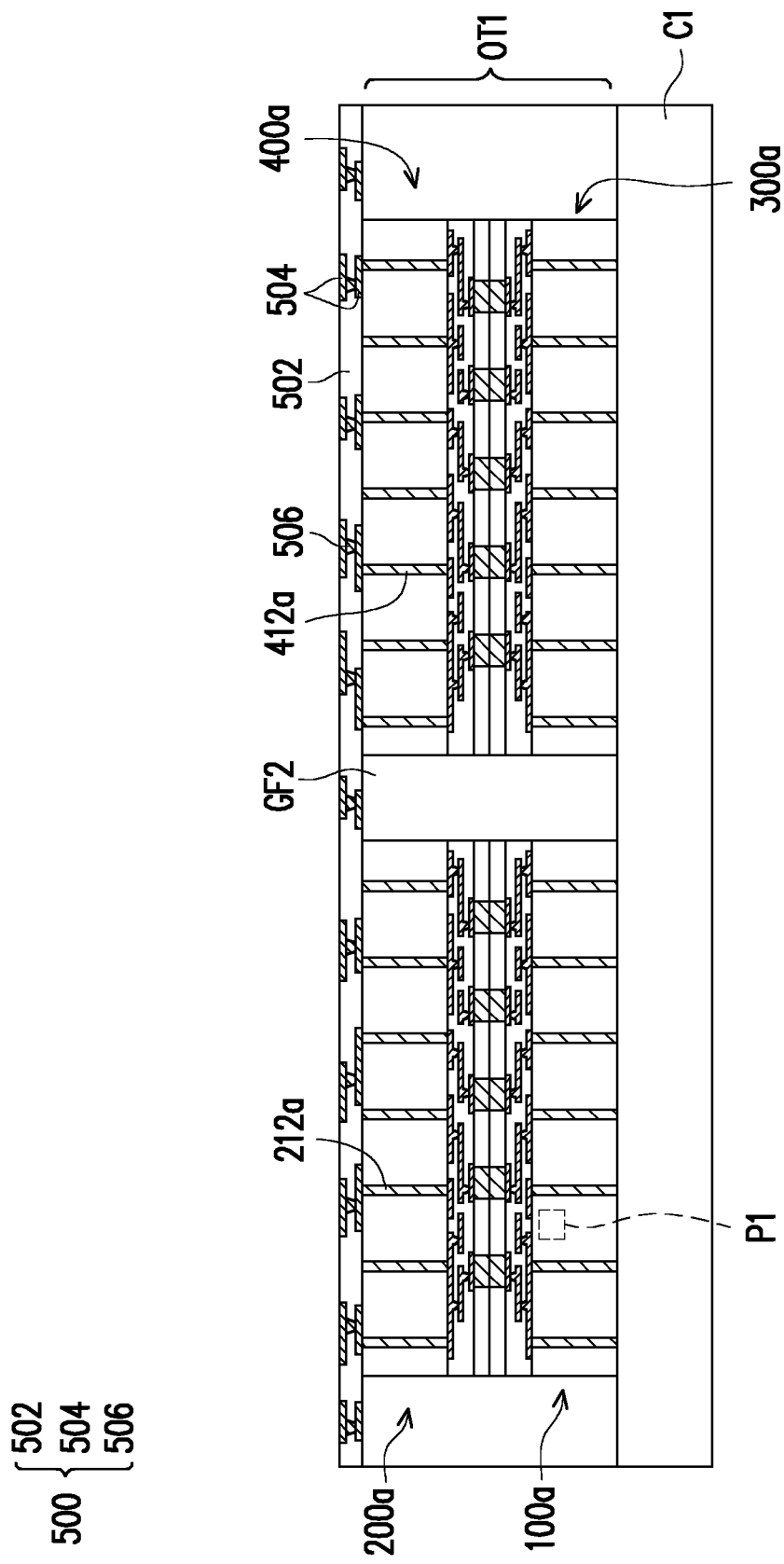

Referring to FIG. 2C, a redistribution structure 500 is formed over the first optical transceiver OT1. In some embodiments, the redistribution structure 500 is formed on the first electric integrated circuit component 200a, the insulating encapsulant GF2, and the first functional integrated circuit component 400a. In some embodiments, the redistribution structure 500 includes a dielectric layer 502 and a plurality of redistribution conductive layers 504. For simplicity, the dielectric layer 502 is illustrated as a bulky layer in FIG. 2C, but it should be understood that the dielectric layer 502 may be constituted by multiple dielectric layers. The redistribution conductive layers 504 and the dielectric layers of the dielectric layer 502 are stacked alternately. The redistribution conductive layers 504 are interconnected with one another by conductive vias 506 embedded in the dielectric layers 502. In some embodiments, the material of the redistribution conductive layers 504 and the conductive vias 506 includes aluminum, titanium, copper, nickel, tungsten, and/or alloys thereof. The redistribution conductive layers 504 may be formed by, for example, electroplating, deposition, and/or photolithography and etching. In some embodiments, the material of the dielectric layers 502 includes polyimide, epoxy resin, acrylic resin, phenol resin, benzocyclobutene (BCB), polybenzoxazole (PBO), or other suitable polymer-based dielectric materials. The dielectric layer 502, for example, may be formed by suitable fabrication techniques such as spin-on coating, chemical vapor deposition (CVD), plasma-enhanced chemical vapor deposition (PECVD), or the like. In some embodiments, the redistribution structure 500 is formed such that the redistribution conductive layers 504 are electrically and/or optically connected to the through semiconductor vias 212a of the first electric integrated circuit component 200a and the through semiconductor vias 412a of the first functional integrated circuit component 400a. In some embodiments, the phrases "optically connected to" and "optically coupled to" denote that two elements are optically communicated with each other and optical signals may be transmitted between these two elements.

Figure 2D:
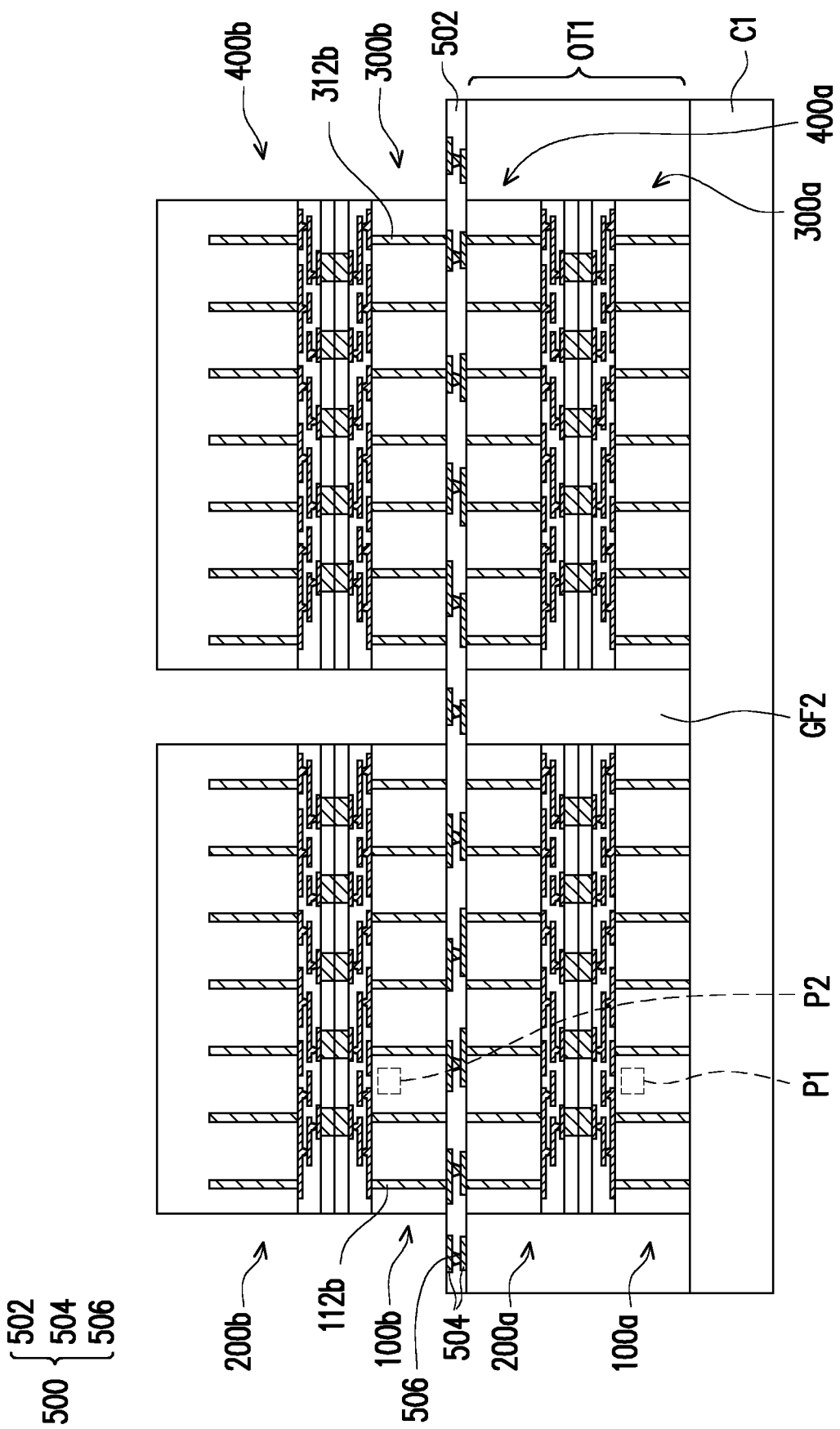

Referring to FIG. 2D, a second photonic integrated circuit component 100b, a second electric integrated circuit component 200b, a second storage integrated circuit component 300b, and a second functional integrated circuit component 400b are pick-and-placed onto the redistribution structure 500. The second photonic integrated circuit component 100b, the second electric integrated circuit component 200b, the second storage integrated circuit component 300b, and the second functional integrated circuit component 400b may be respectively similar to the first photonic integrated circuit component 100a, the first electric integrated circuit component 200a, the first storage integrated circuit component 300a, and the first functional integrated circuit component 400a, so components within these elements will be denoted by similar reference numerals and the detailed descriptions thereof are omitted herein. Similar to the first photonic integrated circuit component 100a, the second photonic integrated circuit component 100b includes an optical input/output portion P2 for transmitting and receiving optical signal. In some embodiments, the second photonic integrated circuit component 100b is electrically connected to the second electric integrated circuit component 200b and the second storage integrated circuit component 300b is electrically connected to the second functional integrated circuit component 400b.

In some embodiments, the second photonic integrated circuit component 100b is placed between the redistribution structure 500 and the second electric integrated circuit component 200b. On the other hand, the second storage integrated circuit component 300b is placed between the redistribution structure 500 and the second functional integrated circuit component 400b. In some embodiments, the second photonic integrated circuit component 100b and the second storage integrated circuit component 300b may be attached to the redistribution structure 500 through hybrid bonding. The detailed description of the hybrid bonding may be referred to the descriptions related to the bonding between the first photonic integrated circuit component 100a and the wafer W described above and will not be repeated herein. In some embodiments, through semiconductor vias 112b of the second photonic integrated circuit component 100b and the through semiconductor vias 312b of the second storage integrated circuit component 300b are electrically and/or optically connected to the redistribution conductive layers 504 of the redistribution structure 500.

Figure 2E:
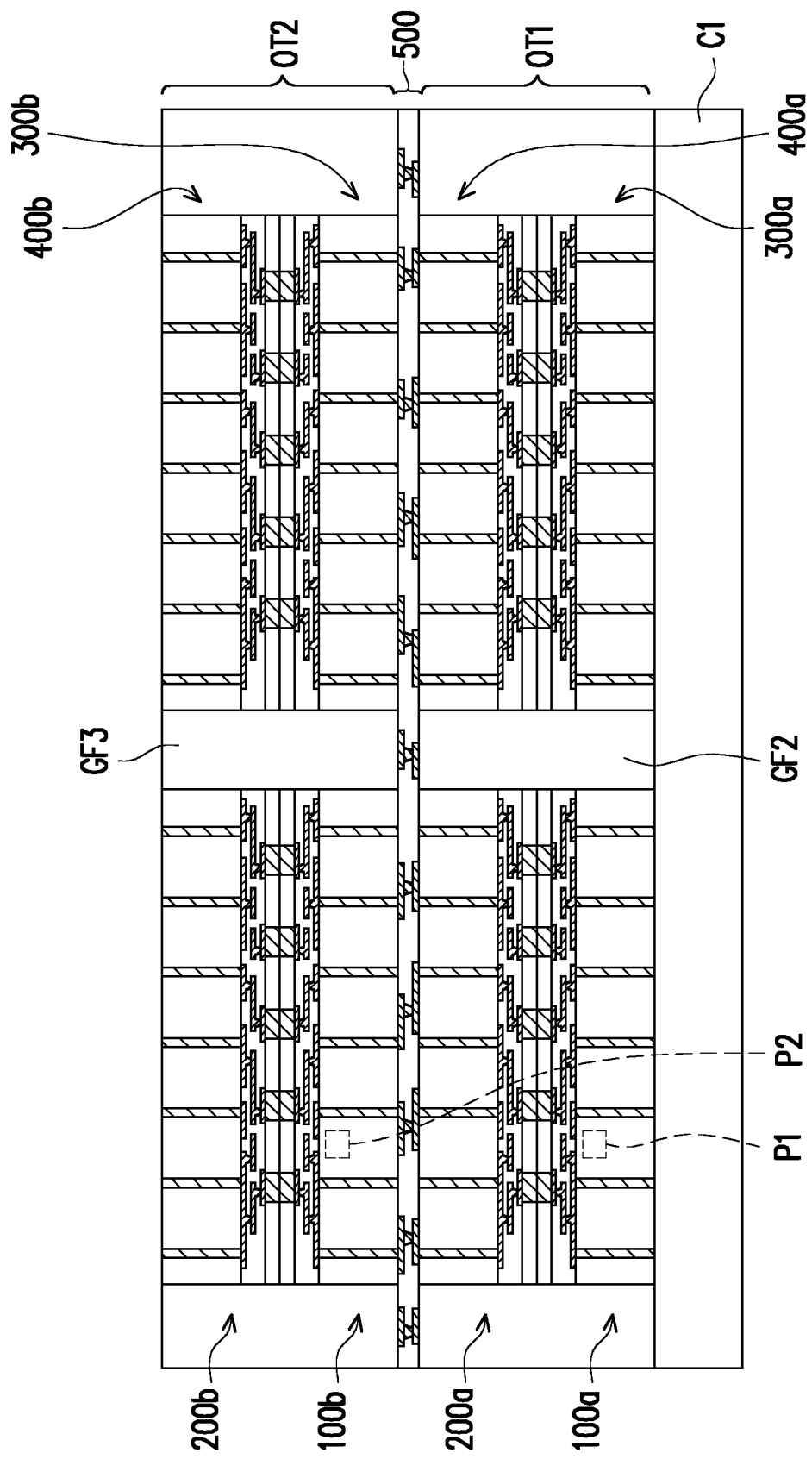

Referring to FIG. 2E, processes described in the text related to FIG. 2B may be performed to obtain a second optical transceiver OT2. In some embodiments, an insulating encapsulant GF3 is formed to encapsulate sidewalls of the second photonic integrated circuit component 100b, the second electric integrated circuit component 200b, the second storage integrated circuit component 300b, and the second functional integrated circuit component 400b. The insulating encapsulant GF3 may be similar to the insulating encapsulant GF2 in FIG. 2B, so the detailed description thereof is omitted herein. In some embodiments, the second optical transceiver OT2 includes the second photonic integrated circuit component 100b, the second electric integrated circuit component 200b, the second storage integrated circuit component 300b, the second functional integrated circuit component 400b, and the insulating encapsulant GF3. In some embodiments, the second optical transceiver OT2 has a thickness of less than 20 μm. As illustrated in FIG. 2E, the second optical transceiver OT2 is stacked on the first optical transceiver OT1 and the redistribution structure 500. In some embodiments, the redistribution structure 500 is sandwiched between the first optical transceiver OT1 and the second optical transceiver OT2.

Figure 2F:
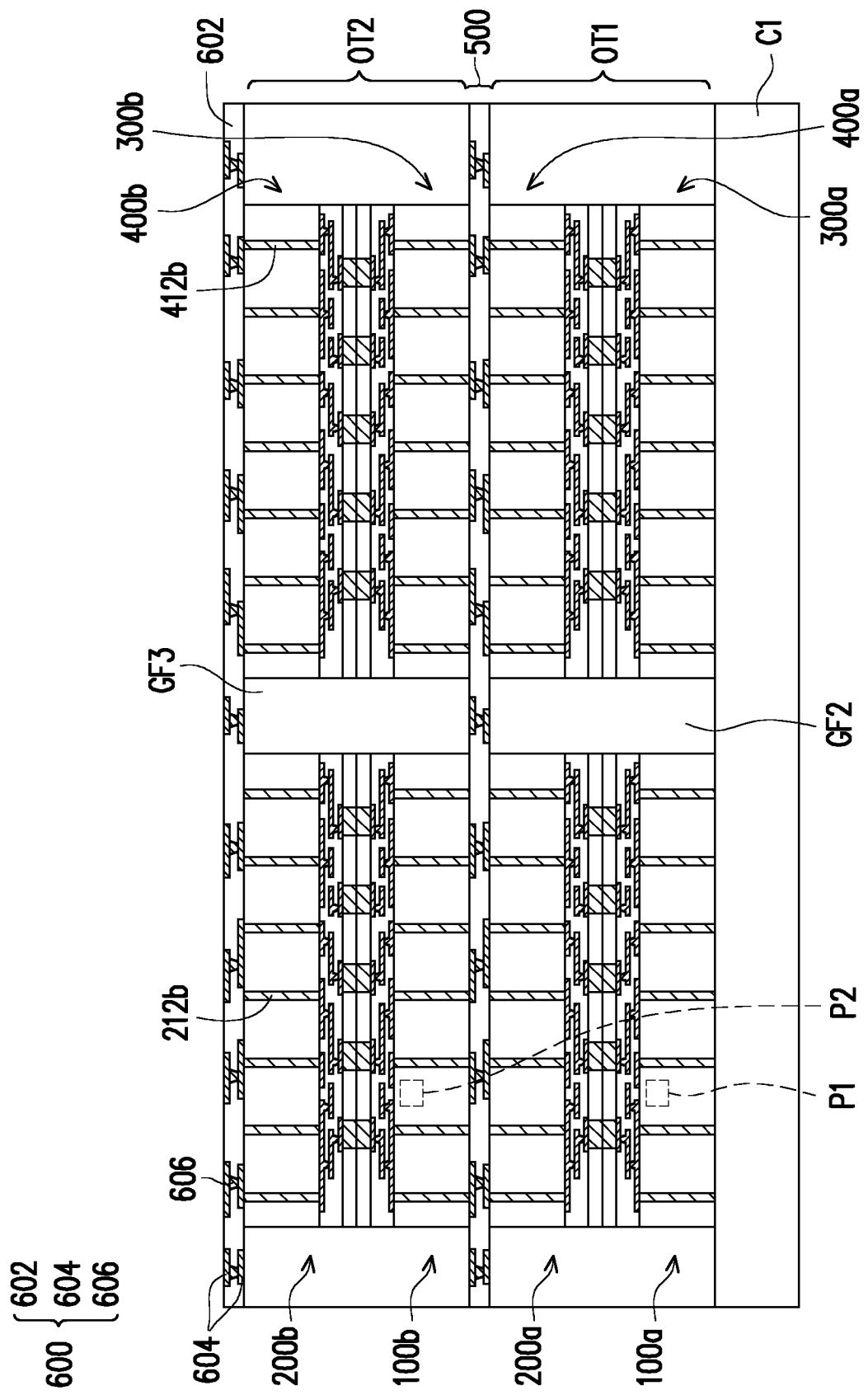

Referring to FIG. 2F, a redistribution structure 600 is formed over the second optical transceiver OT2. In some embodiments, the redistribution structure 600 is formed on the second electric integrated circuit component 200b, the insulating encapsulant GF3, and the second functional integrated circuit component 400b. In some embodiments, the redistribution structure 600 includes a dielectric layer 602, a plurality of redistribution conductive layers 604, and a plurality of conductive vias 606. The dielectric layer 602, the redistribution conductive layers 604, and the conductive vias 606 of the redistribution structure 600 may be respectively similar to the dielectric layer 502, the redistribution conductive layers 504, and the conductive vias 506 of the redistribution structure 500, so the detailed descriptions thereof are omitted herein. In some embodiments, the redistribution structure 600 is formed such that the redistribution conductive layers 604 are electrically and/or optically connected to the through semiconductor vias 212b of the second electric integrated circuit component 200b and the through semiconductor vias 412b of the second functional integrated circuit component 400b.

Figure 2G:
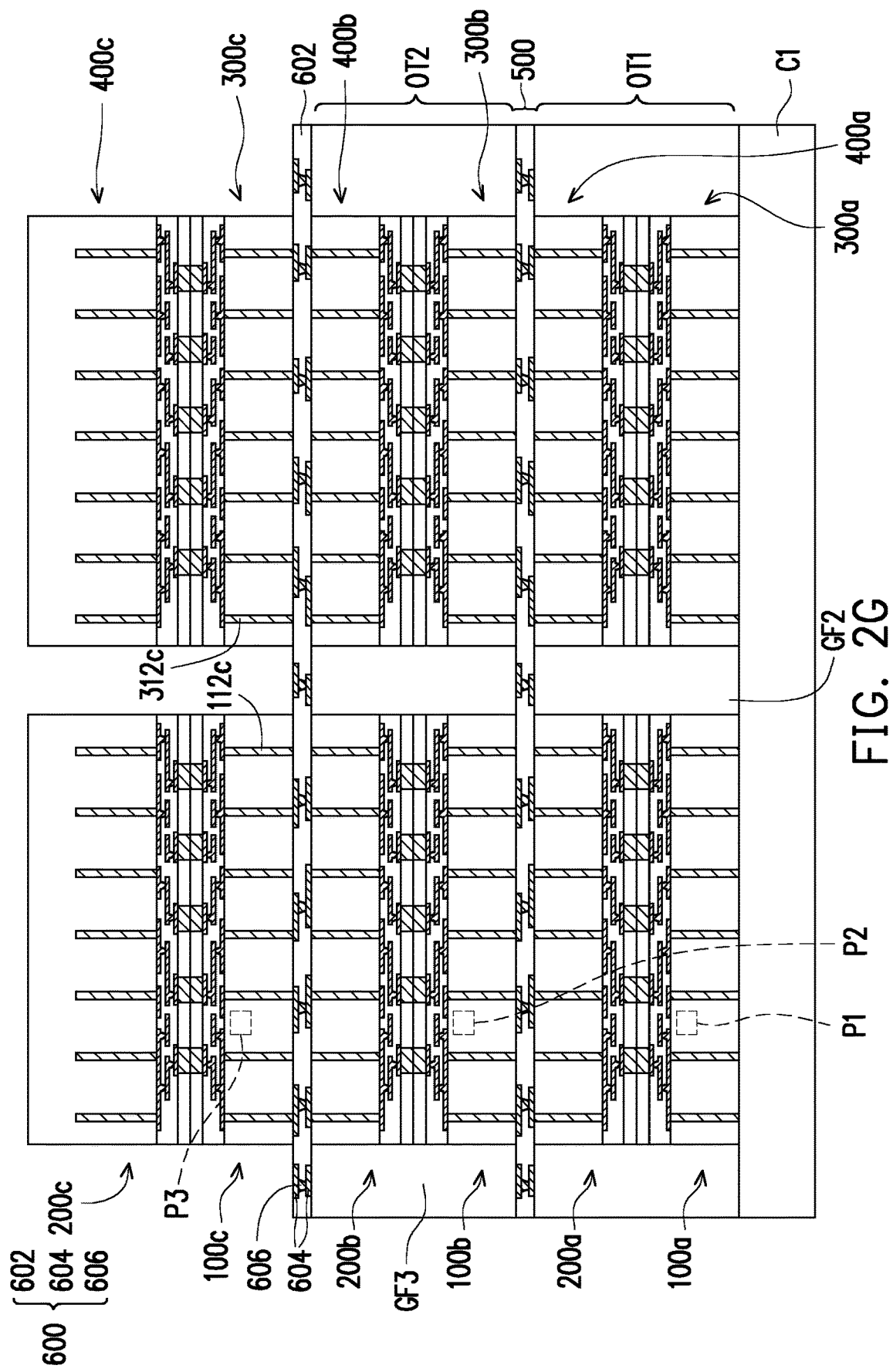

Referring to FIG. 2G, a third photonic integrated circuit component 100c, a third electric integrated circuit component 200c, a third storage integrated circuit component 300c, and a third functional integrated circuit component 400c are pick-and-placed onto the redistribution structure 600. The third photonic integrated circuit component 100c, the third electric integrated circuit component 200c, the third storage integrated circuit component 300c, and the third functional integrated circuit component 400c may be respectively similar to the first photonic integrated circuit component 100a, the first electric integrated circuit component 200a, the first storage integrated circuit component 300a, and the first functional integrated circuit component 400a, so components within these elements will be denoted by similar reference numerals and the detailed descriptions thereof are omitted herein. Similar to the first photonic integrated circuit component 100a, the third photonic integrated circuit component 100c includes an optical input/output portion P3 for transmitting and receiving optical signal. In some embodiments, the third photonic integrated circuit component 100c is electrically connected to the third electric integrated circuit component 200c and the third storage integrated circuit component 300c is electrically connected to the third functional integrated circuit component 400c.

In some embodiments, the third photonic integrated circuit component 100c is placed between the second electric integrated circuit component 200b and the third electric integrated circuit component 200c. On the other hand, the third storage integrated circuit component 300c is placed between the second functional integrated circuit component 400b and the third functional integrated circuit component 400c. In some embodiments, the third photonic integrated circuit component 100c and the third storage integrated circuit component 300c may be attached to the redistribution structure 600 through hybrid bonding. The detailed description of the hybrid bonding may be referred to the descriptions related to the bonding between the first photonic integrated circuit component 100a and the wafer W described above and will not be repeated herein. In some embodiments, the through semiconductor vias 112c of the third photonic integrated circuit component 100c and the through semiconductor vias 312c of the third storage integrated circuit component 300c are electrically and/or optically connected to the redistribution conductive layers 604 of the redistribution structure 600.

Figure 2H:
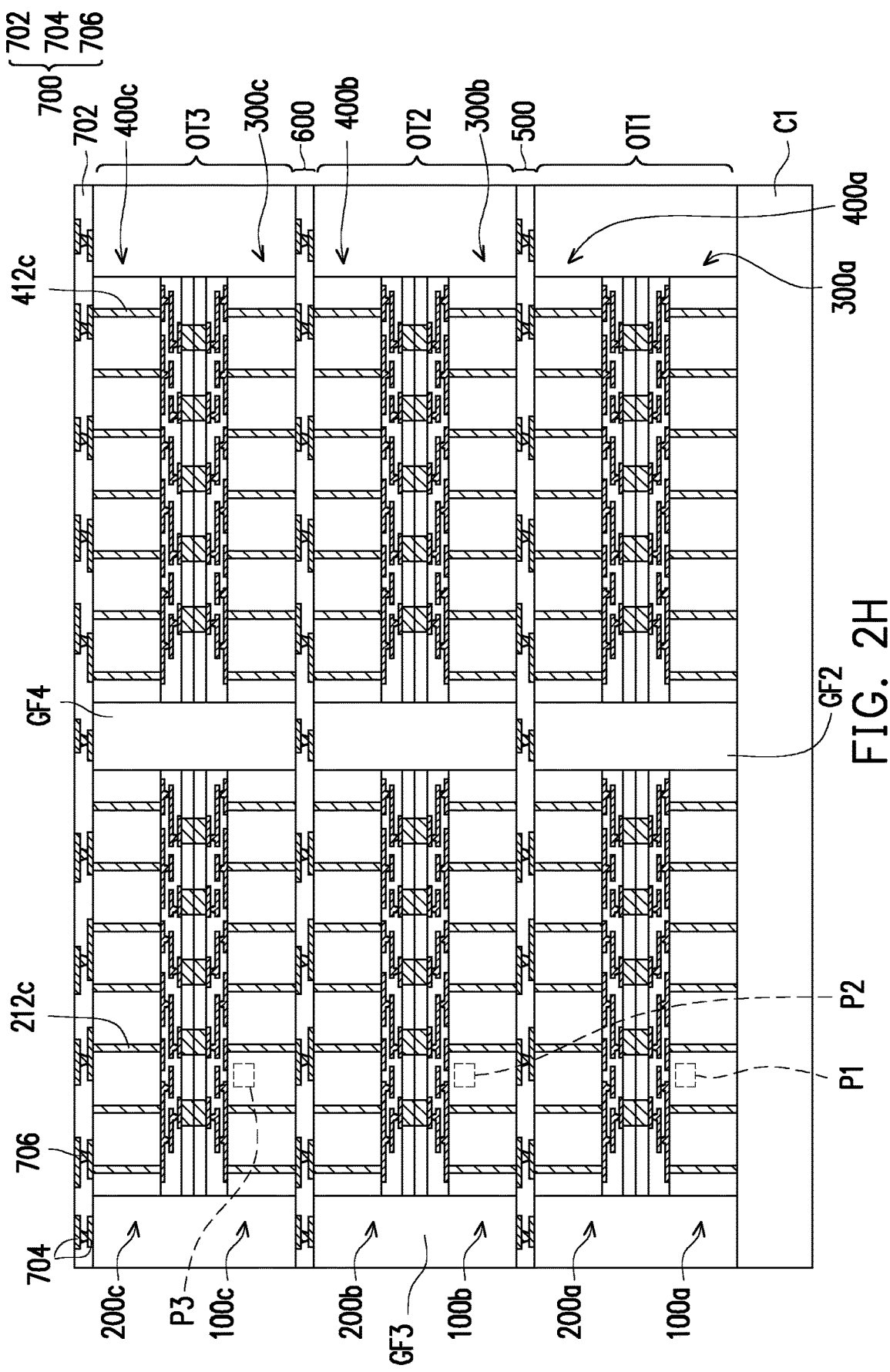

Referring to FIG. 2H, processes described in the text related to FIG. 2B may be performed to obtain a third optical transceiver OT3. In some embodiments, an insulating encapsulant GF4 is formed to encapsulate sidewalls of the third photonic integrated circuit component 100c, the third electric integrated circuit component 200c, the third storage integrated circuit component 300c, and the third functional integrated circuit component 400c. The insulating encapsulant GF4 may be similar to the insulating encapsulant GF2 in FIG. 2B, so the detailed description thereof is omitted herein. In some embodiments, the third optical transceiver OT3 includes the third photonic integrated circuit component 100c, the third electric integrated circuit component 200c, the third storage integrated circuit component 300c, the third functional integrated circuit component 400c, and the insulating encapsulant GF4. In some embodiments, the third optical transceiver OT3 has a thickness of less than 20 μm. As illustrated in FIG. 2H, the third optical transceiver OT3 is stacked on the second optical transceiver OT2 and the redistribution structure 600. In some embodiments, the redistribution structure 600 is sandwiched between the second optical transceiver OT2 and the third optical transceiver OT3.

After the third optical transceiver OT3 is obtained, a redistribution structure 700 is formed over the third optical transceiver OT3. In some embodiments, the redistribution structure 700 is formed on the third electric integrated circuit component 200c, the insulating encapsulant GF4, and the third functional integrated circuit component 400c. In some embodiments, the redistribution structure 700 includes a dielectric layer 702, a plurality of redistribution conductive layers 704, and a plurality of conductive vias 706. The dielectric layer 702, the redistribution conductive layers 704, and the conductive vias 706 of the redistribution structure 700 may be respectively similar to the dielectric layer 502, the redistribution conductive layers 504, and the conductive vias 506 of the redistribution structure 500, so the detailed descriptions thereof are omitted herein. In some embodiments, the redistribution structure 700 is formed such that the redistribution conductive layers 704 are electrically and/or optically connected to the through semiconductor vias 212c of the third electric integrated circuit component 200c and the through semiconductor vias 412c of the third functional integrated circuit component 400c.

Figure 2I:
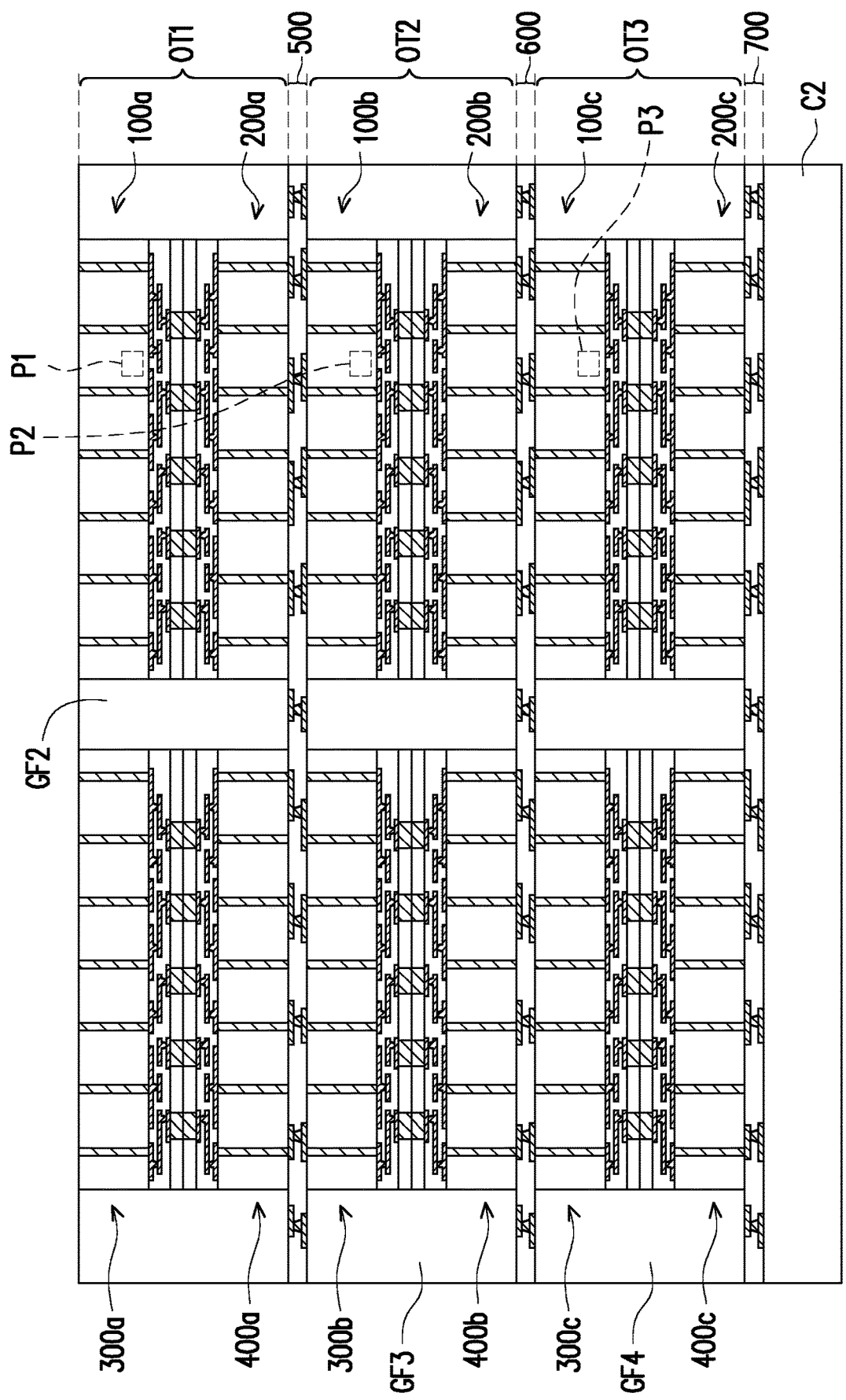

Referring to FIG. 2I, the structure illustrated in FIG. 2H is flipped upside down and is attached to a second carrier C2. Subsequently, the first carrier C1 is removed from the first photonic integrated circuit component 100a, the insulating encapsulant GF2, and the first storage integrated circuit component 300a.

Figure 2J:
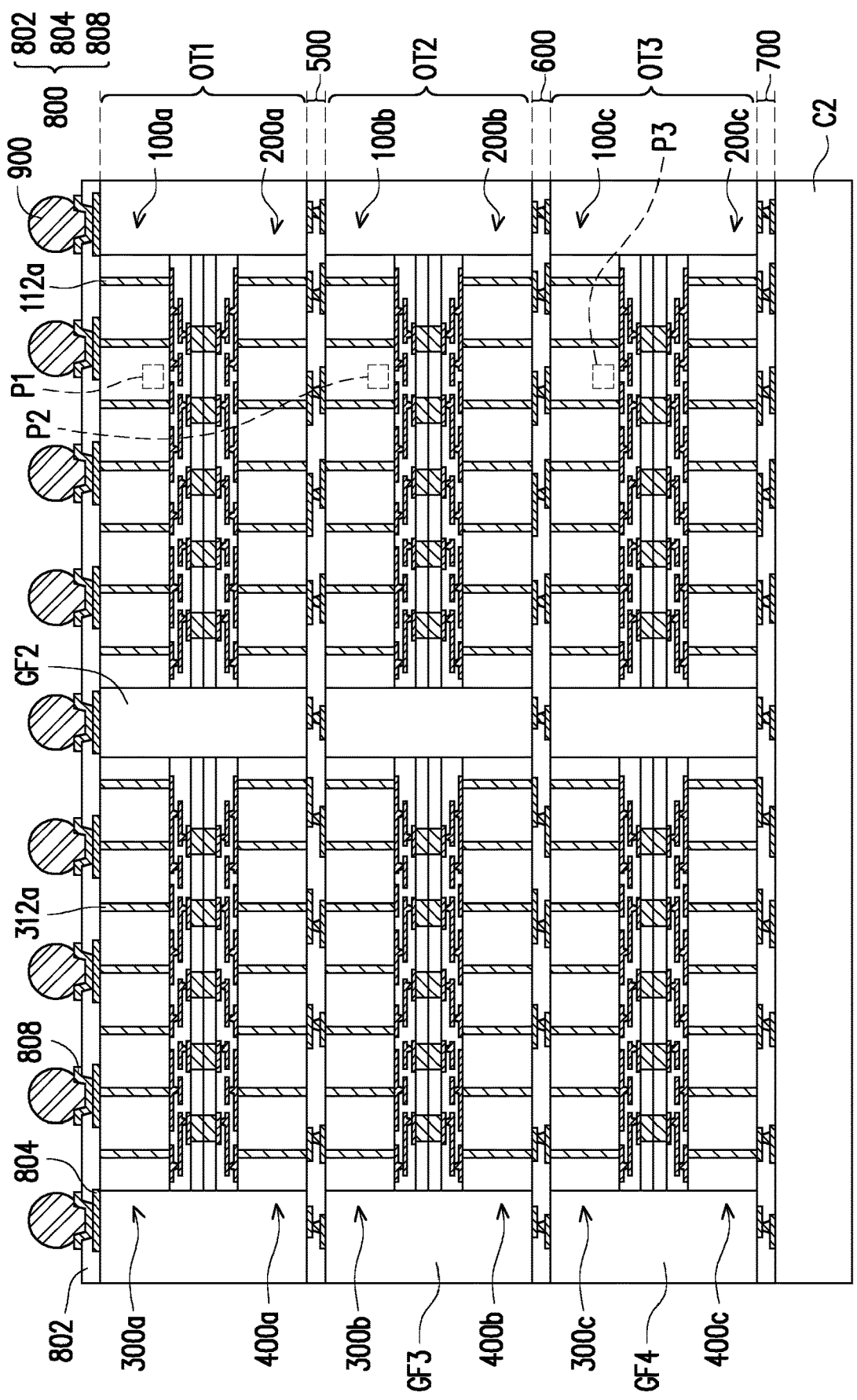

Referring to FIG. 2J, a redistribution structure 800 is formed over the first optical transceiver OT1. In some embodiments, the redistribution structure 800 is formed on the first photonic integrated circuit component 100a, the insulating encapsulant GF2, and the first storage integrated circuit component 300a. In some embodiments, the redistribution structure 800 includes a dielectric layer 802, a plurality of redistribution conductive layers 804, and a plurality of under-ball metallurgy (UBM) patterns 808. The dielectric layer 802 and the redistribution conductive layer 804 of the redistribution structure 800 may be respectively similar to the dielectric layer 502 and the redistribution conductive layers 504 of the redistribution structure 500, so the detailed descriptions thereof are omitted herein. The UBM patterns 808 may be formed by similar material and method as that of the redistribution conductive layer 804. For example, the material of the UBM patterns 808 may include aluminum, titanium, copper, nickel, tungsten, and/or alloys thereof and the formation method of the UBM patterns 808 may include electroplating, deposition, and/or photolithography and etching. In some embodiments, the redistribution structure 800 is formed such that the redistribution conductive layer 804 is electrically and/or optically connected to the through semiconductor vias 112a of the first photonic integrated circuit component 100a and the through semiconductor vias 312a of the first storage integrated circuit component 300a. In some embodiments, the UBM patterns 808 are partially embedded in the dielectric layer 802 and are electrically connected to the redistribution conductive layer 804. Although the redistribution conductive layers 804 is being illustrated as a single layer in FIG. 2J, the disclosure is not limited thereto. In some alternative embodiments, multiple redistribution conductive layers 804 may be included in the redistribution structure 800, and the redistribution conductive layer 804 may be electrically connected to one another through conductive vias (not shown).

After the redistribution structure 800 is formed, a plurality of conductive terminals 900 are disposed over the first optical transceiver OT1 opposite to the second optical transceiver OT2. In some embodiments, the conductive terminals 900 are electrically connected to the first optical transceiver OT1. For example, the conductive terminals 900 may be electrically connected to the first optical transceiver OT1 through the redistribution structure 800. That is, the conductive terminals 900 may be disposed on the UBM patterns 808. In some embodiments, the conductive terminals 900 are attached to the UBM patterns 808 through a solder flux. In some embodiments, the conductive terminals 900 are, for example, solder balls, ball grid array (BGA) balls, or controlled collapse chip connection (C4) bumps. In some embodiments, the conductive terminals 900 are made of a conductive material with low resistivity, such as Sn, Pb, Ag, Cu, Ni, Bi, or an alloy thereof.

Figure 2K:
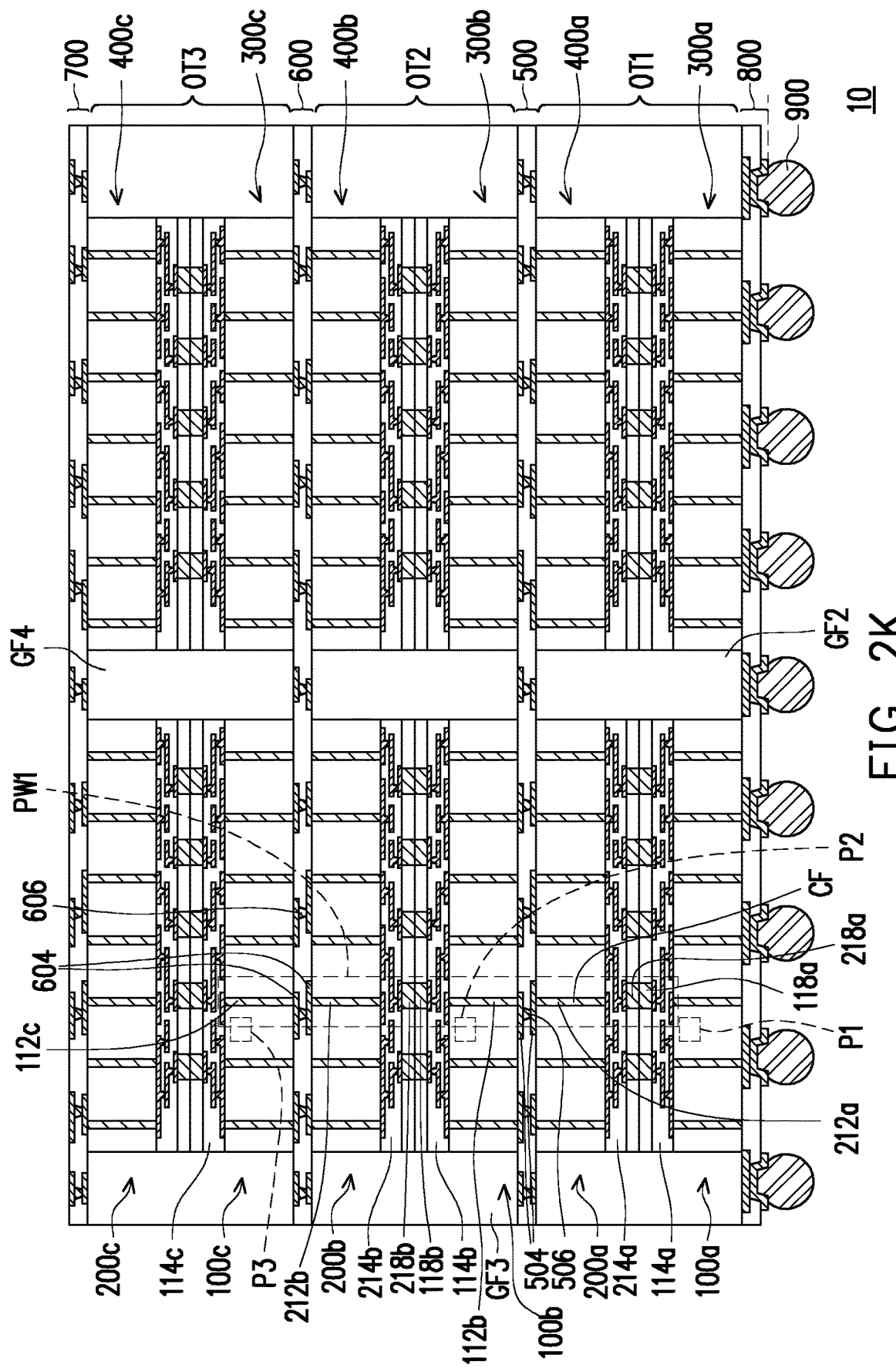

Referring to FIG. 2K, the structure illustrated in FIG. 2J is flipped upside down and the second carrier C2 is removed to obtain a semiconductor package 10. As illustrated in FIG. 2K, the semiconductor package 10 includes the first optical transceiver OT1, the second optical transceiver OT2, the third optical transceiver OT3, the redistribution structures 500, 600, 700, 800, the conductive terminals 900, and a plasmonic waveguide PW1. In some embodiments, the plasmonic waveguide PW1 optically couples the optical input/output portion P1 of the first optical transceiver OT1, the optical input/output portion P2 of the second optical transceiver OT2, and the optical input/output portion P3 of the third optical transceiver OT3. In other words, the first photonic integrated circuit component 100a, the second photonic integrated circuit component 100b, and the third photonic integrated circuit component 100c are optically coupled to the plasmonic waveguide PW1. In some embodiments, the plasmonic waveguide PW1 may include a conductive feature CF constituted by portions of the conductive patterns in the interconnection structure 114a, portions of the conductors 118a, 218a, portions of the conductive patterns in the interconnection structure 214a, portions of the through semiconductor vias 212a, portions of the redistribution conductive layers 504, portions of the conductive vias 506, portions of the through semiconductor vias 112b, portions of the conductive patterns in the interconnection structure 114b, portions of the conductors 118b, 218b, portions of the conductive patterns in the interconnection structure 214b, portions of the through semiconductor vias 212b, portions of the redistribution conductive layers 604, portions of the conductive vias 606, portions of the through semiconductor vias 112c, and portions of the conductive patterns in the interconnection structure 114c. As illustrated in FIG. 2K, the plasmonic waveguide PW1 penetrates through the second optical transceiver OT2. For example, the plasmonic waveguide PW1 penetrates through the second photonic integrated circuit component 100b and the second electric integrated circuit component 200b.

Figure 3:
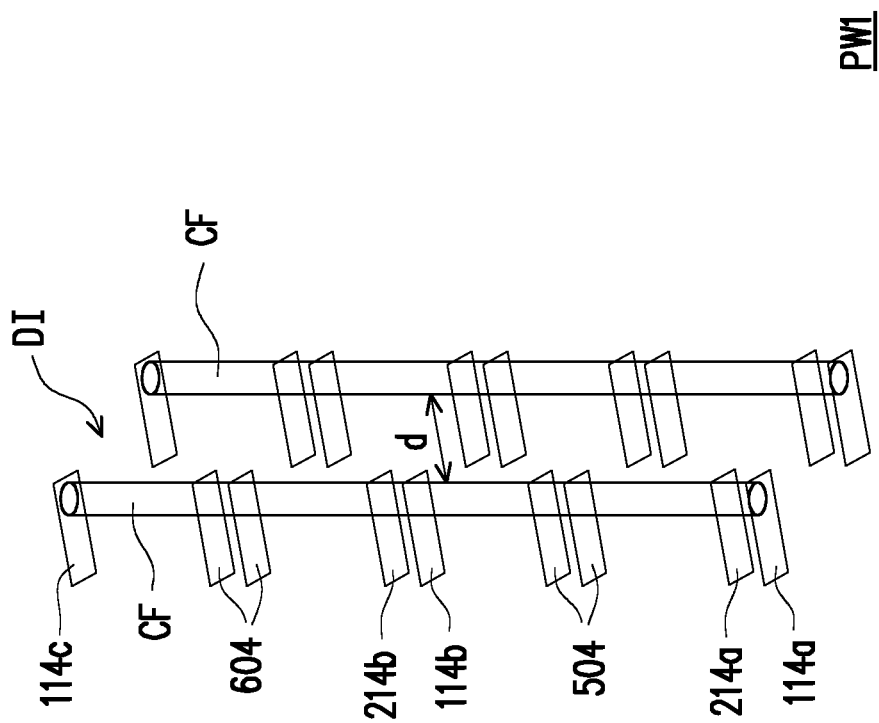
FIG. 3 is a schematic perspective view illustrating the plasmonic waveguide in FIG. 2K.

The details of the plasmonic waveguide PW1 will be described below in conjunction with FIG. 3. FIG. 3 is a schematic perspective view illustrating the plasmonic waveguide PW1 in FIG. 2K. Referring to FIG. 2K and FIG. 3, the plasmonic waveguide PW1 may include a pair of adjacent conductive features CF for confining optical signals transmitted along the plasmonic waveguide PW1. In some embodiments, these adjacent conductive features CF are arranged in a symmetrical manner. In other words, the pair of adjacent conductive features CF may be mirror image of each other. In some embodiments, a dielectric material DI may fill in a gap between the pair of conductive features CF to create a metal-dielectric interface. In some embodiments, the dielectric material DI includes photoresist, epoxy, optical polymer (e.g. polymethylmethacrylate, polyurethane, or polyimide), or other suitable optical dielectric materials. The pair of conductive features CF and the dielectric material DI may be collectively referred to as the plasmonic waveguide PW1. However, the disclosure is not limited thereto. In some alternative embodiments, the gap between the pair of conductive features CF may be occupied by a semiconductor material in place of dielectric material DI to form the plasmonic waveguide PW1. That is, when the conductive feature CF is constituted by through semiconductor vias (for example, the through semiconductor vias 212a, the through semiconductor vias 112b, the through semiconductor vias 212b, and the through semiconductor vias 112c shown in FIG. 2K), the dielectric material DI may be omitted. In some embodiments, a distance d between the pair of adjacent conductive features CF may range between 10 nm and 1000 nm.

The system operation and the optical prorogation path of the semiconductor package 10 will be described below. During operation, the first functional integrated circuit component 400a first generates a command signal. The command signal then travels through the redistribution structure 500 to arrive at the first electric integrated circuit component 200a. Upon receiving the command signal, the first electric integrated circuit component 200a series a trigger signal to the first photonic integrated circuit component 100a. In some embodiments, the trigger signal may be transmitted from the front side of the first electric integrated circuit component 200a to the back side of the first electric integrated circuit component 200a through the through semiconductor vias 212a. It should be noted that the command signal and the trigger signal are both electrical signal. Upon receiving the trigger signal, the first photonic integrated circuit component 100a converts the trigger signal from an electrical signal to an optical signal. For example, the optical signal may be generated by the first photonic integrated circuit component 100a. Thereafter, the optical input/output portion P1 of the first photonic integrated circuit component 100a sends the optical signal to the plasmonic waveguide PW1. Upon receiving the optical signal, the plasmonic waveguide PW1 is able to create a path for the optical signal to propagate. In some embodiments, the plasmonic waveguide PW1 utilizes surface plasmon to confine the optical signal near the metal-dielectric interface. In other words, the plasmonic waveguide PW1 allows resonance of photons and guides the optical signal to propagate through the path created by the pair of conductive features CF. The optical signal travels through the plasmonic waveguide PW1 to arrive at the optical input/out portion P3 of the third photonic integrated circuit component 100c. Subsequently, the third photonic integrated circuit component 100c converts the optical signal back to the trigger signal in electrical signal form and sends the trigger signal to the third electric integrated circuit component 200c. Then, the third electric integrated circuit component 200c series a data signal (in electrical signal form) to the third functional integrated circuit component 400c through the redistribution structure 700. In some embodiments, the optical transmission along the plasmonic waveguide PW1 may be bidirectional. In other words, the forgoing operation may be conducted in reverse order.

It should be noted that the signal transmission path described above is merely an exemplary illustration, and the disclosure is not limited thereto. Depending on the operation and the circuit design, the plasmonic waveguide PW1 may also aids the optical communication between the optical input/output portion P1 of the first optical transceiver OT1 and the optical input/output portion P2 of the second optical transceiver OT2 and/or the optical communication between the optical input/output portion P2 of the second optical transceiver OT2 and the optical input/output portion P3 of the third optical transceiver OT3.

In some embodiments, by adapting the vertical plasmonic waveguide PW1 for transmitting optical signals, the current density may be sufficiently reduced in the semiconductor package 10. As such, the waste heat in the semiconductor package 10 (multi-chip stack) may be reduced, thereby enhancing the device performance. In addition, the plasmonic waveguide PW1 has a low bending radius, which allows the plasmonic waveguide PW1 to be formed by simply connecting the TSV to the conductive patterns in the redistribution structure. Moreover, since the first optical transceiver OT1, the second optical transceiver OT2, and the third optical transceiver OT3 have small thicknesses, the propagation path created by the plasmonic waveguide PW1 may be short. As such, the signal loss during transmission may be reduced and higher data transfer rate may be achieved. In some embodiments, the short propagation path also allows adaption of low intensity light sources to save cost and energy. Furthermore, since the semiconductor package 10 is formed by vertically stacking the optical transceivers, more optical transceivers may be integrated into the semiconductor package 10 within a given area.

Figure 4A:
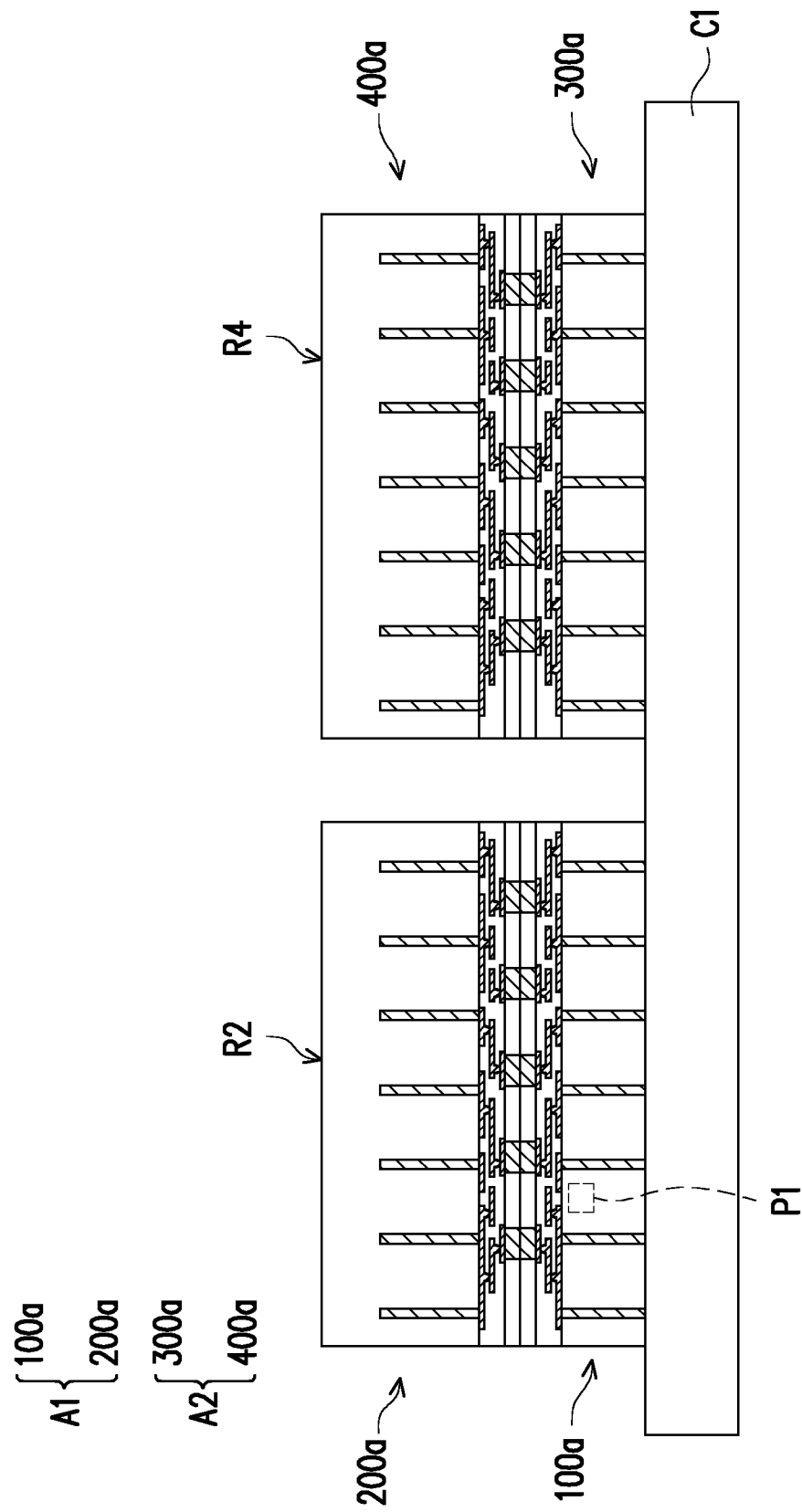
FIG. 4A to FIG. 4K are schematic cross-sectional views illustrating a manufacturing process of a semiconductor package in accordance with some alternative embodiments of the disclosure.
Figure 4B:
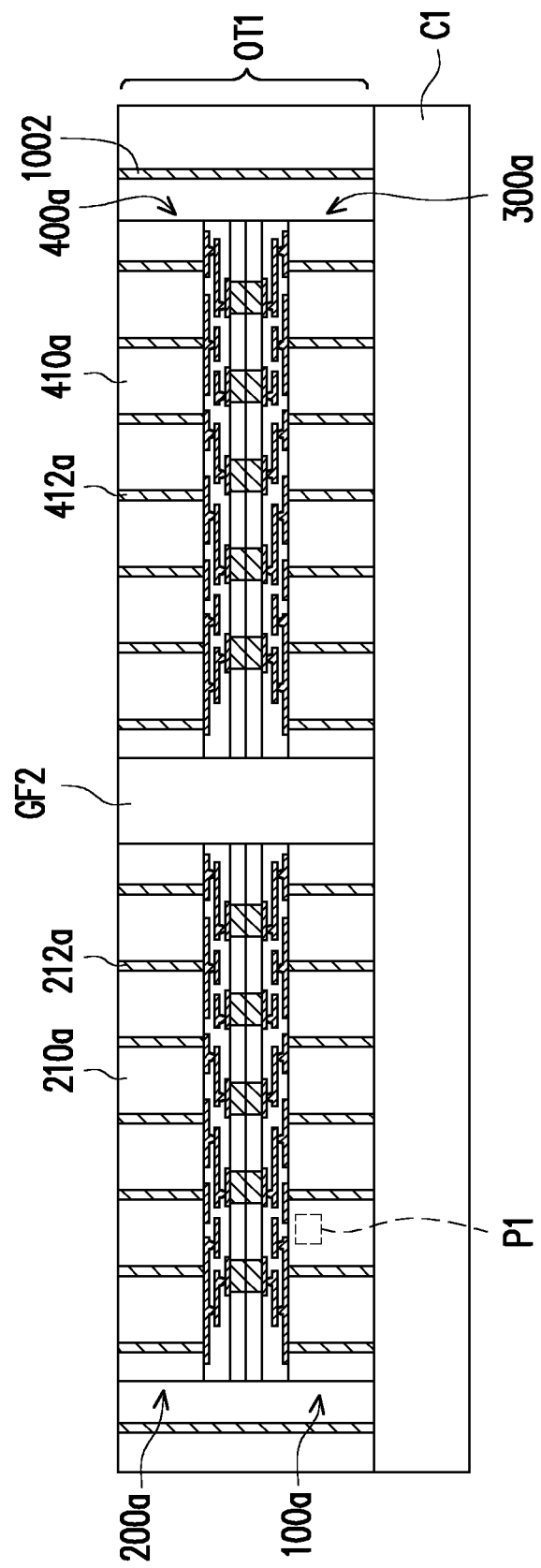

FIG. 4A to FIG. 4K are schematic cross-sectional views illustrating a manufacturing process of a semiconductor package 20 in accordance with some alternative embodiments of the disclosure. Referring to FIG. 4A and FIG. 4B, the steps illustrated in FIG. 4A and FIG. 4B are similar to the steps shown in FIG. 2A and FIG. 2B, so similar elements are denoted by the same reference numeral and the detailed descriptions thereof are omitted herein. However, in FIG. 4B, a plurality of through insulating vias (TIV) 1002 are further formed in the insulating encapsulant GF2. In some embodiments, the through insulating vias 1002 penetrate through the first optical transceiver OT1. For example, the through insulating vias 1002 penetrate through the insulating encapsulant GF2 of the first optical transceiver OT1. As such, the through insulating vias 1002 may be utilized to realize electrical and/or optical connection between the front side and the back side of the first optical transceiver OT1. In other words, electrical and/or optical signals may be transmitted through the through insulating via 1002.

In some embodiments, the through insulating vias 1002 may be made of conductive materials. For example, the material of the through insulating vias 1002 may include a metal material such as copper, copper alloys, or the like. In some embodiments, the through insulating vias 1002 may be formed prior to the formation of the insulating encapsulant GF2. However, the disclosure is not limited thereto. In some alternative embodiments, the through insulating vias 1002 may be formed after the formation of the insulating encapsulant GF2. For example, the through insulating vias 1002 may be formed by forming a plurality of openings in the insulating encapsulant GF2 and filling a conductive material into the openings of the insulating encapsulant GF2. As illustrated in FIG. 4B, the first optical transceiver OT1 includes the first photonic integrated circuit component 100a, the first electric integrated circuit component 200a, the first storage integrated circuit component 300a, the first functional integrated circuit component 400a, the insulating encapsulant GF2, and the through insulating vias 1002.

Figure 4C:
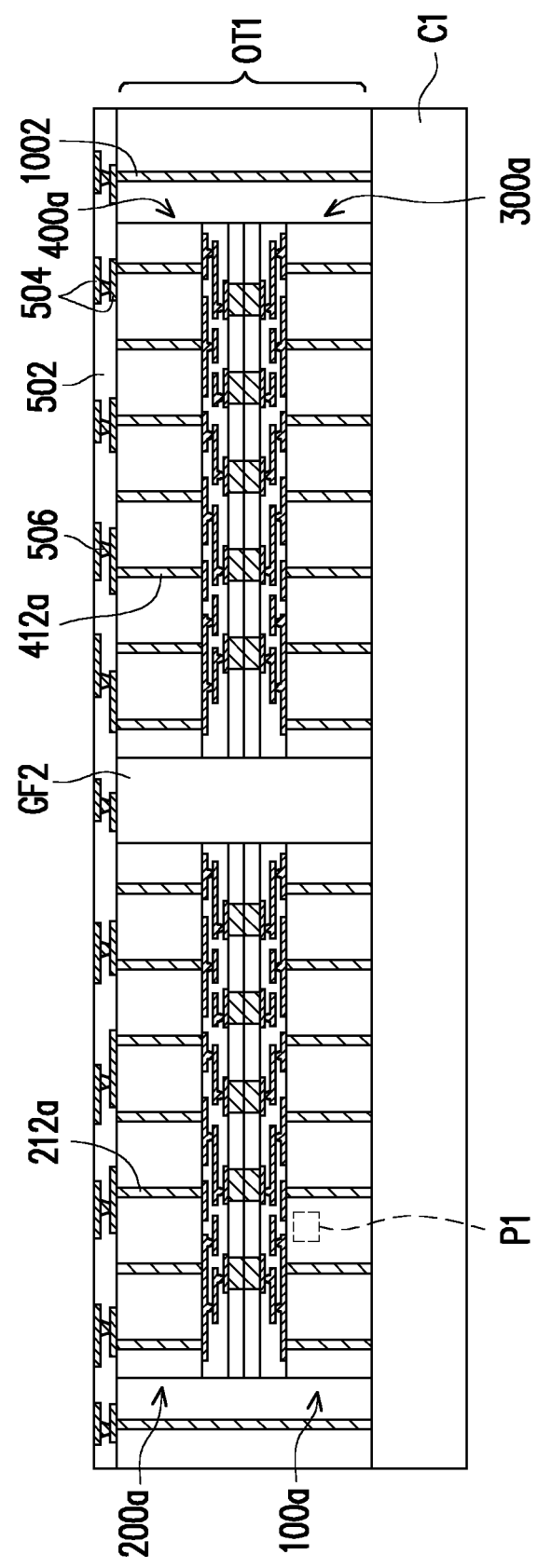
Figure 4D:
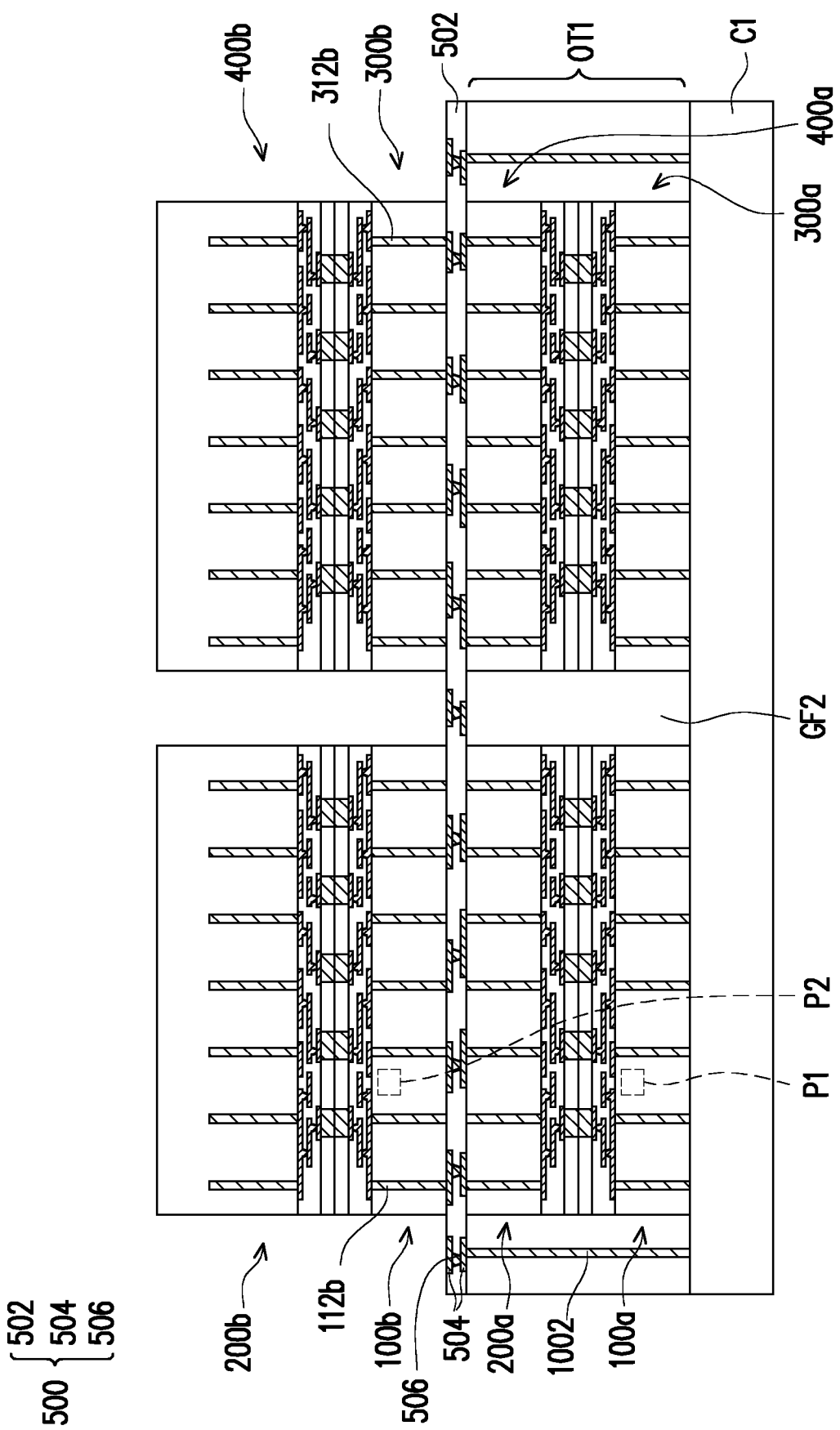
Figure 4E:
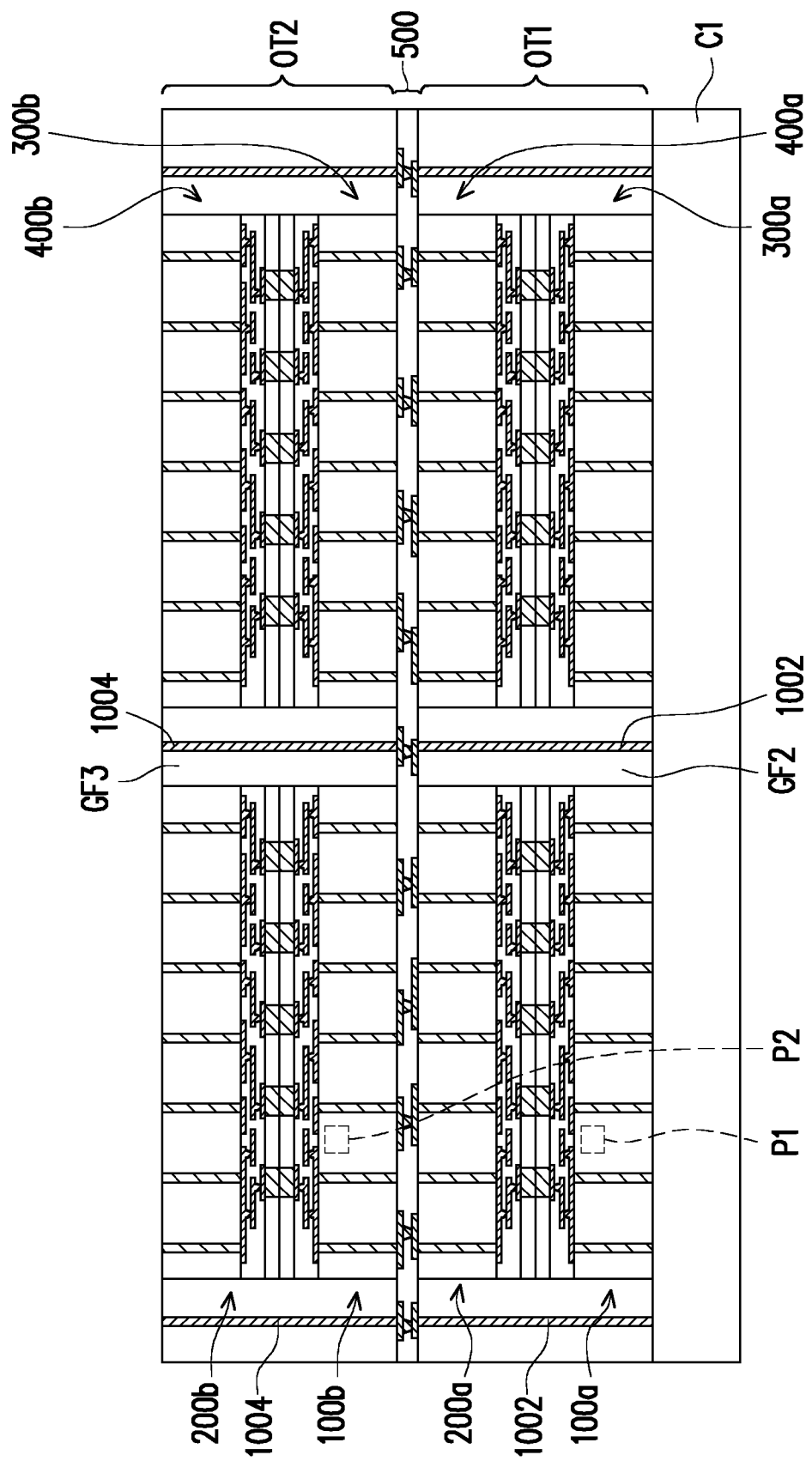

Referring to FIG. 4C to FIG. 4E, the steps illustrated in FIG. 4C to FIG. 4E are similar to the steps shown in FIG. 2C to FIG. 2E, so similar elements are denoted by the same reference numeral and the detailed descriptions thereof are omitted herein. However, in FIG. 4E, a plurality of through insulating vias 1004 are further formed in the insulating encapsulant GF3. The through insulating vias 1004 may be similar to the through insulating vias 1002, so the detailed descriptions thereof are omitted herein. In some embodiments, the through insulating vias 1004 penetrate through the second optical transceiver OT2. For example, the through insulating vias 1004 penetrate through the insulating encapsulant GF3 of the second optical transceiver OT2. As such, the through insulating vias 1004 may be utilized to realize electrical and/or optical connection between the front side and the back side of the second optical transceiver OT2.

Figure 4F:
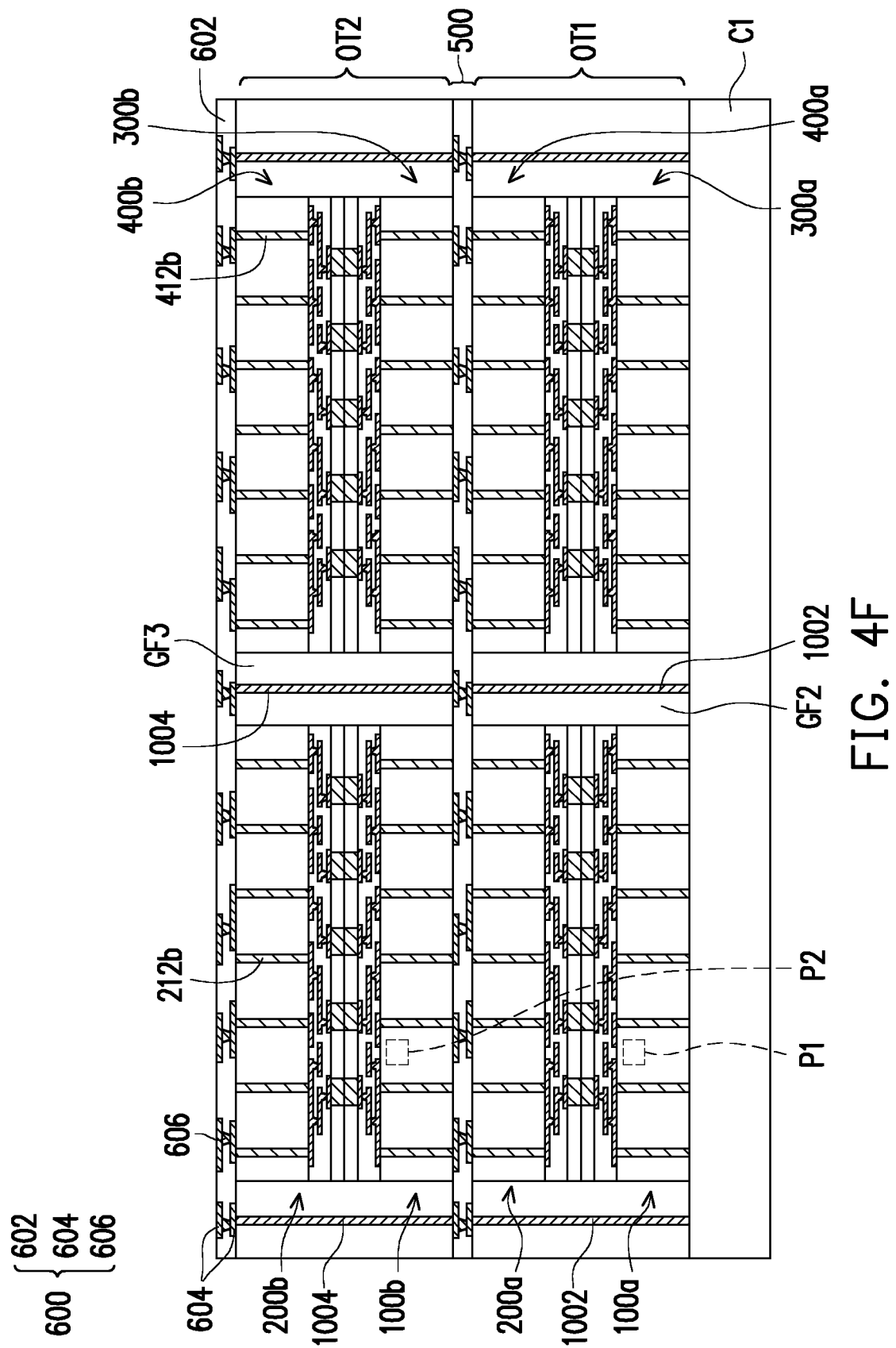
Figure 4G:
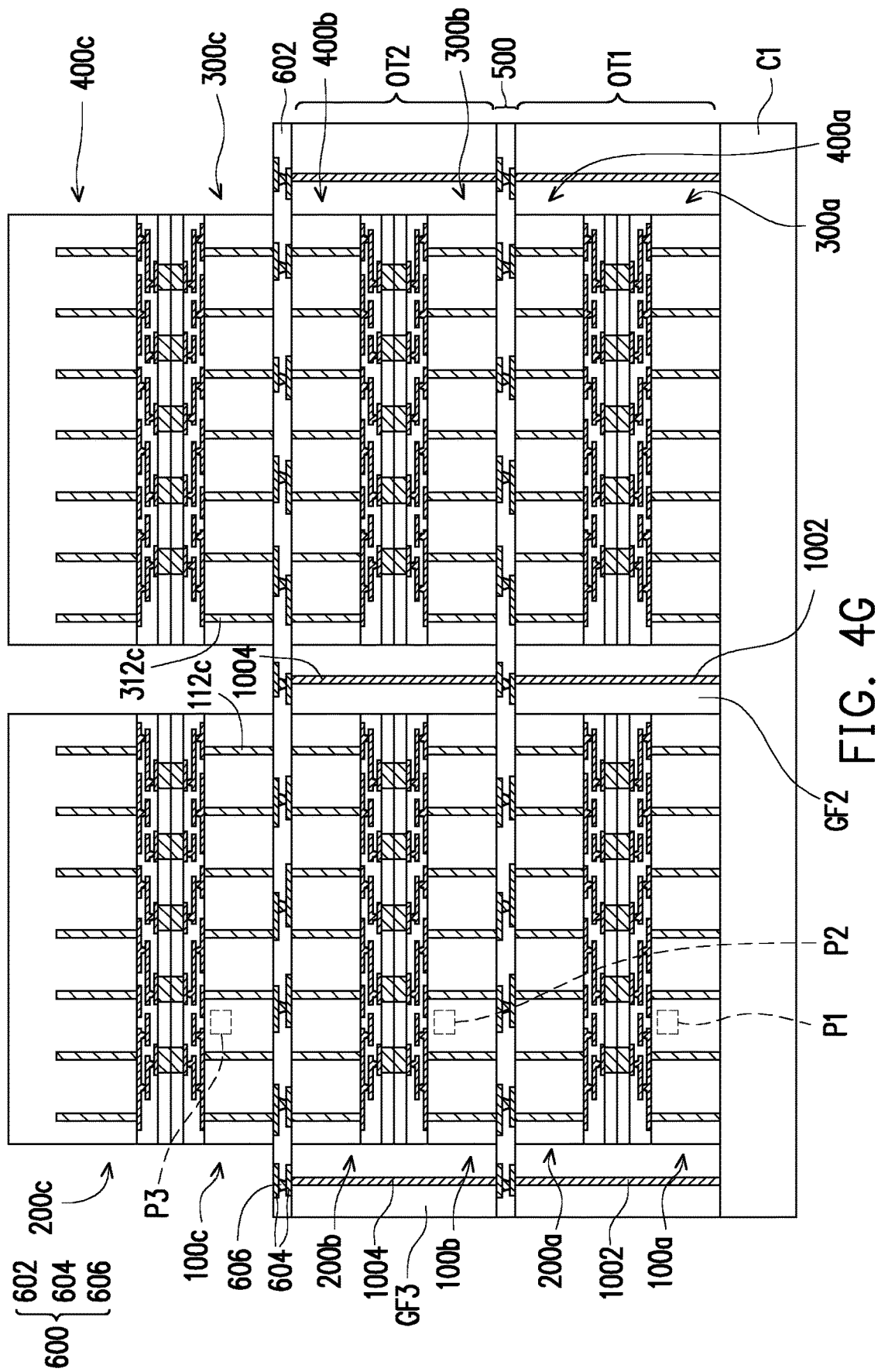
Figure 4H:
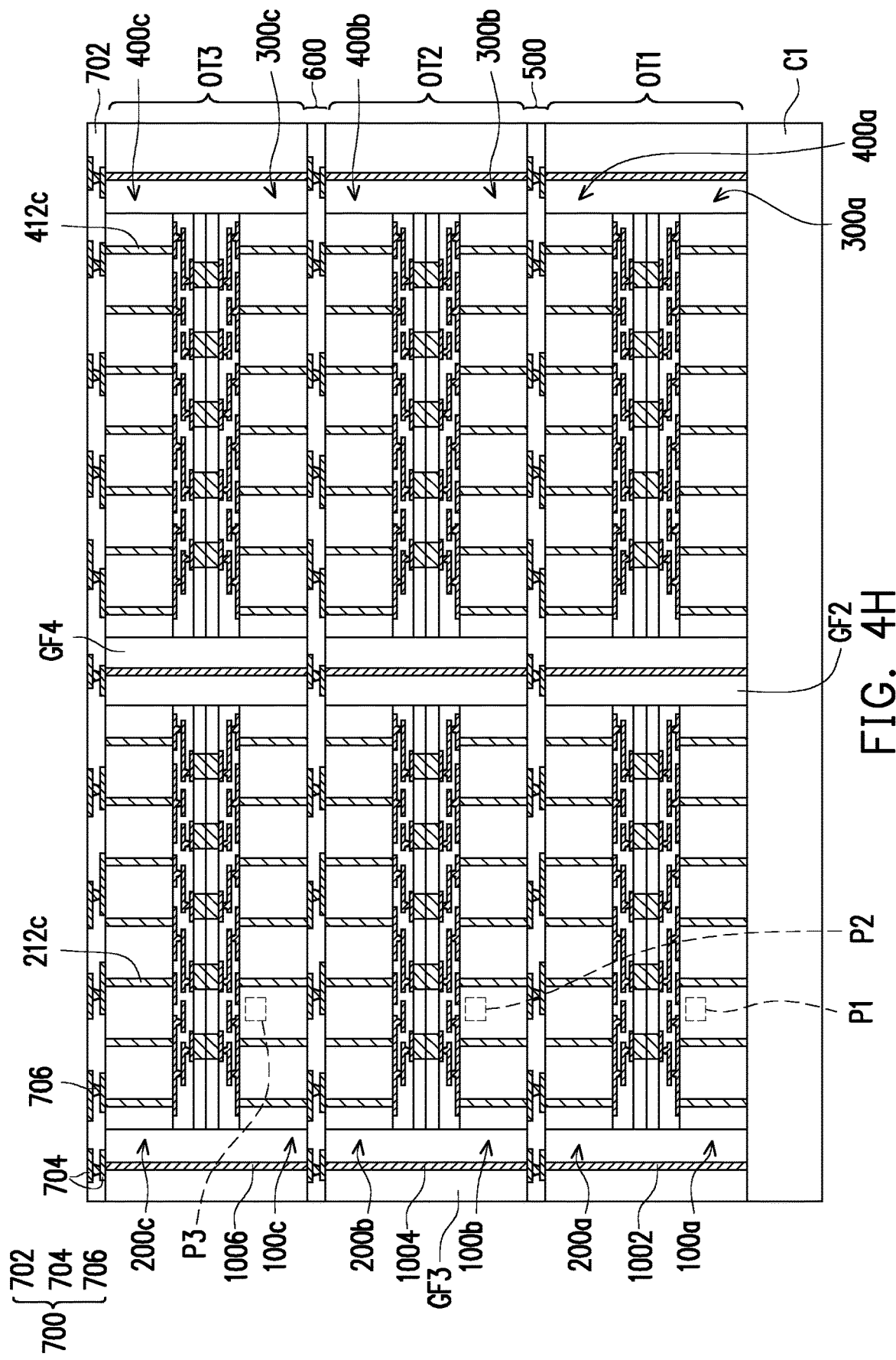

Referring to FIG. 4F to FIG. 4H, the steps illustrated in FIG. 4F to FIG. 4H are similar to the steps shown in FIG. 2F to FIG. 2H, so similar elements are denoted by the same reference numeral and the detailed descriptions thereof are omitted herein. However, in FIG. 4H, a plurality of through insulating vias 1006 are further formed in the insulating encapsulant GF4. The through insulating vias 1006 may be similar to the through insulating vias 1002, so the detailed descriptions thereof are omitted herein. In some embodiments, the through insulating vias 1006 penetrate through the third optical transceiver OT3. For example, the through insulating vias 1006 penetrate through the insulating encapsulant GF4 of the second optical transceiver OT3. As such, the through insulating vias 1006 may be utilized to realize electrical and/or optical connection between the front side and the back side of the third optical transceiver OT3.

Figure 4I:
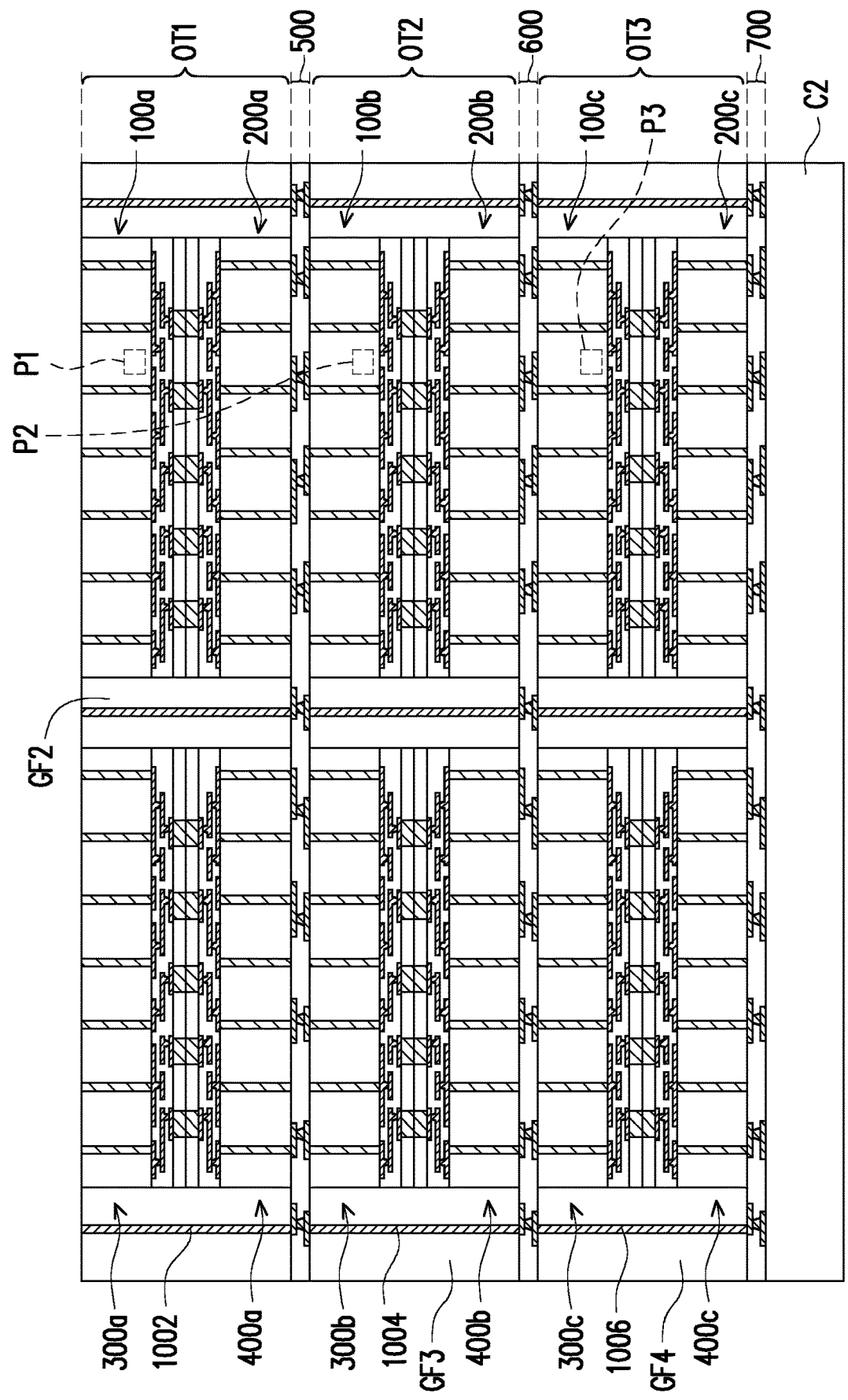
Figure 4J:
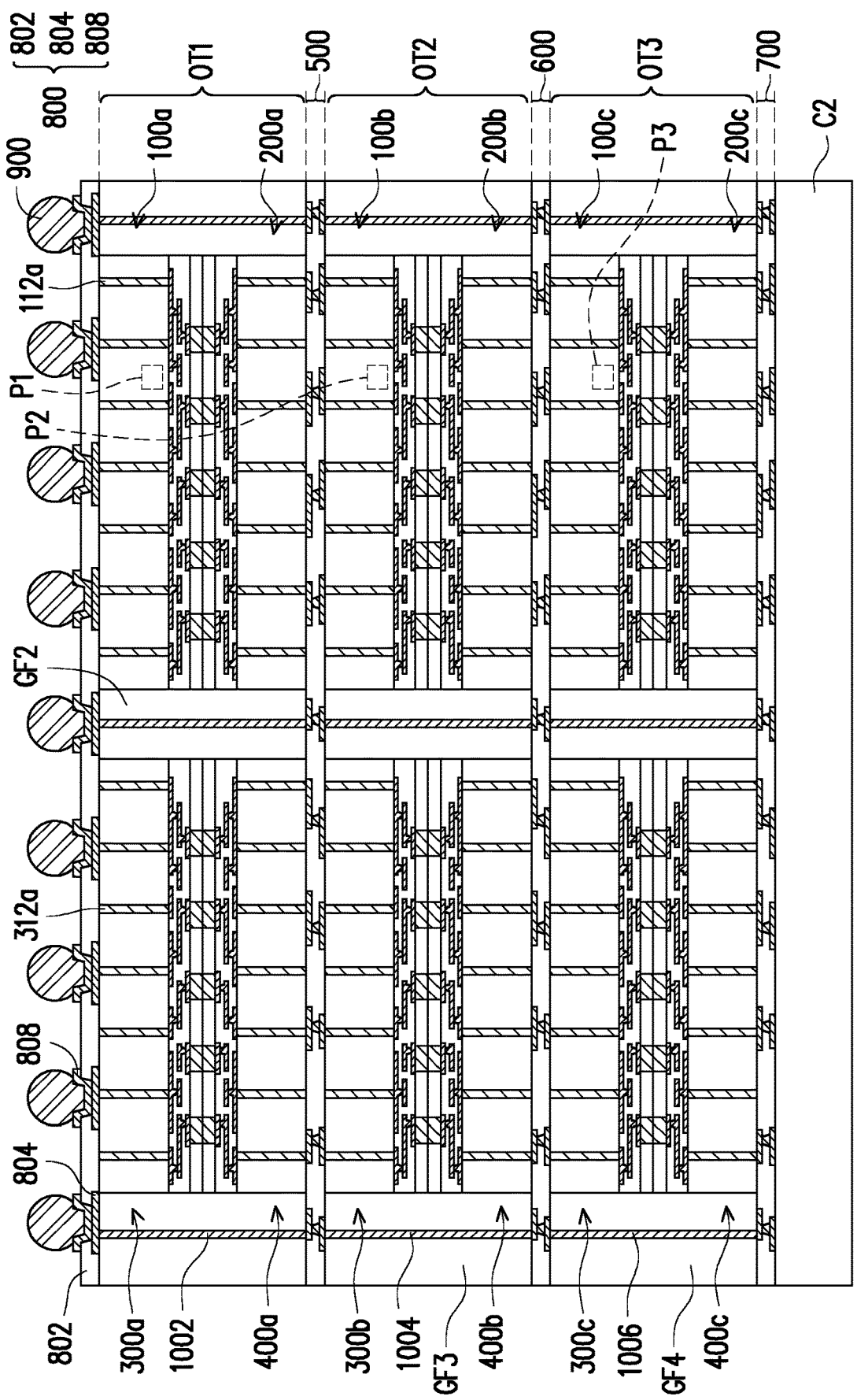
Figure 4K:
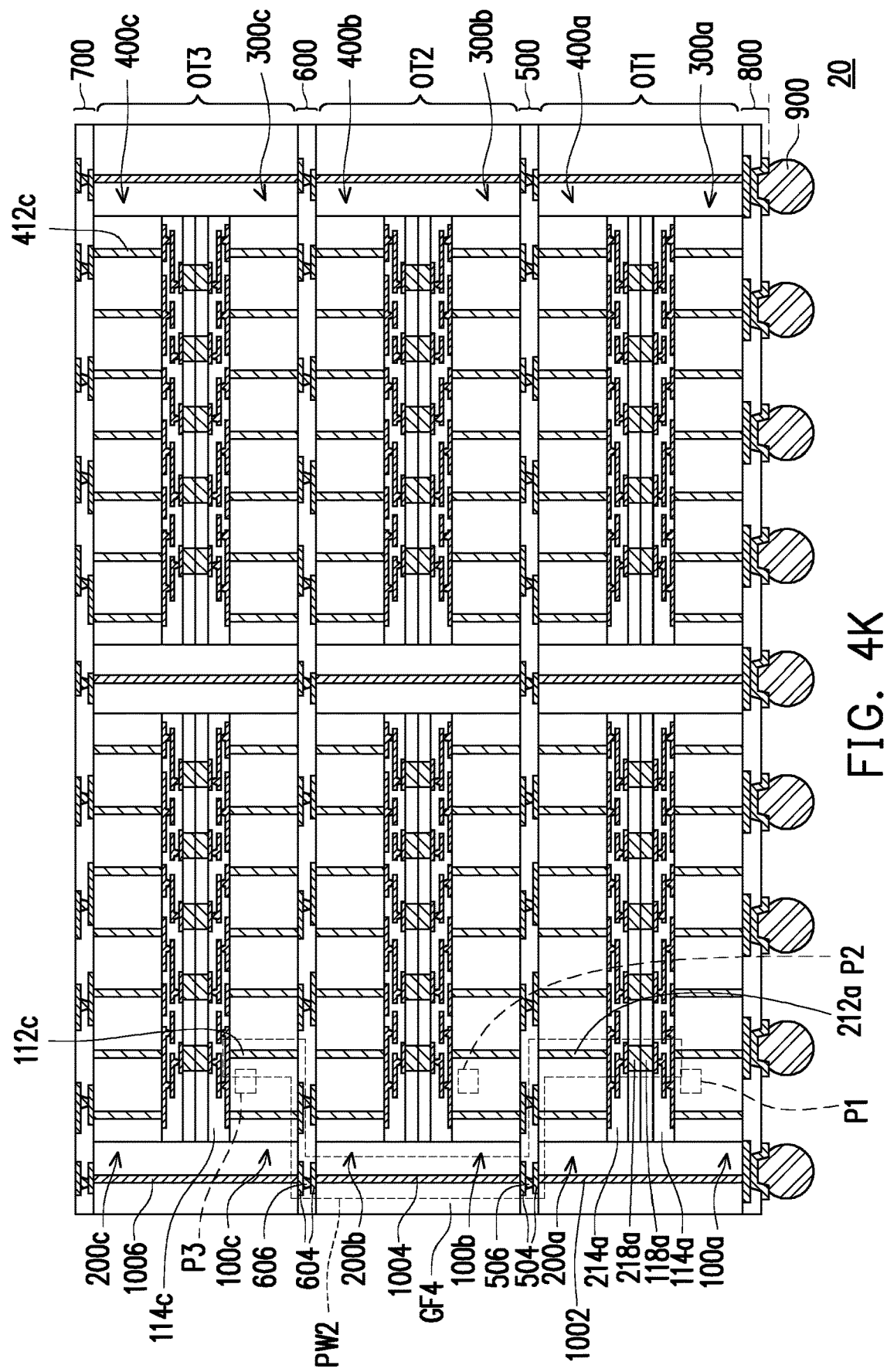

Referring to FIG. 4I to FIG. 4K, the steps illustrated in FIG. 4I to FIG. 4K are similar to the steps shown in FIG. 2I to FIG. 2K, so similar elements are denoted by the same reference numeral and the detailed descriptions thereof are omitted herein. As illustrated in FIG. 4K, a semiconductor package 20 is obtained. The semiconductor package 20 includes the first optical transceiver OT1, the second optical transceiver OT2, the third optical transceiver OT3, the redistribution structures 500, 600, 700, 800, the conductive terminals 900, and a plasmonic waveguide PW2. The plasmonic waveguide PW2 may be similar to the plasmonic waveguide PW1 in FIG. 2K, so the detailed description thereof is omitted herein. In some embodiments, the plasmonic waveguide PW2 optically couples the optical input/output portion P1 of the first optical transceiver OT1 and the optical input/output portion P3 of the third optical transceiver OT3. In other words, the first photonic integrated circuit component 100a and the third photonic integrated circuit component 100c are optically coupled to the plasmonic waveguide PW2. In some embodiments, the plasmonic waveguide PW2 may include a conductive feature constituted by portions of the conductive patterns in the interconnection structure 114a, portions of the conductors 118a, 218a, portions of the conductive patterns in the interconnection structure 214a, portions of the through semiconductor vias 212a, portions of the redistribution conductive layers 504, portions of the conductive vias 506, portions of the through insulating vias 1004, portions of the redistribution conductive layers 604, portions of the conductive vias 606, portions of the through semiconductor vias 112c, and portions of the conductive patterns in the interconnection structure 114c. In some embodiments, the plasmonic waveguide PW2 penetrates through the second optical transceiver OT2. For example, the plasmonic waveguide PW2 penetrates through the insulating encapsulant GF4.

In some embodiments, by adapting the vertical plasmonic waveguide PW2 for transmitting optical signals, the current density may be sufficiently reduced in the semiconductor package 20. As such, the waste heat in the semiconductor package 20 (multi-chip stack) may be reduced, thereby enhancing the device performance. Moreover, since the first optical transceiver OT1, the second optical transceiver OT2, and the third optical transceiver OT3 have small thicknesses (the first optical transceiver OT1, the second optical transceiver OT2, and the third optical transceiver OT3 respectively has a thickness of less than 20 μm), the propagation path created by the plasmonic waveguide PW2 may be short. As such, the signal loss during transmission may be reduced and higher data transfer rate may be achieved. In some embodiments, the short propagation path also allows adaption of low intensity light sources to save cost and energy. Furthermore, since the semiconductor package 20 is formed by vertically stacking the optical transceivers, more optical transceivers may be integrated into the semiconductor package 20 within a given area.

Figure 5A:
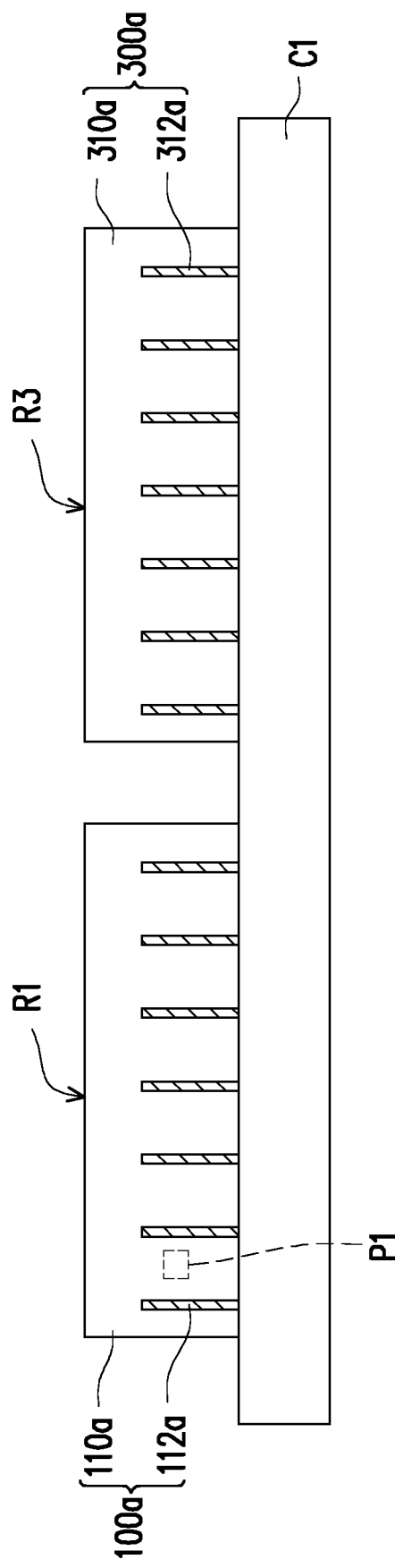
FIG. 5A to FIG. 5G are schematic cross-sectional views illustrating a manufacturing process of a semiconductor package in accordance with some alternative embodiments of the disclosure.

FIG. 5A to FIG. 5G are schematic cross-sectional views illustrating a manufacturing process of a semiconductor package 30 in accordance with some alternative embodiments of the disclosure. Referring to FIG. 5A, a first photonic integrated circuit component 100a and a first storage integrated circuit component 300a are pick-and-placed onto a first carrier C1. In some embodiments, the first photonic integrated circuit component 100a and the first storage integrated circuit component 300a are placed side by side. The first photonic integrated circuit component 100a and the first storage integrated circuit component 300a in FIG. 5A may be respectively similar to the first photonic integrated circuit component 100a and the first storage integrated circuit component 300a in FIG. 1A, so similar elements are denoted by the same reference numeral and the detailed descriptions thereof are omitted herein. It should be noted that the interconnection structures 114a, 314a, the dielectric layers 116a, 316a, and the conductors 118a, 318a shown in FIG. 1A are not illustrated in FIG. 5A. However, the omission of these elements merely serves as an exemplary illustration and does not intent to limit the disclosure. In other words, these elements may or may not be included in the first photonic integrated circuit component 100a and the first storage circuit component 300a in FIG. 5A.

Figure 5B:
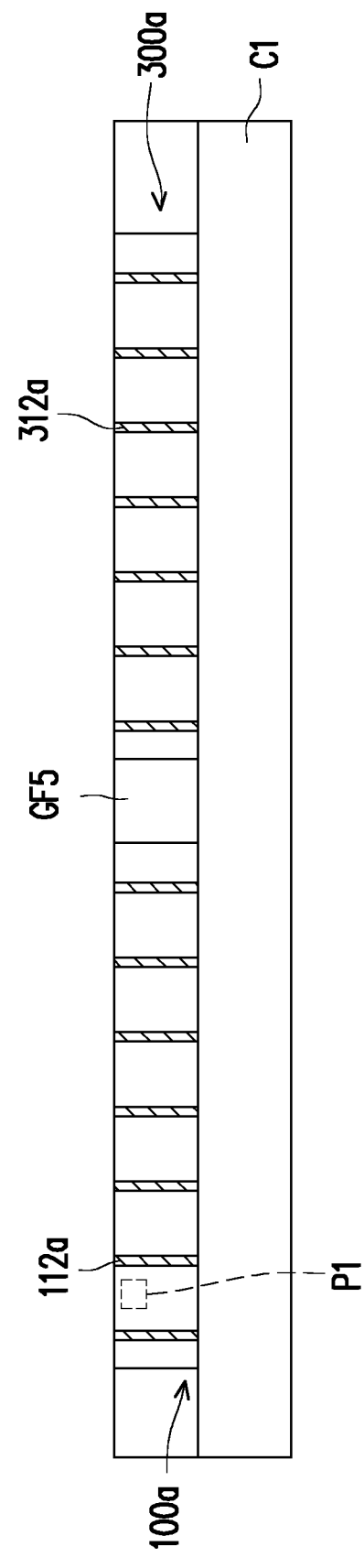

Referring to FIG. 5B, an insulating encapsulant GF5 is formed over the first carrier C1 to encapsulate the first photonic integrated circuit component 100a and the first storage integrated circuit component 300a. In some embodiments, the insulating encapsulant GF5 includes a molding compound, a molding underfill, a resin (such as epoxy), or the like. In some alternative embodiments, the insulating encapsulant GF5 may include silicon oxide, silicon nitride, or the like. In some embodiments, the insulating encapsulant GF5 may be formed by chemical vapor deposition (CVD), plasma-enhanced chemical vapor deposition (PECVD), atomic layer deposition (ALD), or the like. In some alternative embodiments, the insulating encapsulant GF5 may be formed by a molding process. For example, the insulating encapsulant GF5 may be formed by a compression molding process. In some embodiments, the insulating encapsulant GF5 may also be referred to as "gap fill oxide."

After the insulating encapsulant GF5 encapsulates the first photonic integrated circuit component 100a and the first storage integrated circuit component 300a, a planarization process is performed on the rear surface R1 of the first photonic integrated circuit component 100a, the rear surface R3 of the first storage integrated circuit component 300a, and the insulating encapsulant GF5. In some embodiments, the planarization process includes a mechanical grinding process and/or a chemical mechanical polishing (CMP) process. In some embodiments, the first photonic integrated circuit component 100a and the first storage integrated circuit component 300a are grinded until the through semiconductor vias 112a, 312a are revealed. For example, after the planarization process, the through semiconductor vias 112a and the through semiconductor vias 312a respectively penetrate through the semiconductor substrate 110a and the semiconductor substrate 310a. In some embodiments, after the through semiconductor vias 112a, 312a are revealed, the first photonic integrated circuit component 100a and the first storage integrated circuit component 300a may be further grinded to reduce the overall thickness of the first photonic integrated circuit component 100a and the first storage integrated circuit component 300a.

Figure 5C:
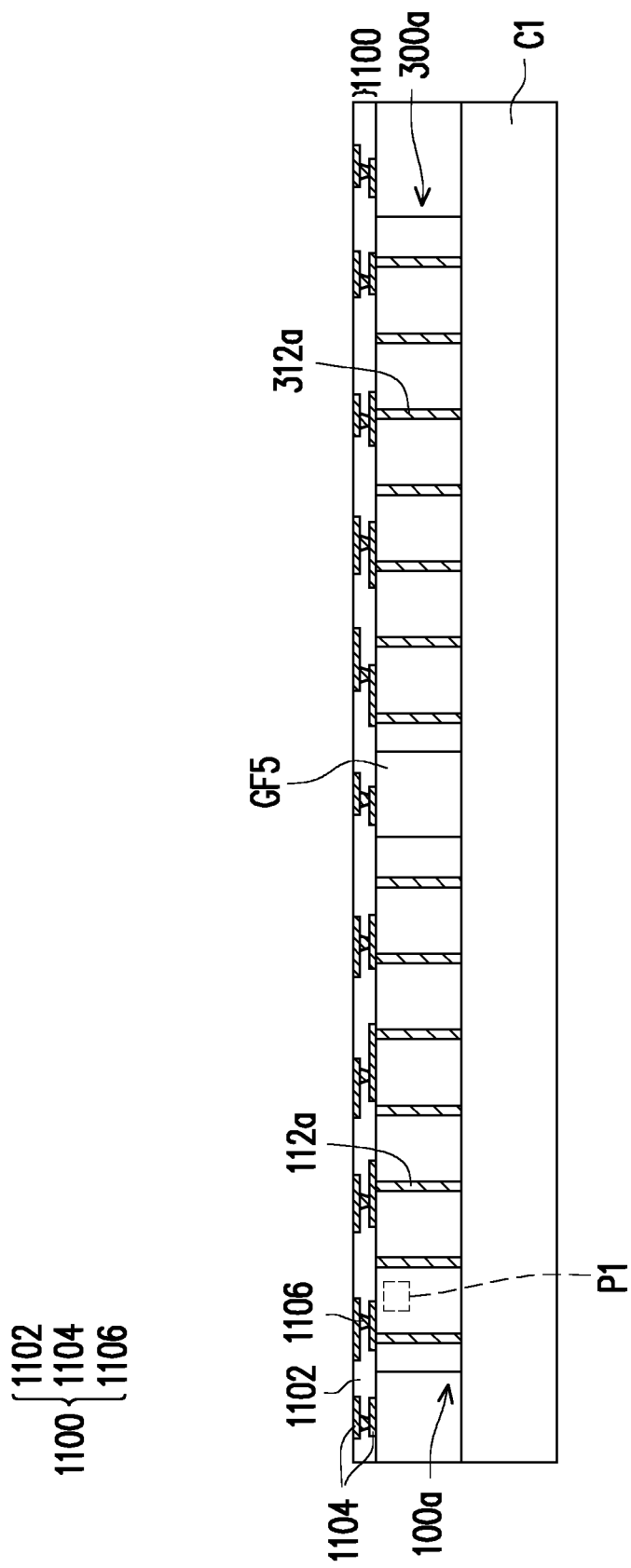

Referring to FIG. 5C, a redistribution structure 1100 is formed on the first photonic integrated circuit component 100a, the insulating encapsulant GF5, and the first storage integrated circuit component 300a. In some embodiments, the redistribution structure 1100 includes a dielectric layer 1102, a plurality of redistribution conductive layers 1104, and a plurality of conductive vias 1106. The dielectric layer 1102, the redistribution conductive layers 1104, and the conductive vias 1106 of the redistribution structure 1100 may be respectively similar to the dielectric layer 502, the redistribution conductive layers 504, and the conductive vias 506 of the redistribution structure 500 in FIG. 2C, so the detailed descriptions thereof are omitted herein. In some embodiments, the redistribution structure 1100 is formed such that the redistribution conductive layers 1104 are electrically and/or optically connected to the through semiconductor vias 112a of the first photonic integrated circuit component 100a and the through semiconductor vias 312a of the first storage integrated circuit component 300a.

Figure 5D:
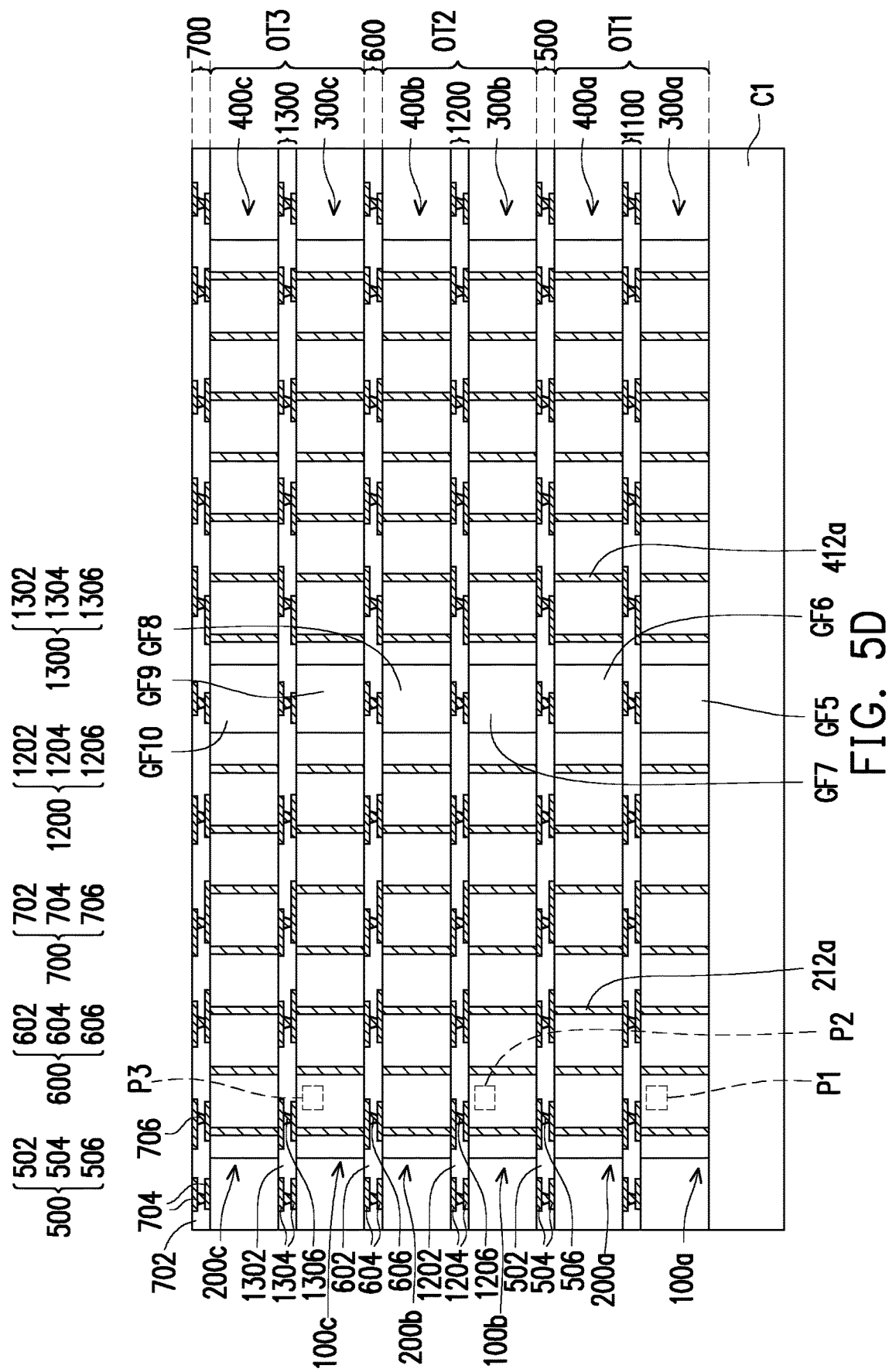

Referring to FIG. 5D, a first electric integrated circuit component 200a and a first functional integrated circuit component 400a are pick-and-placed onto the redistribution structure 1100. In some embodiments, the first electric integrated circuit component 200a and the first functional integrated circuit component 400a are placed side by side. The first electric integrated circuit component 200a and the first functional integrated circuit component 400a in FIG. 5D may be respectively similar to the first electric integrated circuit component 200a and the first functional integrated circuit component 400a in FIG. 1C, so similar elements are denoted by the same reference numeral and the detailed descriptions thereof are omitted herein. It should be noted that the interconnection structures 214a, 414a, the dielectric layers 216a, 416a, and the conductors 218a, 418a shown in FIG. 1C are not illustrated in FIG. 5D. However, the omission of these elements merely serves as an exemplary illustration and does not intent to limit the disclosure. In other words, these elements may or may not be included in the first electric integrated circuit component 200a and the first functional circuit component 400a in FIG. 5D.

After the first electric integrated circuit component 200a and the first functional integrated circuit component 400a are disposed on the redistribution structure 1100, an insulating encapsulant GF6 is formed over the redistribution structure 1100 to encapsulate the first electric integrated circuit component 200a and the first functional integrated circuit component 400a. The insulating encapsulant GF6 is similar to the insulating encapsulant GF5, so the detailed description thereof is omitted herein.

After the insulating encapsulant GF6 encapsulates the first electric integrated circuit component 200a and the first functional integrated circuit component 400a, a planarization process is performed on the first electric integrated circuit component 200a and the first functional integrated circuit component 400a to obtain a first optical transceiver OT1. In some embodiments, the planarization process includes a mechanical grinding process and/or a chemical mechanical polishing (CMP) process. In some embodiments, the first electric integrated circuit component 200a and the first functional integrated circuit component 400a are grinded until the through semiconductor vias 212a, 412a are revealed. In some embodiments, after the through semiconductor vias 212a, 412a are revealed, the first electric integrated circuit component 200a and the first functional integrated circuit component 400a may be further grinded to reduce the overall thickness of the first electric integrated circuit component 200a and the first functional integrated circuit component 400a. In some embodiments, the first optical transceiver OT1 includes the first photonic integrated circuit component 100a, the first electric integrated circuit component 200a, the first storage integrated circuit component 300a, the first functional integrated circuit component 400a, the redistribution structure 1100, the insulating encapsulant GF5, and the insulating encapsulant GF6.

Thereafter, a redistribution structure 500 is formed over the first optical transceiver OT1. For example, the redistribution structure 500 is formed on the first electric integrated circuit component 200a, the insulating encapsulant GF6, and the first functional integrated circuit component 400a. In some embodiments, the redistribution structure 500 includes a dielectric layer 502, a plurality of redistribution conductive layers 504, and a plurality of conductive vias 506. The dielectric layer 502, the redistribution conductive layers 504, and the conductive vias 506 of the redistribution structure 500 in FIG. 5D may be respectively similar to the dielectric layer 502, the redistribution conductive layers 504, and the conductive vias 506 of the redistribution structure 500 in FIG. 2C, so the detailed descriptions thereof are omitted herein. In some embodiments, the redistribution structure 500 is formed such that the redistribution conductive layers 504 are electrically and/or optically connected to the through semiconductor vias 212a of the first electric integrated circuit component 200a and the through semiconductor vias 412a of the first functional integrated circuit component 400a.

In some embodiments, the foregoing process may be repeated several times to obtain a second optical transceiver OT2, a redistribution structure 600, a third optical transceiver OT3, and a redistribution structure 700. The second optical transceiver OT2 is stacked on the redistribution structure 500 and includes a second photonic integrated circuit component 100b, a second electric integrated circuit component 200b, a second storage integrated circuit component 300b, a second functional integrated circuit component 400b, a redistribution structure 1200, an insulating encapsulant GF7, and an insulating encapsulant GF8. The second photonic integrated circuit component 100b, the second electric integrated circuit component 200b, the second storage integrated circuit component 300b, the second functional integrated circuit component 400b, the insulating encapsulant GF7, and the insulating encapsulant GF8 may be respectively similar to the first photonic integrated circuit component 100a, the first electric integrated circuit component 200a, the first storage integrated circuit component 300a, the first functional integrated circuit component 400a, the insulating encapsulant GF5, and the insulating encapsulant GF6 in FIG. 5A to FIG. 5D, so similar elements are denoted by the same reference numeral and the detailed descriptions thereof are omitted herein.

In some embodiments, the redistribution structure 1200 includes a dielectric layer 1202, a plurality of redistribution conductive layers 1204, and a plurality of conductive vias 1206. The dielectric layer 1202, the redistribution conductive layers 1204, and the conductive vias 1206 of the redistribution structure 1200 in FIG. 5D may be respectively similar to the dielectric layer 502, the redistribution conductive layers 504, and the conductive vias 506 of the redistribution structure 500 in FIG. 2C, so the detailed descriptions thereof are omitted herein.

The redistribution structure 600 is formed over the second optical transceiver OT2. For example, the redistribution structure 600 is formed on the second electric integrated circuit component 200b, the insulating encapsulant GF8, and the second functional integrated circuit component 400b. In some embodiments, the redistribution structure 600 includes a dielectric layer 602, a plurality of redistribution conductive layers 604, and a plurality of conductive vias 606. The dielectric layer 602, the redistribution conductive layers 604, and the conductive vias 606 of the redistribution structure 600 in FIG. 5D may be respectively similar to the dielectric layer 502, the redistribution conductive layers 504, and the conductive vias 506 of the redistribution structure 500 in FIG. 2C, so the detailed descriptions thereof are omitted herein.

The third optical transceiver OT3 is stacked on the redistribution structure 600 and includes a third photonic integrated circuit component 100c, a third electric integrated circuit component 200c, a third storage integrated circuit component 300c, a third functional integrated circuit component 400c, a redistribution structure 1300, an insulating encapsulant GF9, and an insulating encapsulant GF10. The third photonic integrated circuit component 100c, the third electric integrated circuit component 200c, the third storage integrated circuit component 300c, the third functional integrated circuit component 400c, the insulating encapsulant GF9, and the insulating encapsulant GF10 may be respectively similar to the first photonic integrated circuit component 100a, the first electric integrated circuit component 200a, the first storage integrated circuit component 300a, the first functional integrated circuit component 400a, the insulating encapsulant GF5, and the insulating encapsulant GF6 in FIG. 5A to FIG. 5D, so similar elements are denoted by the same reference numeral and the detailed descriptions thereof are omitted herein.

In some embodiments, the redistribution structure 1300 includes a dielectric layer 1302, a plurality of redistribution conductive layers 1304, and a plurality of conductive vias 1306. The dielectric layer 1302, the redistribution conductive layers 1304, and the conductive vias 1306 of the redistribution structure 1300 in FIG. 5D may be respectively similar to the dielectric layer 502, the redistribution conductive layers 504, and the conductive vias 506 of the redistribution structure 500 in FIG. 2C, so the detailed descriptions thereof are omitted herein.

The redistribution structure 700 is formed over the third optical transceiver OT3. For example, the redistribution structure 700 is formed on the third electric integrated circuit component 200c, the insulating encapsulant GF10, and the third functional integrated circuit component 400c. In some embodiments, the redistribution structure 700 includes a dielectric layer 702, a plurality of redistribution conductive layers 704, and a plurality of conductive vias 706. The dielectric layer 702, the redistribution conductive layers 704, and the conductive vias 706 of the redistribution structure 700 in FIG. 5D may be respectively similar to the dielectric layer 502, the redistribution conductive layers 504, and the conductive vias 506 of the redistribution structure 500 in FIG. 2C, so the detailed descriptions thereof are omitted herein.

Figure 5E:
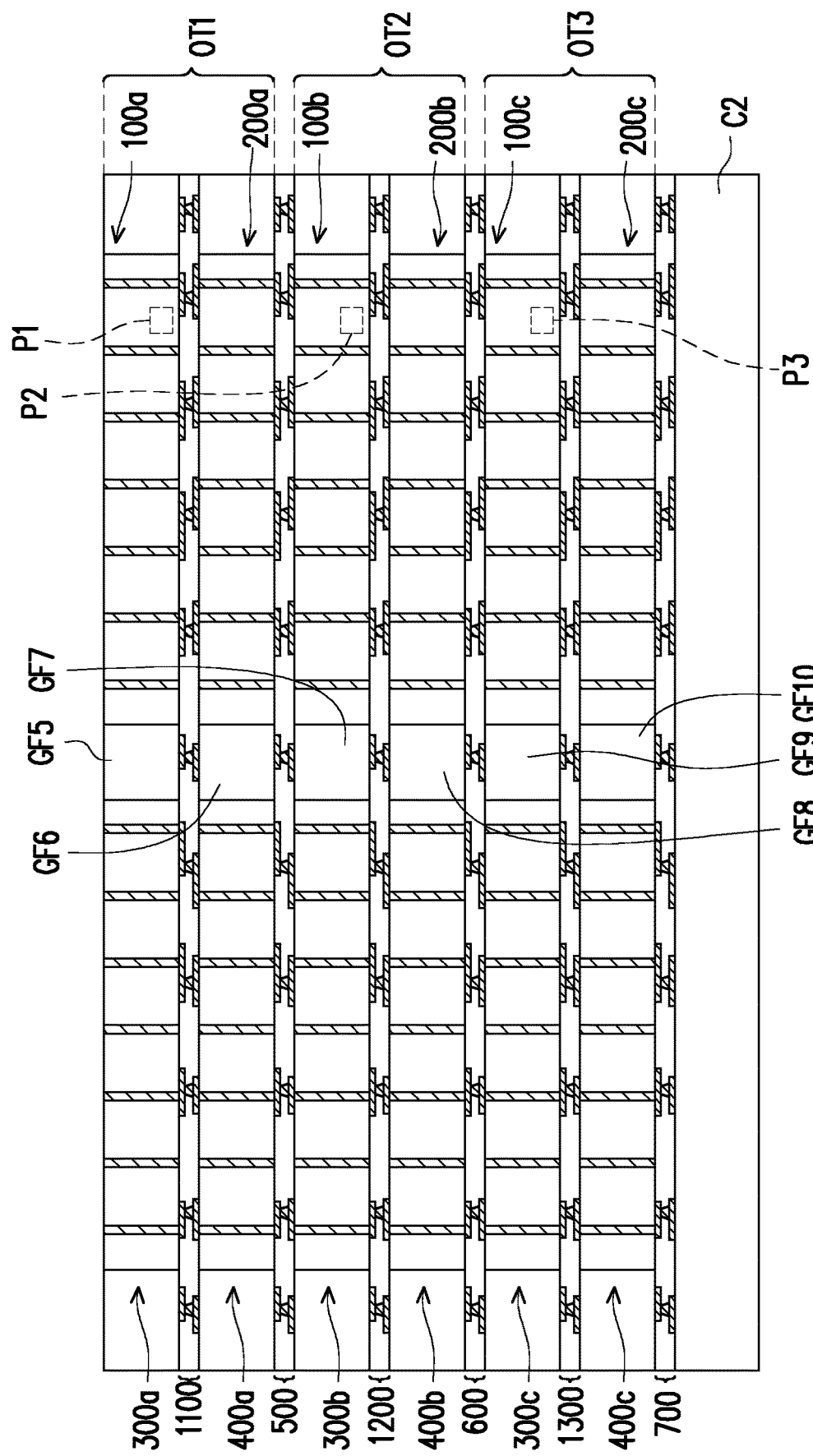

Referring to FIG. 5E, the structure illustrated in FIG. 5D is flipped upside down and is attached to a second carrier C2. Subsequently, the first carrier C1 is removed from the first photonic integrated circuit component 100a, the insulating encapsulant GF5, and the first storage integrated circuit component 300a.

Figure 5F:
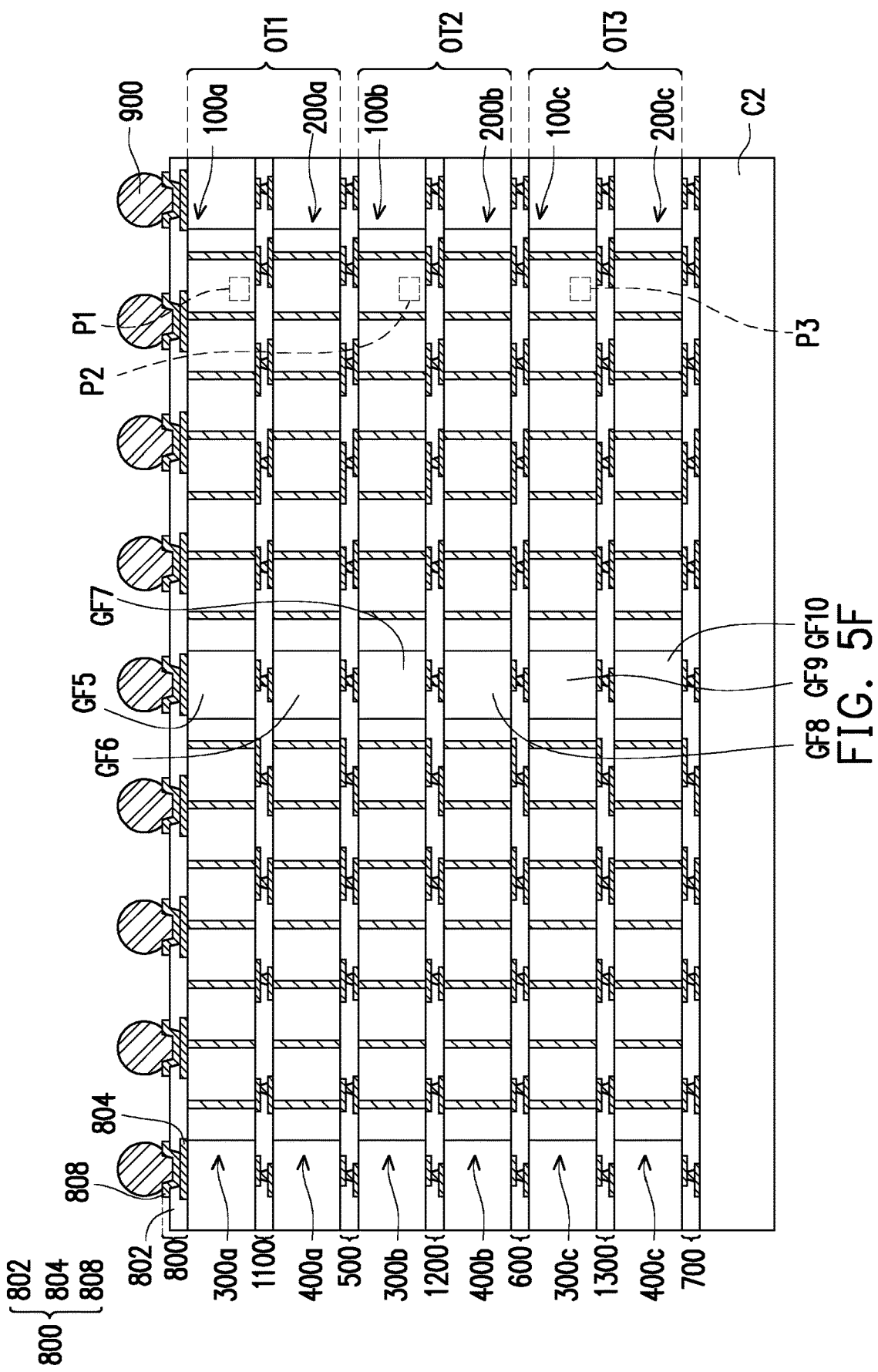

Referring to FIG. 5F, a redistribution structure 800 is formed over the first optical transceiver OT1. In some embodiments, the redistribution structure 800 is formed on the first photonic integrated circuit component 100a, the insulating encapsulant GF5, and the first storage integrated circuit component 300a. In some embodiments, the redistribution structure 800 includes a dielectric layer 802, a plurality of redistribution conductive layers 804, and a plurality of under-ball metallurgy (UBM) patterns 808. The redistribution structure 800 in FIG. 5F may be similar to the redistribution structure 800 in FIG. 2J, so the detailed description thereof is omitted herein.

After the redistribution structure 800 is formed, a plurality of conductive terminals 900 are disposed over the first optical transceiver OT1 opposite to the second optical transceiver OT2. In some embodiments, the conductive terminals 900 are electrically connected to the first optical transceiver OT1. For example, the conductive terminals 900 may be electrically connected to the first optical transceiver OT1 through the redistribution structure 900. That is, the conductive terminals 900 may be disposed on the UBM patterns 808. In some embodiments, the conductive terminals 900 are attached to the UBM patterns 808 through a solder flux. In some embodiments, the conductive terminals 900 are, for example, solder balls, ball grid array (BGA) balls, or controlled collapse chip connection (C4) bumps. The conductive terminals 900 in FIG. 5F may be similar to the conductive terminals 900 in FIG. 2J, so the detailed descriptions thereof are omitted herein.

Figure 5G:
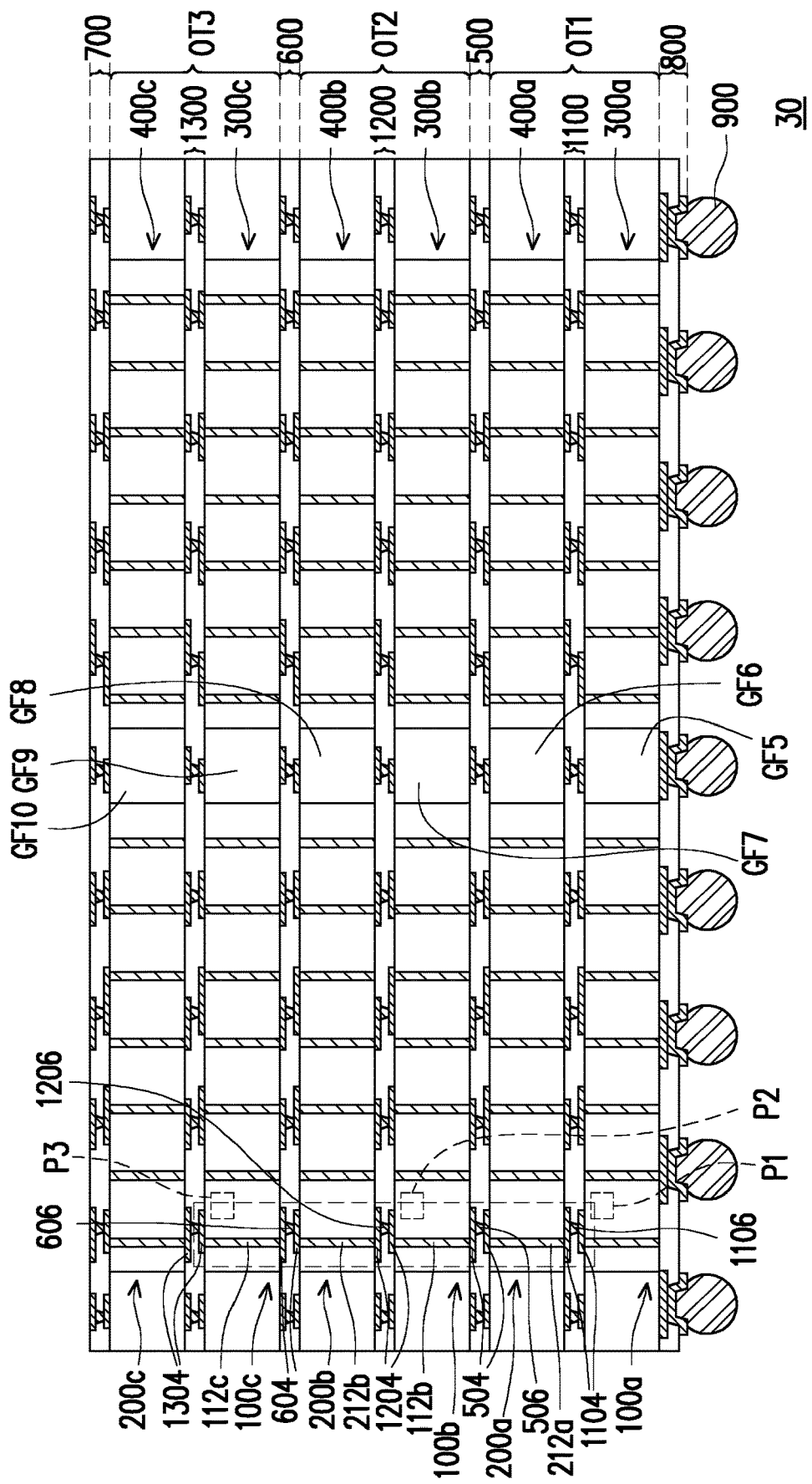

Referring to FIG. 5G, the structure illustrated in FIG. 5F is flipped upside down and the second carrier C2 is removed to obtain a semiconductor package 30. As illustrated in FIG. 5G, the semiconductor package 30 includes the first optical transceiver OT1, the second optical transceiver OT2, the third optical transceiver OT3, the redistribution structures 500, 600, 700, 800, the conductive terminals 900, and a plasmonic waveguide PW3. The plasmonic waveguide PW3 may be similar to the plasmonic waveguide PW1 in FIG. 2K, so the detailed description thereof is omitted herein. In some embodiments, the plasmonic waveguide PW3 optically couples the optical input/output portion P1 of the first optical transceiver OT1, the optical input/output portion P2 of the second optical transceiver OT2, and the optical input/output portion P3 of the third optical transceiver OT3. In other words, the first photonic integrated circuit component 100a, the second photonic integrated circuit component 100b, and the third photonic integrated circuit component 100c are optically coupled to the plasmonic waveguide PW3. In some embodiments, the plasmonic waveguide PW3 may include a conductive feature constituted by portions of the redistribution conductive layers 1104, portions of the conductive vias 1106, portions of the through semiconductor vias 212a, portions of the redistribution conductive layers 504, portions of the conductive vias 506, portions of the through semiconductor vias 112b, portions of the redistribution conductive layers 1204, portions of the conductive vias 1206, portions of the through semiconductor vias 212b, portions of the redistribution conductive layers 604, portions of the conductive vias 606, portions of the through semiconductor vias 112c, and portions of the redistribution conductive layers 1304. In some embodiments, the plasmonic waveguide PW3 penetrates through the second optical transceiver OT2. For example, the plasmonic waveguide PW3 penetrates through the second photonic integrated circuit component 100b, the redistribution structure 1200, and the second electric integrated circuit component 200b.

In some embodiments, by adapting the vertical plasmonic waveguide PW3 for transmitting optical signals, the current density may be sufficiently reduced in the semiconductor package 30. As such, the waste heat in the semiconductor package 30 (multi-chip stack) may be reduced, thereby enhancing the device performance. In addition, the plasmonic waveguide PW3 has a low bending radius, which allows the plasmonic waveguide PW3 to be formed by simply connecting the TSV to the conductive patterns in the redistribution structure. Moreover, since the first optical transceiver OT1, the second optical transceiver OT2, and the third optical transceiver OT3 have small thicknesses (the first optical transceiver OT1, the second optical transceiver OT2, and the third optical transceiver OT3 respectively has a thickness of less than 20 μm), the propagation path created by the plasmonic waveguide PW3 may be short. As such, the signal loss during transmission may be reduced and higher data transfer rate may be achieved. In some embodiments, the short propagation path also allows adaption of low intensity light sources to save cost and energy. Furthermore, since the semiconductor package 30 is formed by vertically stacking the optical transceivers, more optical transceivers may be integrated into the semiconductor package 30 within a given area.

Figure 6A:
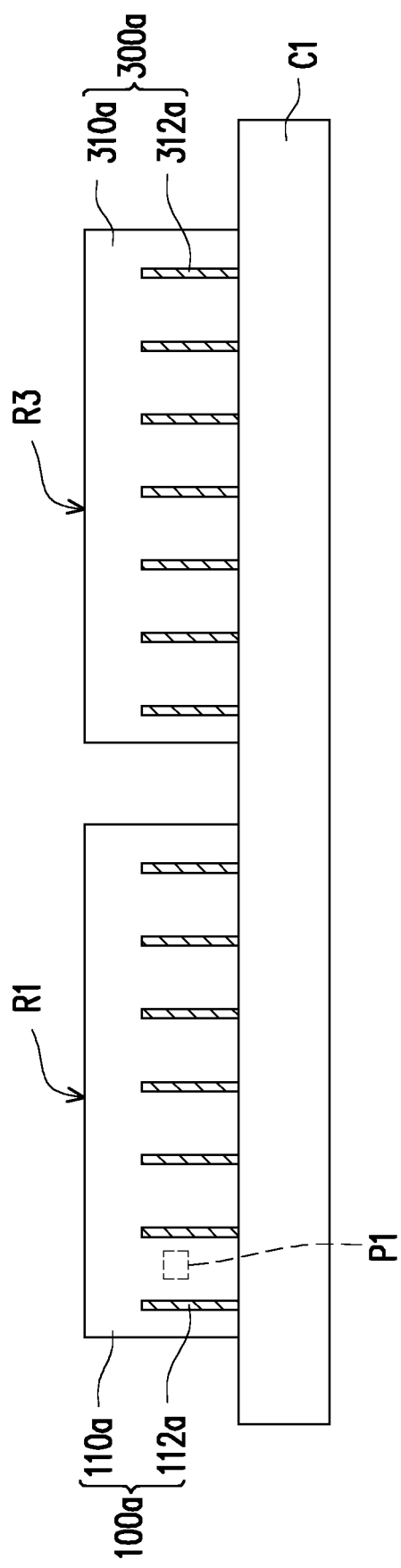
FIG. 6A to FIG. 6G are schematic cross-sectional views illustrating a manufacturing process of a semiconductor package in accordance with some alternative embodiments of the disclosure.
Figure 6B:
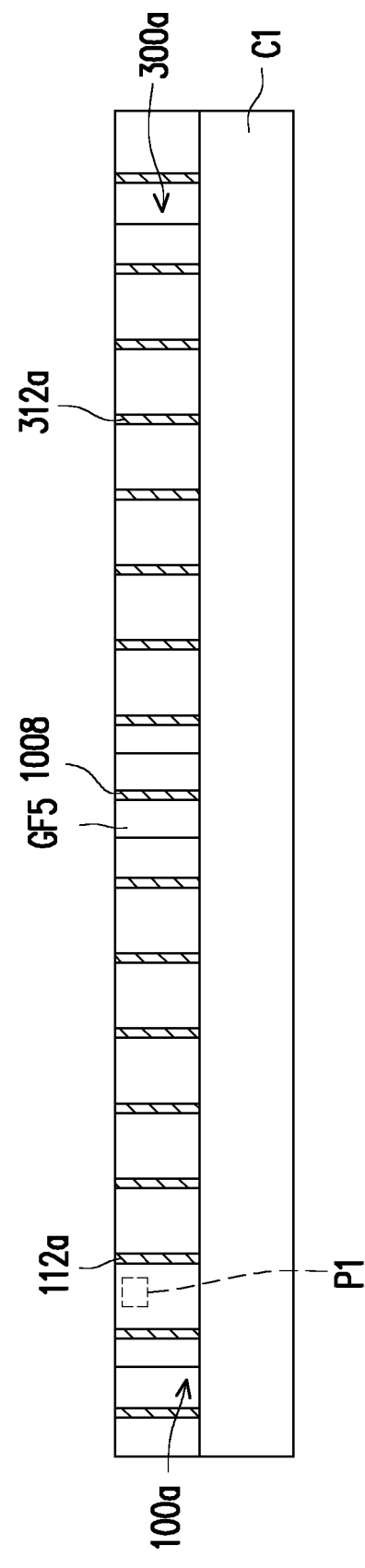

FIG. 6A to FIG. 6G are schematic cross-sectional views illustrating a manufacturing process of a semiconductor package 40 in accordance with some alternative embodiments of the disclosure. Referring to FIG. 6A and FIG. 6B, the steps illustrated in FIG. 6A and FIG. 6B are similar to the steps shown in FIG. 5A and FIG. 5B, so similar elements are denoted by the same reference numeral and the detailed descriptions thereof are omitted herein. However, in FIG. 6B, a plurality of through insulating vias (TIV) 1008 are further formed in the insulating encapsulant GF5. In some embodiments, the through insulating vias 1008 penetrate through the insulating encapsulant GF5. In some embodiments, the through insulating vias 1008 may be made of conductive materials. For example, the material of the through insulating vias 1008 may include a metal material such as copper, copper alloys, or the like. In some embodiments, the through insulating vias 1008 may be formed prior to the formation of the insulating encapsulant GF5. However, the disclosure is not limited thereto. In some alternative embodiments, the through insulating vias 1008 may be formed after the formation of the insulating encapsulant GF5. For example, the through insulating vias 1008 may be formed by forming a plurality of openings in the insulating encapsulant GF5 and filling a conductive material into the openings of the insulating encapsulant GF5.

Figure 6C:
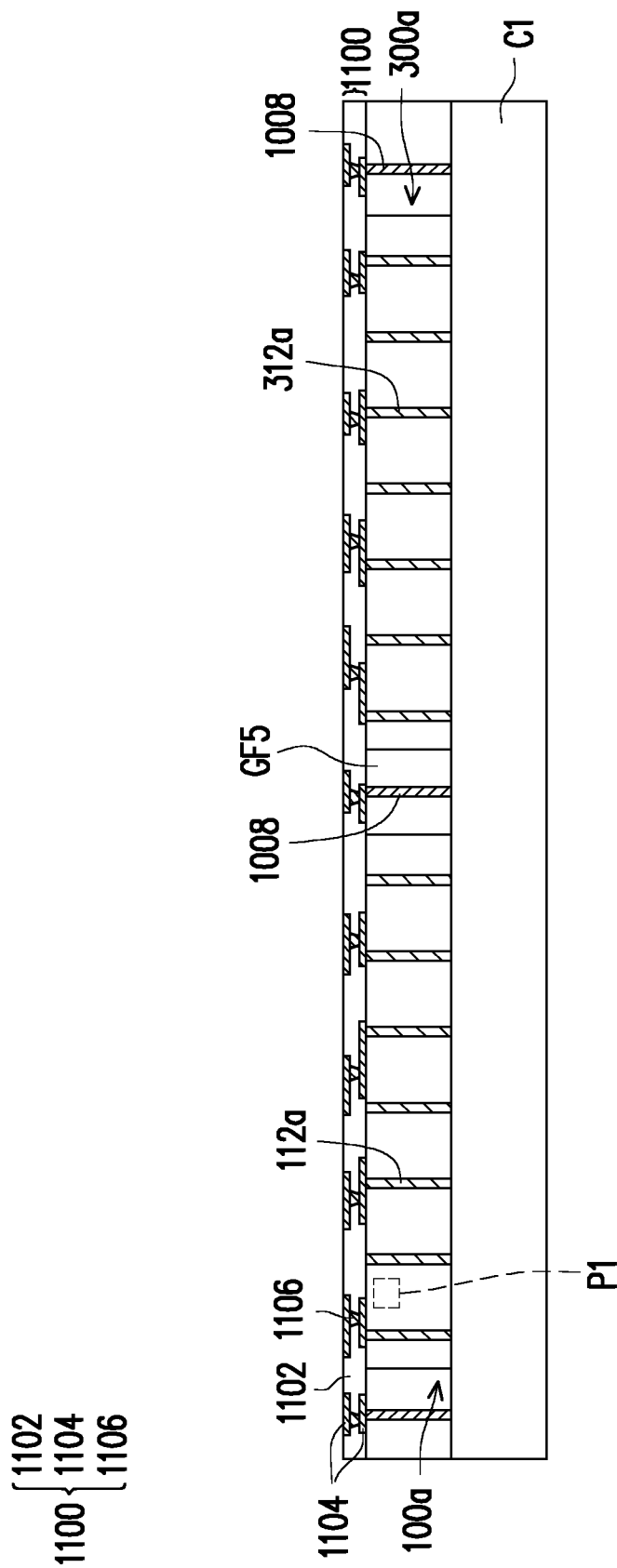
Figure 6D:
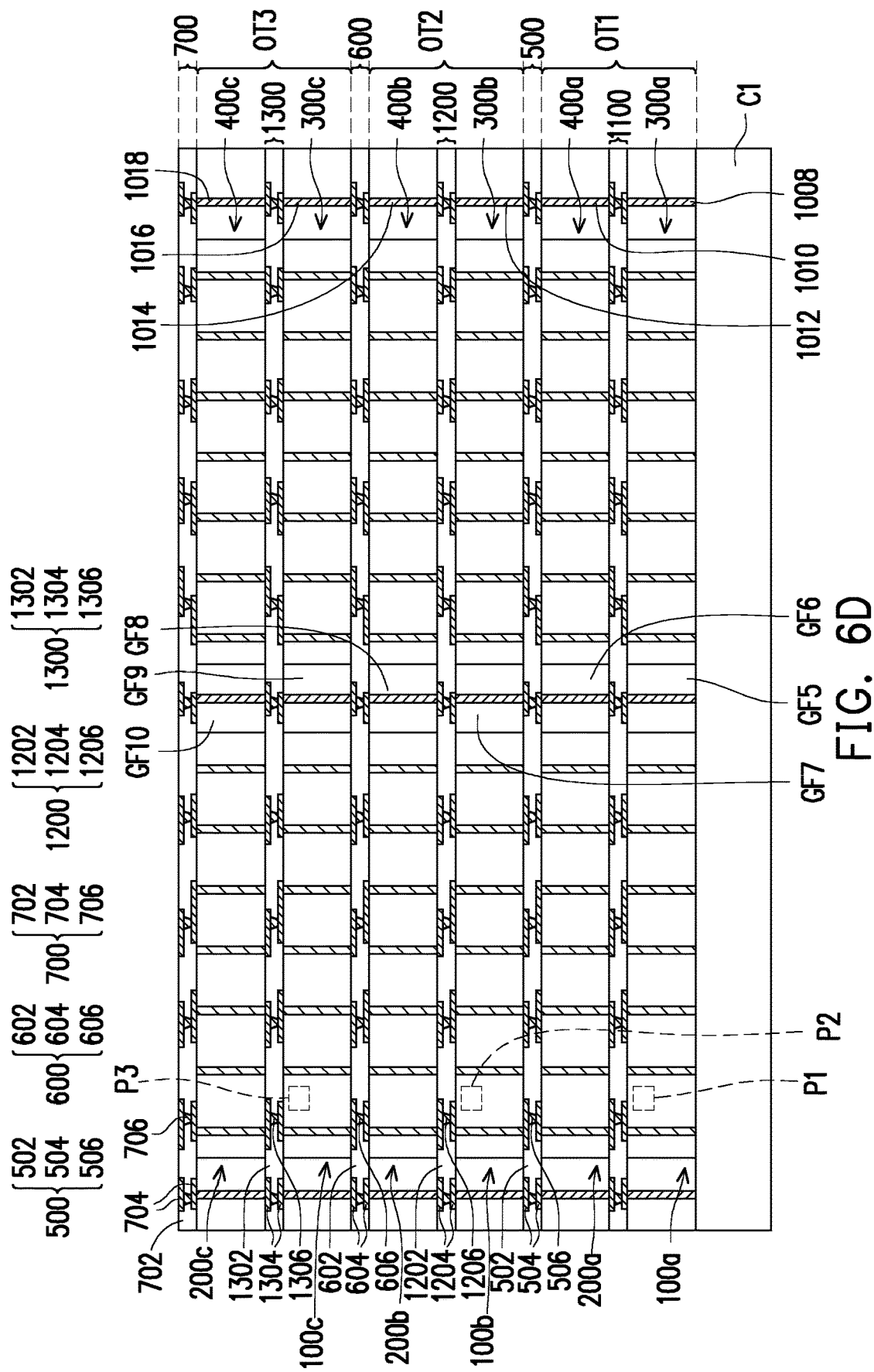

Referring to FIG. 6C and FIG. 6D, the steps illustrated in FIG. 6C and FIG. 6D are similar to the steps shown in FIG. 5C and FIG. 5D, so similar elements are denoted by the same reference numeral and the detailed descriptions thereof are omitted herein. However, in FIG. 6D, a plurality of through vias 1010, a plurality of through vias 1012, a plurality of through vias 1014, a plurality of through vias 1016, and plurality of through vias 1018 are respectively formed in the insulating encapsulant GF6, the insulating encapsulant GF7, the insulating encapsulant GF8, the insulating encapsulant GF9, and the insulating encapsulant GF10. The through insulating vias 1010, 1012, 1014, 1016, and 1018 may be similar to the through insulating vias 1008, so the detailed descriptions thereof are omitted herein. As illustrated in FIG. 6D, the first optical transceiver OT1 includes the first photonic integrated circuit component 100a, the first electric integrated circuit component 200a, the first storage integrated circuit component 300a, the first functional integrated circuit component 400a, the insulating encapsulant GF5, the insulating encapsulant GF6, the redistribution structure 1100, the through insulating vias 1008, and the through insulating vias 1010. On the other hand, the second optical transceiver OT2 and the third optical transceiver OT3 may be similar to the first optical transceiver OT1 and include similar elements.

Figure 6E:
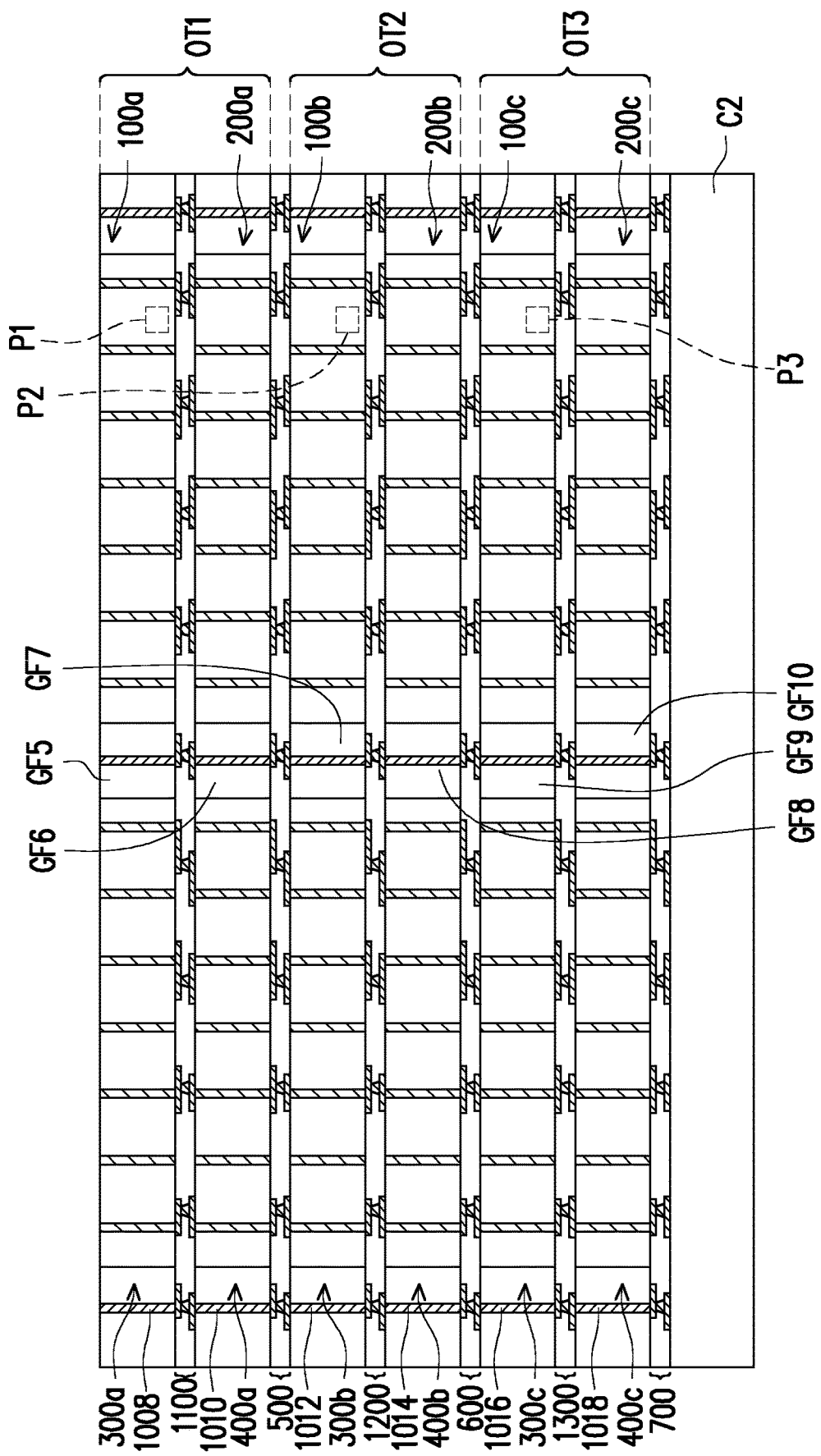
Figure 6F:
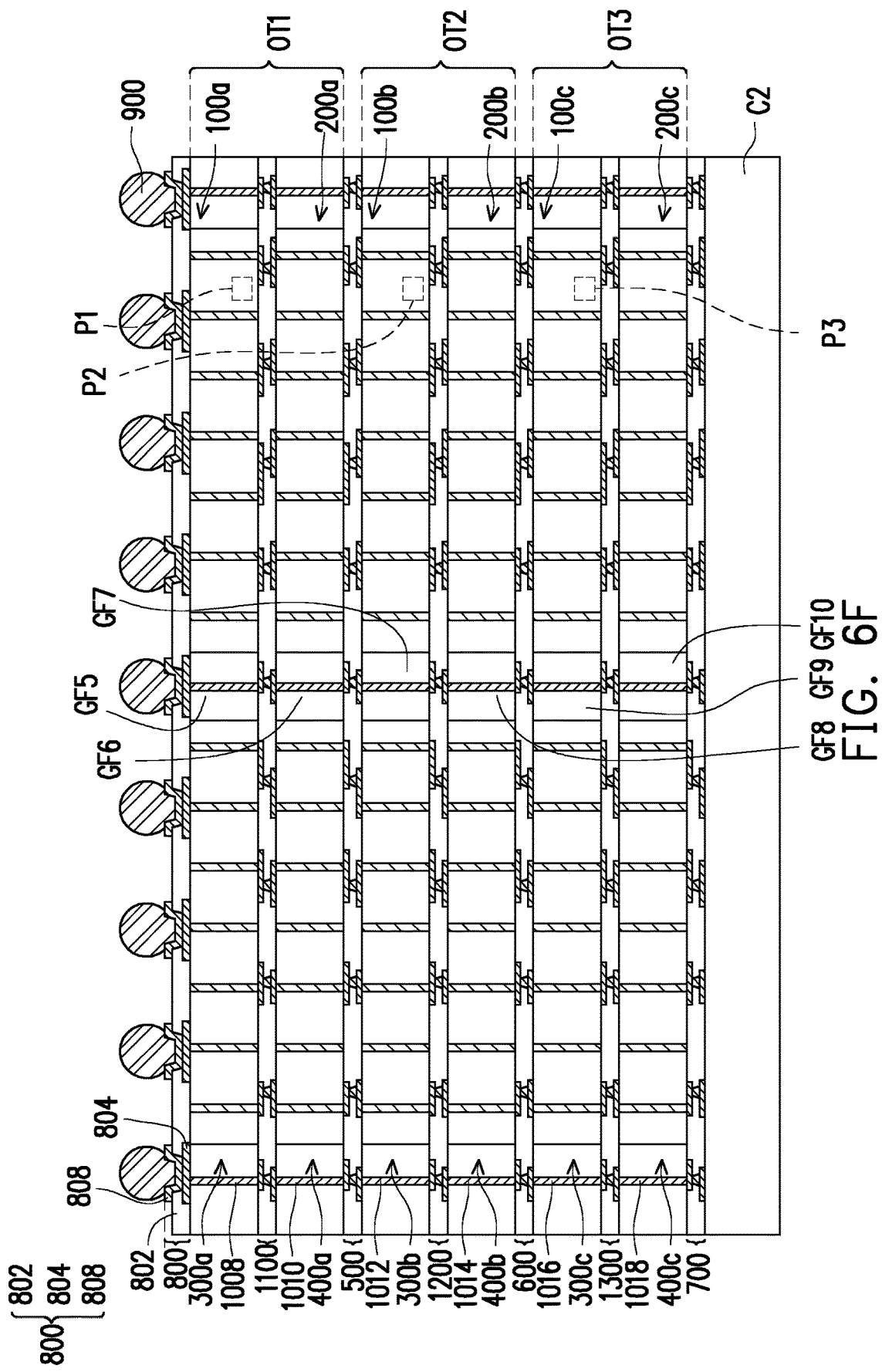
Figure 6G:
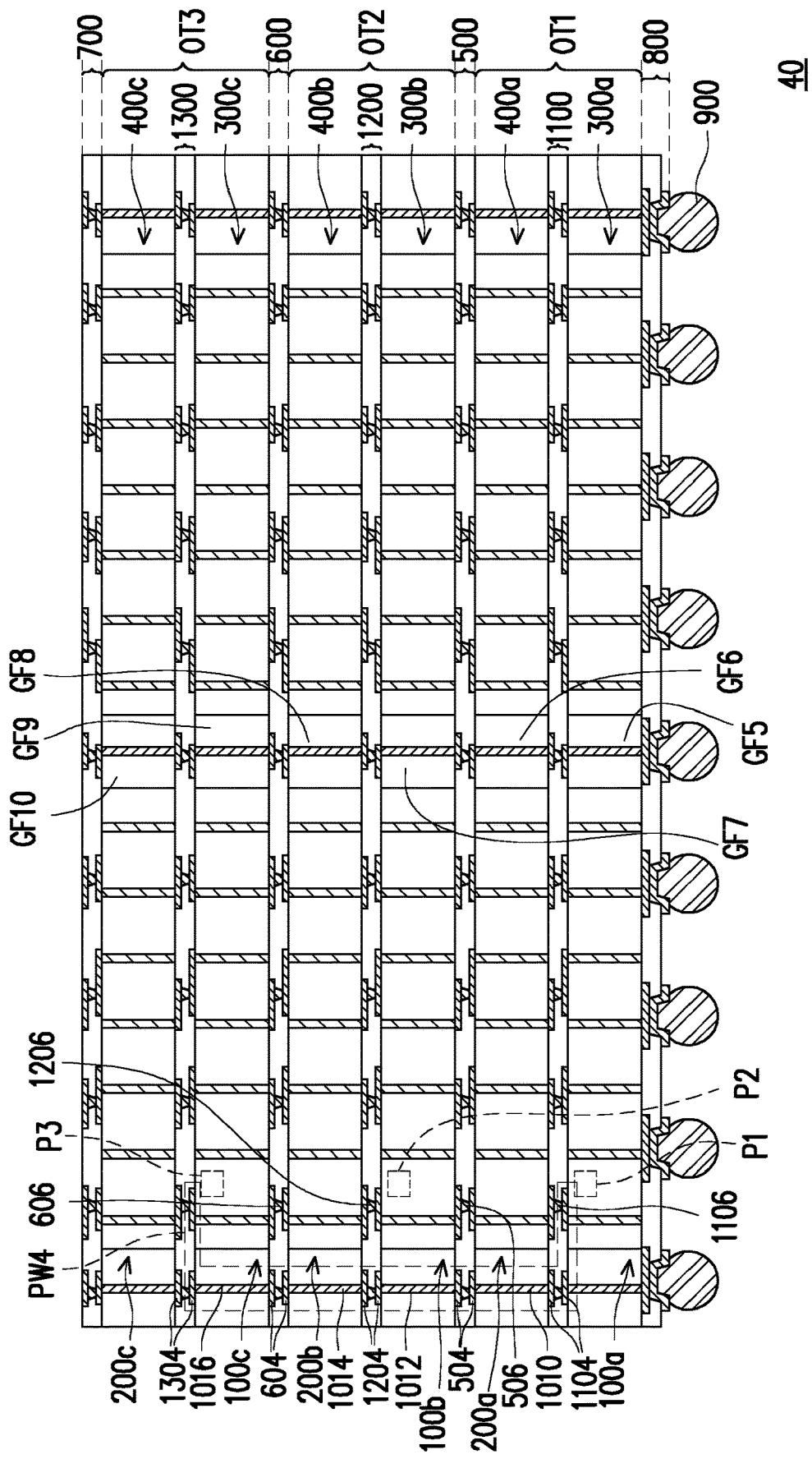

Referring to FIG. 6E to FIG. 6G, the steps illustrated in FIG. 6E to FIG. 6G are similar to the steps shown in FIG. 5E to FIG. 5G, so similar elements are denoted by the same reference numeral and the detailed descriptions thereof are omitted herein. As illustrated in FIG. 6G, a semiconductor package 40 is obtained. The semiconductor package 40 includes the first optical transceiver OT1, the second optical transceiver OT2, the third optical transceiver OT3, the redistribution structures 500, 600, 700, 800, the conductive terminals 900, and a plasmonic waveguide PW4. The plasmonic waveguide PW4 may be similar to the plasmonic waveguide PW2 in FIG. 4K, so the detailed description thereof is omitted herein. In some embodiments, the plasmonic waveguide PW4 optically couples the optical input/output portion P1 of the first optical transceiver OT1 and the optical input/output portion P3 of the third optical transceiver OT3. In other words, the first photonic integrated circuit component 100a and the third photonic integrated circuit component 100c are optically coupled to the plasmonic waveguide PW4. In some embodiments, the plasmonic waveguide PW4 may include a conductive feature constituted by portions of the redistribution conductive layers 1104, portions of the conductive vias 1106, portions of the through insulating vias 1010, portions of the redistribution conductive layers 504, portions of the conductive vias 506, portions of the through insulating vias 1012, portions of the redistribution conductive layers 1204, portions of the conductive vias 1206, portions of the through insulating via 1014, portions of the redistribution conductive layers 604, portions of the conductive vias 606, portions of the through insulating vias 1016, and portions of the redistribution conductive layers 1304. In some embodiments, the plasmonic waveguide PW4 penetrates through the second optical transceiver OT2. For example, the plasmonic waveguide PW2 penetrates through the insulating encapsulant GF7, the redistribution structure 1200, and the insulating encapsulant GF8.

In some embodiments, by adapting the vertical plasmonic waveguide PW4 for transmitting optical signals, the current density may be sufficiently reduced in the semiconductor package 40. As such, the waste heat in the semiconductor package 40 (multi-chip stack) may be reduced, thereby enhancing the device performance. Moreover, since the first optical transceiver OT1, the second optical transceiver OT2, and the third optical transceiver OT3 have small thicknesses (the first optical transceiver OT1, the second optical transceiver OT2, and the third optical transceiver OT3 respectively has a thickness of less than 20 µm), the propagation path created by the plasmonic waveguide PW4 may be short. As such, the signal loss during transmission may be reduced and higher data transfer rate may be achieved. In some embodiments, the short propagation path also allows adaption of low intensity light sources to save cost and energy. Furthermore, since the semiconductor package 40 is formed by vertically stacking the optical transceivers, more optical transceivers may be integrated into the semiconductor package 40 within a given area.

Figure 7:
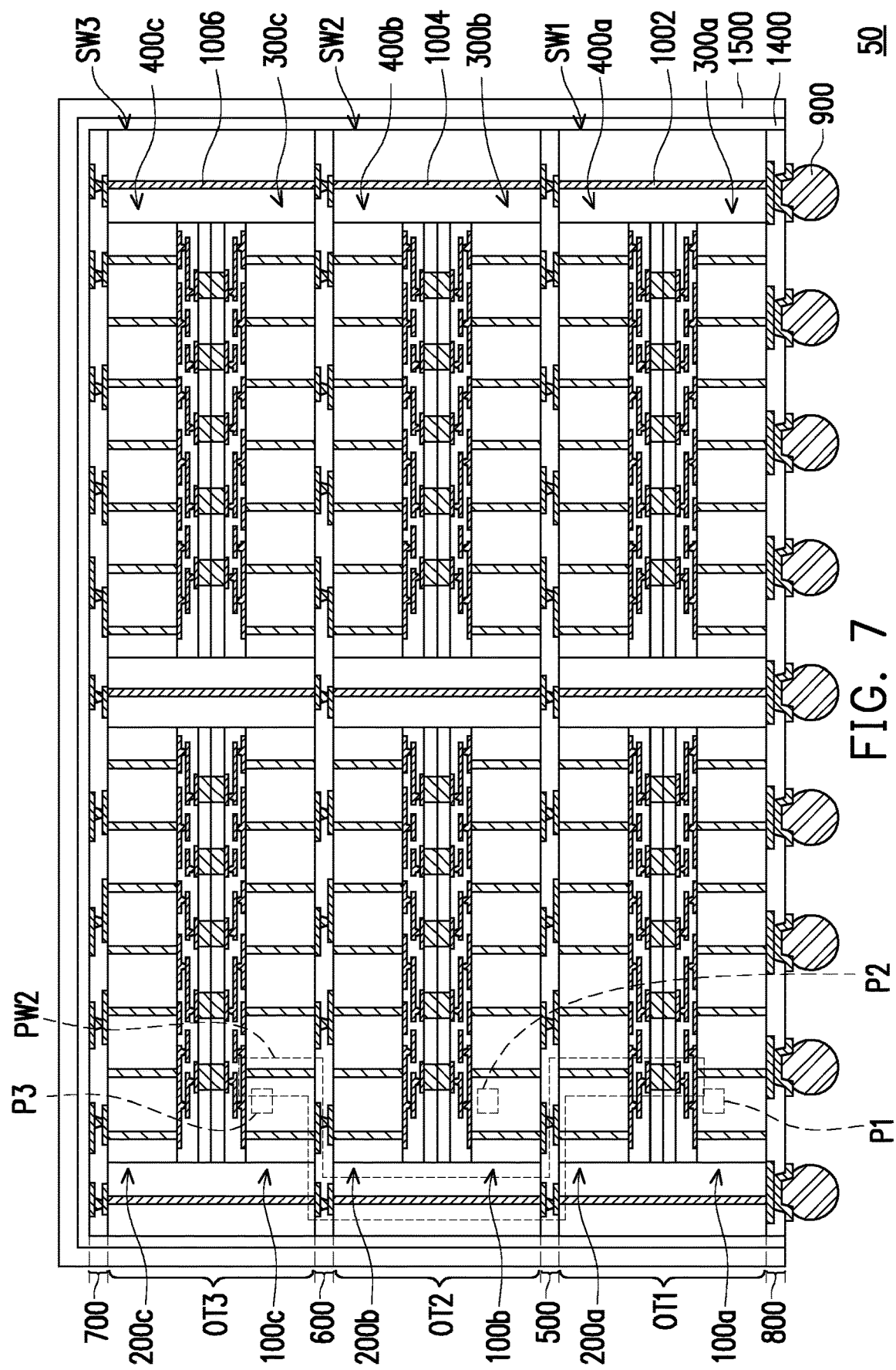
FIG. 7 is a schematic cross-sectional view illustrating a semiconductor package in accordance with some alternative embodiments of the disclosure.

FIG. 7 is a schematic cross-sectional view illustrating a semiconductor package 50 in accordance with some alternative embodiments of the disclosure. Referring to FIG. 7, the semiconductor package 50 of FIG. 7 is similar to the semiconductor package 20 of FIG. 4K, so similar elements are denoted by the same reference numeral and the detail descriptions thereof are omitted herein. However, the semiconductor package 50 of FIG. 7 further includes a passivation layer 1400 and a thermal dissipating layer 1500. In some embodiments, the passivation layer 1400 and the thermal dissipating layer 1500 cover sidewalls SW1 of the first optical transceiver OT1, sidewalls SW2 of the second optical transceiver OT2, and sidewalls SW3 of the third optical transceiver OT3. In some embodiments, the passivation layer 1400 and the thermal dissipating layer 1500 further cover a top surface of the redistribution layer 700. In some embodiments, a material of the passivation layer 1400 may include silicon oxide, silicon nitride, low-k dielectric materials such as carbon doped oxides, extremely low-k dielectric materials such as porous carbon doped silicon dioxide, combinations thereof, or other suitable materials. In some embodiments, a method of forming the passivation layer 1400 includes a deposition process such as a chemical vapor deposition process or other suitable deposition processes. On the other hand, a material of the thermal dissipating layer 1500 may include materials able to sufficiently conduct heat. For example, the thermal dissipating layer 1500 may be made of metallic materials such as aluminum, titanium, copper, nickel, tungsten, and/or alloys thereof. In some embodiments, the thermal dissipating layer 1500 may be formed through physical vapor deposition (PVD), sputtering, electroplating, or the like.

In some embodiments, during the operation of the semiconductor package 50, waste heat may be generated by the first optical transceiver OT1, the second optical transceiver OT2, and the third optical transceiver OT3. When the waste heat accumulates within the semiconductor package 50, device failure may occur. Nevertheless, with the adaption of the thermal dissipating layer 1500, the waste heat may be dissipated in a faster rate, thereby reducing the possibility of device failure while enhancing the device performance. Furthermore, in some embodiments, the adaption of the thermal dissipating layer 1500 covering the first optical transceiver OT1, the second optical transceiver OT2, and the third optical transceiver OT3 is able to further enhance the optical confinement occurs between the metal layers within these optical transceivers. For example, the thermal dissipating layer 1500 may further enhance the optical confinement of the plasmonic waveguide PW2 in proximity to the thermal dissipating layer 1500.

Figure 8:
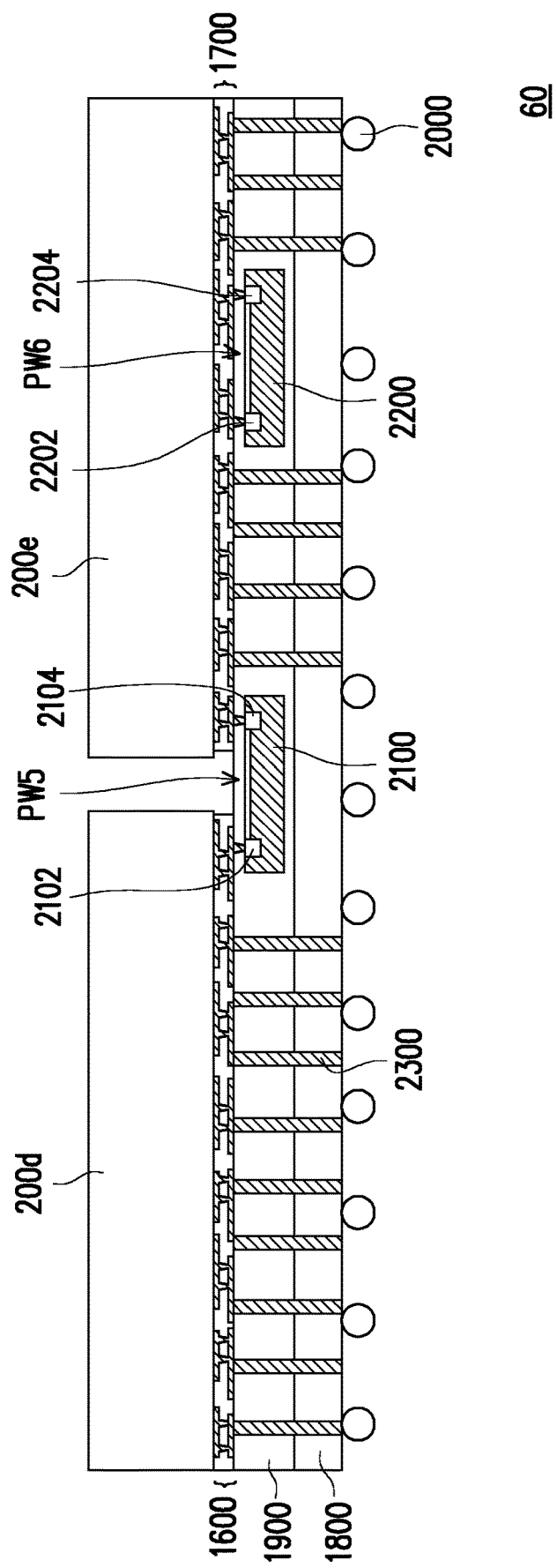
FIG. 8 is a schematic cross-sectional view illustrating a semiconductor package in accordance with some alternative embodiments of the disclosure.

FIG. 8 is a schematic cross-sectional view illustrating a semiconductor package 60 in accordance with some alternative embodiments of the disclosure. Referring to FIG. 8, the semiconductor package 60 includes a substrate 1800, an insulating encapsulant 1900, a first redistribution structures 1600, a second redistribution structure 1700, a first electric integrated circuit component 200d, a second electric integrated circuit component 200e, a first plasmonic bridge 2100, a plurality of through vias 2300, and a plurality of conductive terminals 2000.

In some embodiments, the substrate 1800 may be a semiconductor substrate having a plurality of semiconductor devices (e.g., transistors, capacitors, photodiodes, a combination thereof, or the like) formed therein. However, the disclosure is not limited thereto. In some alternative embodiments, the substrate 1800 may be an interposer substrate or a carrier substrate.

The first electric integrated circuit component 200d and the second electric integrated circuit component 200e are disposed over the substrate 1800. In some embodiments, the second electric integrated circuit component 200e is disposed adjacent to the first electric integrated circuit component 200d. In some embodiments, the first electric integrated circuit component 200d and the second electric integrated circuit component 200e of FIG. 8 may be similar to the first electric integrated circuit component 200a, the first storage integrated circuit component 300a, or the first functional integrated circuit component 400a of FIG. 1C, so the detailed descriptions thereof are omitted herein. In some embodiments, the first electric integrated circuit component 200d and the second electric integrated circuit component 200e may include, for example, a Central Process Unit (CPU) die, a Graphic Process Unit (GPU) die, a Field-Programmable Gate Array (FPGA), a memory die, or the like.

As illustrated in FIG. 8, the insulating encapsulant 1900 is being filled among the substrate 1800, the first electric integrated circuit component 200d, and the second electric integrated circuit component 200e. In some embodiments, the insulating encapsulant 1900 includes a molding compound, a molding underfill, a resin (such as epoxy), or the like. In some alternative embodiments, the insulating encapsulant 1900 may include silicon oxide, silicon nitride, or the like. In some embodiments, the insulating encapsulant 1900 may be formed by a molding process. For example, the insulating encapsulant 1900 may be formed by a compression molding process. In some embodiments, the insulating encapsulant 1900 may be referred to as "gap fill oxide." In some embodiments, the first redistribution structure 1600 is disposed between the first electric integrated circuit component 200d and the insulating encapsulant 1900. Similarly, the second redistribution structure 1700 is disposed between the second electric integrated circuit component 200e and the insulating encapsulant 1900. In some embodiments, the first electric integrated circuit component 200d is electrically connected to the first redistribution structure 1600. On the other hand, the second electric integrated circuit component 200e is electrically connected to the second redistribution structure 1700. The first redistribution structure 1600 and the second redistribution structure 1700 of FIG. 8 may be similar to the redistribution structure 500 of FIG. 2C, so the detailed descriptions thereof are omitted herein.

In some embodiments, the through vias 2300 penetrate through the insulating encapsulant 1900 and the substrate 1800. In some embodiments, the through vias 2300 may be made of conductive materials. For example, the material of the through vias 2300 may include a metal material such as copper, copper alloys, or the like. In some embodiments, since the through vias 2300 penetrate through the insulating encapsulant 1900 and the substrate 1800, the through vias 2300 may be constituted by a through insulating via (the portion of the through vias 2300 that penetrates through the insulating encapsulant 1900) and a through semiconductor via (the portion of the through vias 2300 that penetrates through the substrate 1800).

As illustrated in FIG. 8, the conductive terminals 2000 are disposed on the substrate 1800 opposite to the insulating encapsulant 1900. In some embodiments, the conductive terminals 2000 are electrically connected to the first electric integrated circuit component 200d sequentially through the through vias 2300 and the first redistribution structure 1600. Similarly, the conductive terminals 2000 are electrically connected to the second electric integrated circuit component 200e sequentially through the through vias 2300 and the second redistribution structure 1700. In some embodiments, a redistribution structure (not shown) may be disposed between the conductive terminals 2000 and the substrate 1800. In some embodiments, the conductive terminals 2000 are, for example, solder balls, ball grid array (BGA) balls, or controlled collapse chip connection (C4) bumps. In some embodiments, the conductive terminals 2000 are made of a conductive material with low resistivity, such as Sn, Pb, Ag, Cu, Ni, Bi, or an alloy thereof.

In some embodiments, communication between the first electric circuit component 200d and the second electric circuit component 200e may be achieve through the first plasmonic bridge 2100. In some embodiments, the first plasmonic bridge 2100 is disposed over the substrate 1800 and is embedded in the insulating encapsulant 1900. That is, the insulating encapsulant 1900 encapsulates the first plasmonic bridge 2100. In some embodiments, the first plasmonic bridge 2100 is disposed to bridge the first electric circuit component 200d and the second electric circuit component 200e. For example, the first plasmonic bridge 2100 is electrically coupled to both the first electric circuit component 200d and the second electric circuit component 200e. In some embodiments, the first plasmonic bridge 2100 is electrically connected to the first electric circuit component 200d through the first redistribution structure 1600. On the other hand, the first plasmonic bridge 2100 is electrically connected to the second electric circuit component 200e through the second redistribution structure 1700.

In some embodiments, the first plasmonic bridge 2100 includes a first electrical-optical conversion module 2102, a second electrical-optical conversion module 2104, and a first plasmonic waveguide PW5. The first electrical-optical conversion module 2102 and the second electrical-optical conversion module 2104 may respectively include a photodetector, a photodiode, other optical components, or combinations thereof. In some embodiments, the first electrical-optical conversion module 2102 and the second electrical-optical conversion module 2104 are able to convert electrical signal into optical signal or vice versa. In some embodiments, the first electrical-optical conversion module 2102 is electrically coupled to the first electric integrated circuit component 200d through the first redistribution structure 1600. On the other hand, the second electrical-optical conversion module 2104 is electrically coupled to the second electric integrated circuit component 200e through the second redistribution structure 1700. As illustrated in FIG. 8, the first plasmonic waveguide PW5 connects the first electrical-optical conversion module 2102 and the second electrical-optical conversion module 2104. In some embodiments, the first plasmonic waveguide PW5 may be constituted by a pair of conductive patterns having a dielectric material sandwiched therebetween. In some embodiments, the first plasmonic waveguide PW5 of FIG. 8 may be similar to the plasmonic waveguide PW1 of FIG. 2K, so the detailed description thereof is omitted herein. However, it should be noted that in FIG. 8, the first plasmonic waveguide PW5 is arranged horizontally to connect the first electrical-optical conversion module 2102 and the second electrical-optical conversion module 2104. The communication of the first electrical integrated circuit component 200*d* and the second electrical integrated circuit component 200*e* will be discussed below.

In some embodiments, the first electrical integrated circuit component 200*d* is able to generate an electrical signal. The electrical signal is then transmitted to the first electrical-optical conversion module 2102 of the first plasmonic bridge 2100 through the first redistribution structure 1600. Upon receiving the electrical signal, the first electrical-optical conversion module 2102 converts the received signal from electrical signal into optical signal. The optical signal then propagates through the first plasmonic waveguide PW5 based on surface plasmon and arrives at the second electrical-optical conversion module 2104. Upon receiving the optical signal, the second electrical-optical conversion module 2104 converts the received optical signal back to electrical signal, and the electrical signal is transmitted to the second electric integrated circuit component 200*e* through the second redistribution structure 1700. By incorporating optical transmission as portions of the signal transmission path, the signal loss may be sufficiently reduced and the device performance may be enhanced.

It should be noted that the communication between the first electrical integrated circuit component 200*d* and the second electrical integrated circuit component 200*e* is bidirectional. That is, the second electrical-optical conversion module 2104 is able to convert the electrical signal generated from the second electric integrated circuit component 200*e* to optical signal, and the first electrical-optical conversion module 2102 is able to convert the optical signal received from the first plasmonic waveguide PW5 back to electrical signal.

In some embodiments, the semiconductor package 60 further includes a second plasmonic bridge 2200. The second plasmonic bridge 2200 is disposed between the substrate 1800 and the second electric integrated circuit component 200*e*. In some embodiments, the second plasmonic bridge 2200 is embedded in the insulating encapsulant 1900. The second plasmonic bridge 2200 is electrically coupled to the second electric circuit component 200*e*. In some embodiments, the second plasmonic bridge 2200 is electrically connected to the second electric circuit component 200*e* through the second redistribution structure 1700.

In some embodiments, the second plasmonic bridge 2200 includes a third electrical-optical conversion module 2202, a fourth electrical-optical conversion module 2204, and a second plasmonic waveguide PW6. The third electrical-optical conversion module 2202 and the fourth electrical-optical conversion module 2204 may be similar to the first electrical-optical conversion module 2102 and the second electrical-optical conversion module 2104, so the detailed descriptions thereof are omitted herein. As illustrated in FIG. 8, both of the third electrical-optical conversion module 2202 and the fourth electrical-optical conversion module 2204 are electrically coupled to the second electric integrated circuit component 200*e* through the second redistribution structure 1700. In some embodiments, the second plasmonic waveguide PW6 connects the third electrical-optical conversion module 2202 and the fourth electrical-optical conversion module 2204. The second plasmonic waveguide PW6 may be similar to the plasmonic waveguide PW5, so the detailed description thereof is omitted herein.

In some embodiments, the second electrical integrated circuit component 200*e* is able to generate an electrical signal. The electrical signal is then transmitted to the third electrical-optical conversion module 2202 of the second plasmonic bridge 2200 through the second redistribution structure 1700. Upon receiving the electrical signal, the third electrical-optical conversion module 2202 converts the received signal from electrical signal into optical signal. The optical signal then propagates through the second plasmonic waveguide PW6 and arrives at the fourth electrical-optical conversion module 2204. Upon receiving the optical signal, the fourth electrical-optical conversion module 2202 converts the received optical signal back to electrical signal, and the electrical signal is transmitted back to the second redistribution structure 1700. By incorporating optical transmission as portions of the signal transmission path, the signal loss may be sufficiently reduced and the device performance may be enhanced.

In accordance with some embodiments of the disclosure, a semiconductor package includes a first optical transceiver, a second optical transceiver, a third optical transceiver, and a plasmonic waveguide. The first optical transceiver includes at least one optical input/output portion for transmitting and receiving optical signal. The second optical transceiver is stacked on the first optical transceiver. The third optical transceiver includes at least one optical input/output portion for transmitting and receiving optical signal. The third optical transceiver is stacked on the second optical transceiver. The plasmonic waveguide penetrates through the second optical transceiver and optically couples the at least one optical input/output portion of the first optical transceiver and the at least one optical input/output portion of the third optical transceiver.

In accordance with some alternative embodiments of the disclosure, a semiconductor package includes a first optical transceiver, a second optical transceiver, a third optical transceiver, and a plasmonic waveguide. The first optical transceiver includes a first photonic integrated circuit component and a first electric integrated circuit component. The first electric integrated circuit component is electrically connected to the first photonic integrated circuit component. The second optical transceiver is stacked on the first optical transceiver. The second optical transceiver includes a second photonic integrated circuit component and a second electric integrated circuit component. The second electric integrated circuit component is electrically connected to the second photonic integrated circuit component. The third optical transceiver is stacked on the second optical transceiver. The third optical transceiver includes a third photonic integrated circuit component and a third electric integrated circuit component. The third electric integrated circuit component is electrically connected to the third photonic integrated circuit component. The plasmonic waveguide penetrates through the second optical transceiver. At least one of the first photonic integrated circuit component, the second photonic integrated circuit component, and the third photonic integrated circuit component is optically coupled to the plasmonic waveguide.

In accordance with some alternative embodiments of the disclosure, a semiconductor package includes a first electric integrated circuit component, a second electric integrated circuit component, and a first plasmonic bridge. The second electric integrated circuit component is disposed adjacent to the first electric integrated circuit component. The first plasmonic bridge is over the first electric integrated circuit component and the second electric integrated circuit component. The first plasmonic bridge includes a first electrical-optical conversion module, a second electrical-optical conversion module, and a first plasmonic waveguide optically connecting the first electrical-optical conversion module and the second electrical-optical conversion module. The first electrical-optical conversion module is electrically coupled to the first electric integrated circuit component and the second electrical-optical conversion module is electrically coupled to the second electric integrated circuit component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a first optical transceiver, a second optical transceiver, and a third optical transceiver stacked in sequential order, wherein the first optical transceiver and the third optical transceiver respectively comprise at least one optical input/output portion for transmitting and receiving an optical signal; and
a plasmonic waveguide comprising a first segment, a second segment, and a third segment optically coupled to one another, wherein the first segment is embedded in the first optical transceiver, the second segment extends through the second optical transceiver, and the third segment is embedded in the third optical transceiver, wherein the first segment is optically coupled to the at least one optical input/output portion of the first optical transceiver and the third segment is optically coupled to the at least one optical input/output portion of the third optical transceiver.

2. The semiconductor package according to claim 1, wherein the second segment comprises through semiconductor vias (TSV) or through insulating vias (TIV).

3. The semiconductor package according to claim 1, further comprising a redistribution structure disposed between the first optical transceiver and the second optical transceiver.

4. The semiconductor package according to claim 1, further comprising a plurality of conductive terminals on the first optical transceiver opposite to the second optical transceiver.

5. The semiconductor package according to claim 1, wherein the second optical transceiver comprises at least one optical input/output portion for transmitting and receiving an optical signal, and the second segment further optically couples to the at least one optical input/output portion of the second optical transceiver.

6. The semiconductor package according to claim 1, further comprising a thermal dissipating layer covering sidewalls of the first optical transceiver, sidewalls of the second optical transceiver, and sidewalls of the third optical transceiver.

7. A semiconductor package, comprising:
a first optical transceiver, a second optical transceiver, and a third optical transceiver vertically stacked, wherein the first optical transceiver, the second optical transceiver, and the third optical transceiver respectively comprise a photonic integrated circuit component; and
a plasmonic waveguide penetrating through the second optical transceiver, wherein the plasmonic waveguide is optically coupled to at least one of the photonic integrated circuit component of the first optical transceiver, the photonic integrated circuit component of the second optical transceiver, and the photonic integrated circuit component of the third optical transceiver.

8. The semiconductor package according to claim 7, further comprising a first redistribution structure disposed between the first optical transceiver and the second optical transceiver.

9. The semiconductor package according to claim 8, wherein the first optical transceiver further comprises:
an electric integrated circuit component electrically connected to the photonic integrated circuit component of the first optical transceiver; and
a second redistribution structure disposed between the photonic integrated circuit component of the first optical transceiver and the electric integrated circuit component of the first optical transceiver.

10. The semiconductor package according to claim 9, wherein the first optical transceiver further comprises a functional integrated circuit component stacked on a storage integrated circuit component, and the functional integrated circuit component and the storage integrated circuit component are disposed adjacent to the photonic integrated circuit component of the first optical transceiver and the electric integrated circuit component of the first optical transceiver.

11. The semiconductor package according to claim 7, wherein the second optical transceiver further comprises an electric integrated circuit component electrically connected to the photonic integrated circuit component of the second optical transceiver, and the plasmonic waveguide penetrates through the photonic integrated circuit component of the second optical transceiver and the electric integrated circuit component of the second optical transceiver.

12. The semiconductor package according to claim 7, wherein the second optical transceiver further comprises:
an electric integrated circuit component electrically connected to the photonic integrated circuit component of the second optical transceiver; and
an insulating encapsulant laterally encapsulating the photonic integrated circuit component of the second optical transceiver and the electric integrated circuit component of the second optical transceiver, wherein the plasmonic waveguide penetrates through the insulating encapsulant.

13. The semiconductor package according to claim 7, further comprising a plurality of conductive terminals on the first optical transceiver opposite to the second optical transceiver.

14. The semiconductor package according to claim 7, further comprising a thermal dissipating layer covering sidewalls of the first optical transceiver, sidewalls of the second optical transceiver, and sidewalls of the third optical transceiver.

15. A semiconductor package, comprising:
a first optical transceiver, comprising:
a first photonic integrated circuit component; and
a first electric integrated circuit component bonded to the first photonic integrated circuit component;
a second optical transceiver stacked on the first optical transceiver, comprising:
a second photonic integrated circuit component; and a second electric integrated circuit component bonded to the second photonic integrated circuit component; and a plasmonic waveguide partially embedded in the second optical transceiver.

16. The semiconductor package according to claim 15, wherein the plasmonic waveguide penetrates through the second photonic integrated circuit component and the second electric integrated circuit component.

17. The semiconductor package according to claim 15, wherein the second optical transceiver further comprises an insulating encapsulant laterally encapsulating the second photonic integrated circuit component and the second electric integrated circuit component, and the plasmonic waveguide penetrates through the insulating encapsulant.

18. The semiconductor package according to claim 15, wherein the first optical transceiver further comprises a functional integrated circuit component stacked on a storage integrated circuit component, and the functional integrated circuit component and the storage integrated circuit component are disposed adjacent to the first photonic integrated circuit component and the first electric integrated circuit component.

19. The semiconductor package according to claim 15, further comprising a plurality of conductive terminals on the first optical transceiver opposite to the second optical transceiver.

20. The semiconductor package according to claim 15, further comprising a thermal dissipating layer covering sidewalls of the first optical transceiver and sidewalls of the second optical transceiver.

* * * * *